US009780034B1

(12) United States Patent
Tsutsumi et al.

(10) Patent No.: US 9,780,034 B1
(45) Date of Patent: *Oct. 3, 2017

(54) THREE-DIMENSIONAL MEMORY DEVICE CONTAINING ANNULAR ETCH-STOP SPACER AND METHOD OF MAKING THEREOF

(71) Applicant: SANDISK TECHNOLOGIES LLC, Plano, TX (US)

(72) Inventors: Masanori Tsutsumi, Yokkaichi (JP); Kota Funayama, Yokkaichi (JP); Ryoichi Ehara, Yokkaichi (JP); Youko Furihata, Yokkaichi (JP); Zhenyu Lu, Milpitas, CA (US); Tong Zhang, Palo Alto, CA (US); Tadashi Nakamura, Yokkaichi (JP)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/183,195

(22) Filed: Jun. 15, 2016

Related U.S. Application Data

(63) Continuation-in-part of application No. 15/071,575, filed on Mar. 16, 2016.

(51) Int. Cl.
H01L 29/792 (2006.01)
H01L 23/528 (2006.01)
(Continued)

(52) U.S. Cl.
CPC .... H01L 23/5283 (2013.01); H01L 21/76816 (2013.01); H01L 21/76877 (2013.01);
(Continued)

(58) Field of Classification Search
CPC .............. H01L 27/11582; H01L 27/1157
See application file for complete search history.

(56) References Cited

U.S. PATENT DOCUMENTS 5,915,167 A 6/1999 Leedy
7,005,350 B2 * 2/2006 Walker .............. H01L 27/11568
257/344
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

Primary Examiner — Jarrett Stark
(74) Attorney, Agent, or Firm — The Marbury Law Group PLLC

(57) ABSTRACT

A method of forming a monolithic three-dimensional memory device includes forming a first alternating stack over a substrate, forming an insulating cap layer, forming a first memory opening through the insulating cap layer and the first alternating stack, forming a sacrificial pillar structure in the first memory opening, forming a second alternating stack, forming a second memory opening, forming an inter-stack memory opening, forming a memory film and a first semiconductor channel layer in the inter-stack memory opening, anisotropically etching a horizontal bottom portion of the memory film and the first semiconductor channel layer to expose the substrate at the bottom of the inter-stack memory opening such that damage to portions of the first semiconductor channel layer and the memory film located adjacent to the insulating cap layer is reduced or avoided, and forming a second semiconductor channel layer in contact with the exposed substrate in the inter-stack memory opening.

4 Claims, 47 Drawing Sheets

(51) Int. Cl.
  *H01L 27/1157*   (2017.01)
  *H01L 27/11582*  (2017.01)
  *H01L 23/522*    (2006.01)
  *H01L 21/768*    (2006.01)

(52) U.S. Cl.
  CPC ...... *H01L 23/5226* (2013.01); *H01L 27/1157* (2013.01); *H01L 27/11582* (2013.01)

(56) References Cited

U.S. PATENT DOCUMENTS

| | | | |
|---|---|---|---|
| 7,821,058 B2 * | 10/2010 | Kidoh | H01L 27/11568 257/324 |
| 7,983,084 B2 * | 7/2011 | Tokiwa | G11C 16/0483 365/185.06 |
| 8,884,357 B2 | 11/2014 | Wang et al. | |
| 8,946,023 B2 | 2/2015 | Makala et al. | |
| 9,230,987 B2 | 1/2016 | Pachamuthu et al. | |
| 9,449,987 B1 * | 9/2016 | Miyata | H01L 27/11582 |
| 9,490,262 B1 * | 11/2016 | Pang | H01L 27/11582 |
| 9,490,371 B2 * | 11/2016 | Noh | H01L 29/66833 |
| 9,490,429 B2 * | 11/2016 | Sasago | H01L 27/0688 |
| 2006/0001073 A1 * | 1/2006 | Chen | H01L 21/7682 257/314 |
| 2007/0252201 A1 * | 11/2007 | Kito | H01L 21/8221 257/331 |
| 2009/0090965 A1 * | 4/2009 | Kito | H01L 21/8221 257/326 |
| 2009/0108333 A1 * | 4/2009 | Kito | H01L 27/115 257/324 |
| 2009/0146206 A1 * | 6/2009 | Fukuzumi | H01L 21/8221 257/324 |
| 2009/0224309 A1 * | 9/2009 | Kidoh | H01L 21/8221 257/326 |
| 2009/0230458 A1 * | 9/2009 | Ishiduki | H01L 27/11565 257/324 |
| 2009/0294844 A1 * | 12/2009 | Tanaka | H01L 21/28282 257/330 |
| 2010/0072538 A1 * | 3/2010 | Kito | H01L 27/11578 257/326 |
| 2010/0117137 A1 * | 5/2010 | Fukuzumi | H01L 21/28282 257/324 |
| 2010/0123202 A1 * | 5/2010 | Hofmann | H01L 21/8221 257/401 |
| 2010/0163968 A1 * | 7/2010 | Kim | H01L 27/11582 257/324 |
| 2010/0213537 A1 * | 8/2010 | Fukuzumi | H01L 27/11578 257/326 |
| 2011/0049607 A1 * | 3/2011 | Yahashi | H01L 27/11578 257/324 |
| 2011/0049608 A1 * | 3/2011 | Kidoh | H01L 27/11578 257/324 |
| 2011/0287612 A1 | 11/2011 | Lee et al. | |
| 2012/0001247 A1 | 1/2012 | Alsmeier | |
| 2013/0189444 A1 * | 7/2013 | Kub | C01B 31/0446 427/523 |
| 2015/0294978 A1 | 10/2015 | Lu et al. | |
| 2016/0322378 A1 * | 11/2016 | Ito | H01L 27/11582 |
| 2016/0322382 A1 * | 11/2016 | Lee | H01L 27/11582 |

OTHER PUBLICATIONS

Hammond, M. L., "Silicon Epitaxy by Chemical Vapor Deposition," pp. 45-106.
Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).
Seidel, H. et al., "Anisotropic Etching of Crystalline Silicon in Alkaline Solutions," J. Electrochem. Soc., vol. 137, No. 11, pp. 3612-3626, (1990).
U.S. Appl. No. 14/834,830, filed Aug. 25, 2015, SanDisk Technologies LLC.
U.S. Appl. No. 14/834,943, filed Aug. 25, 2015, SanDisk Technologies LLC.
U.S. Appl. No. 14/862,916, filed Sep. 23, 2015, SanDisk Technologies LLC.
U.S. Appl. No. 15/015,190, filed Feb. 4, 2016, SanDisk Technologies LLC.
Non-Final Office Communication for U.S. Appl. No. 15/071,575, dated Nov. 16, 2016, 13 pages.
International Application No. PCT/US2017/017823, International Search Report and Written Opinion, dated Jul. 5, 2017, 24pgs.

\* cited by examiner

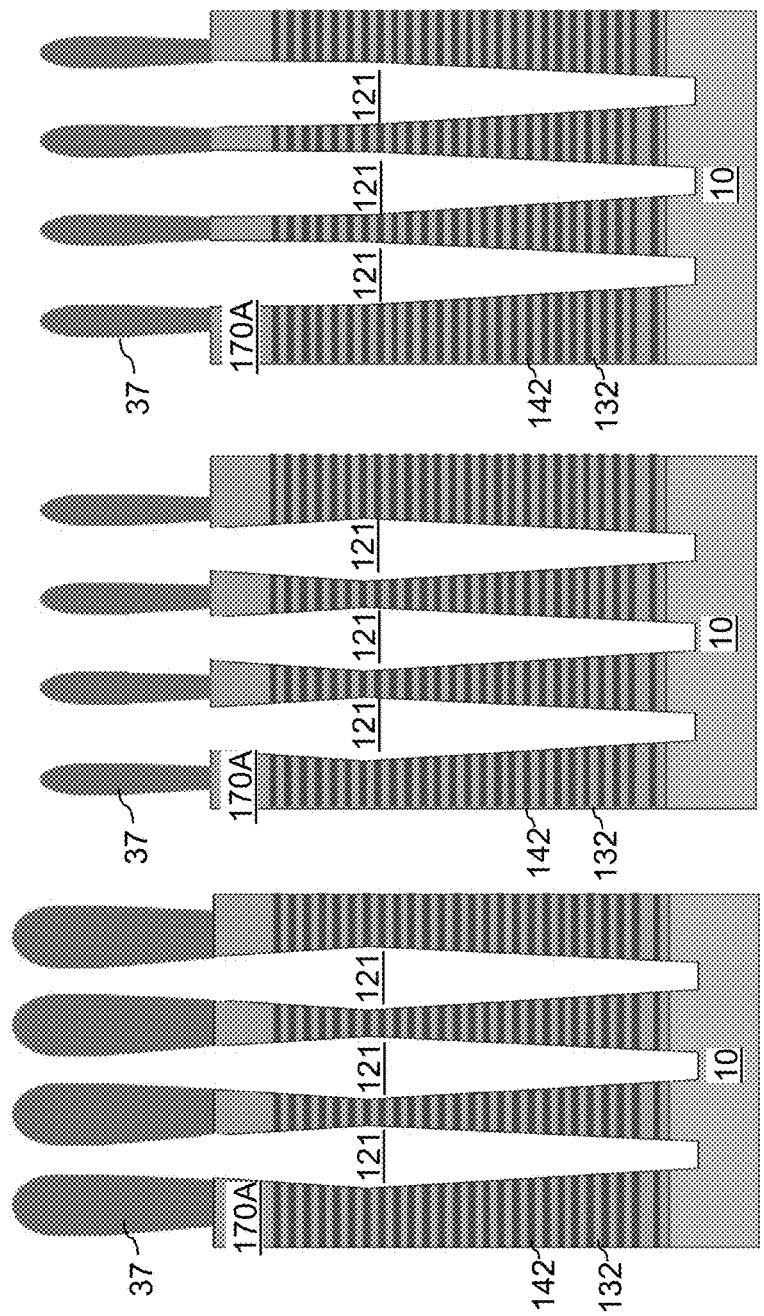

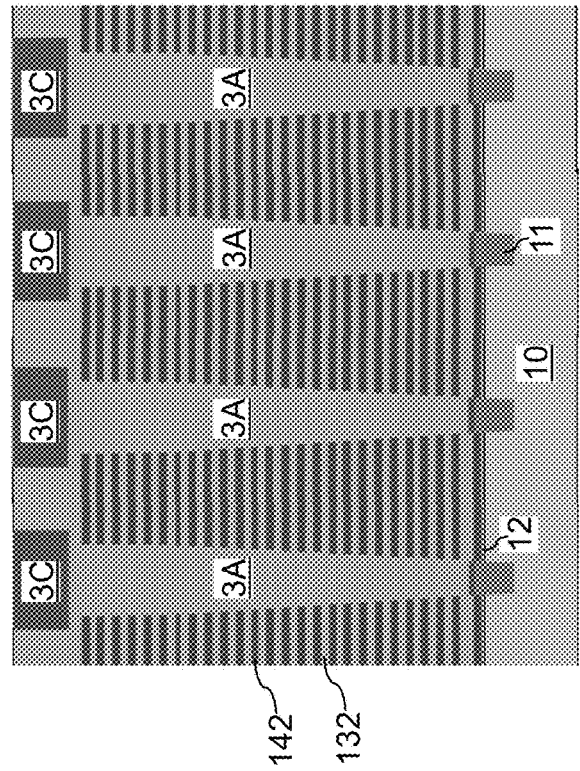
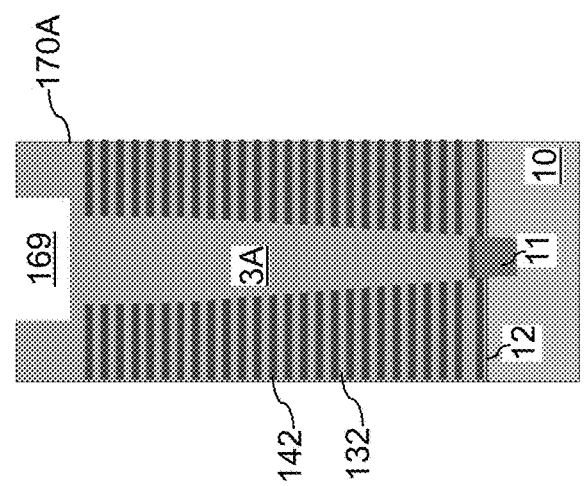
FIG. 41A
FIG. 41B

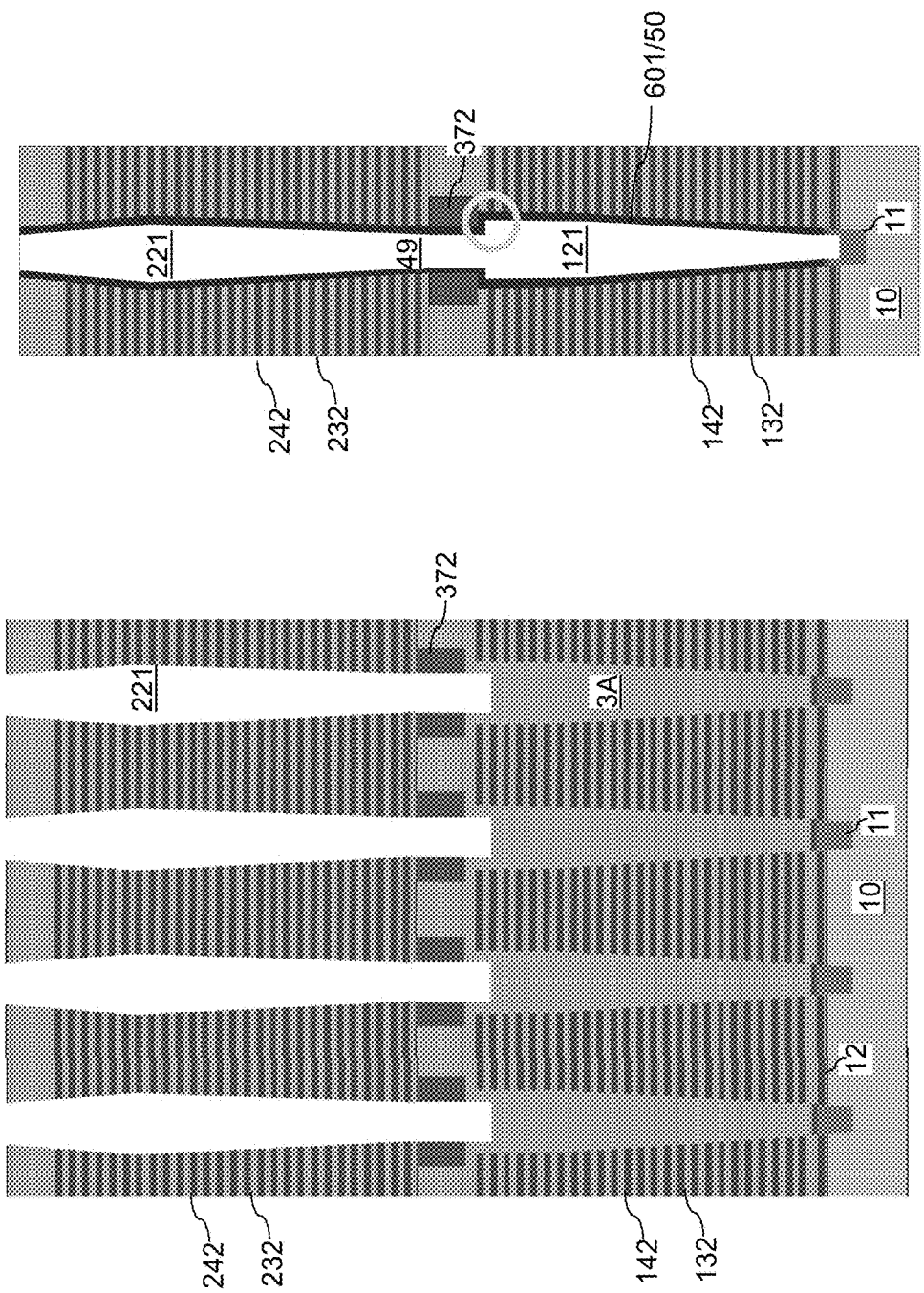

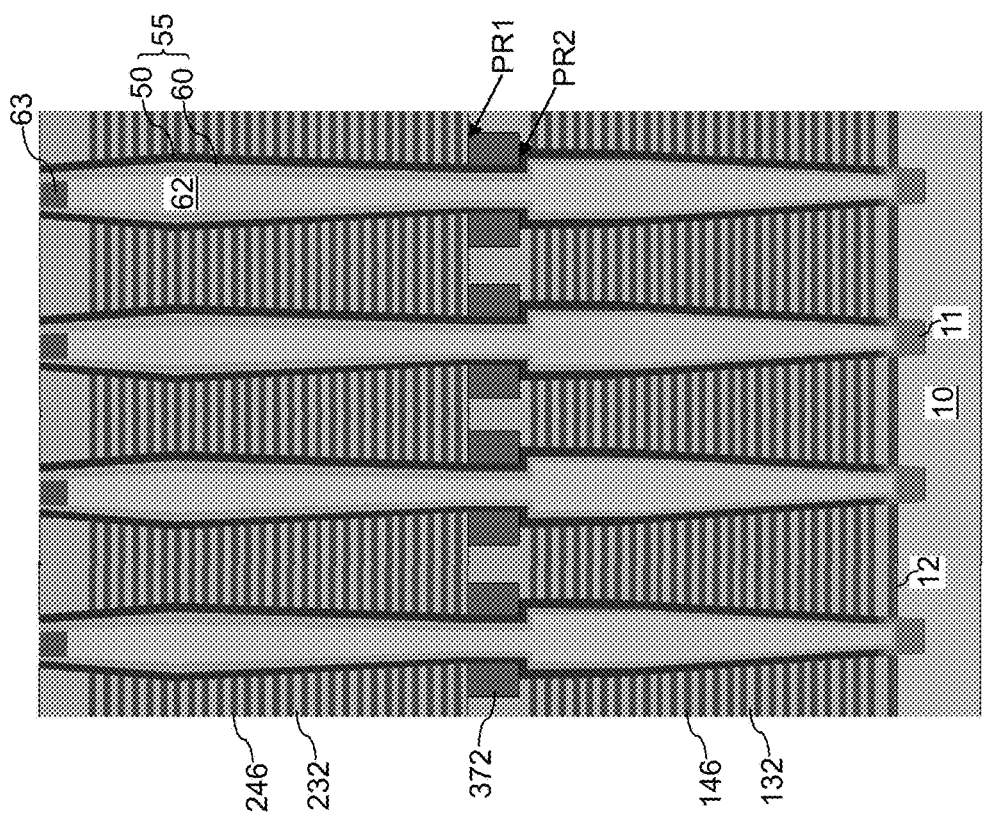

THREE-DIMENSIONAL MEMORY DEVICE CONTAINING ANNULAR ETCH-STOP SPACER AND METHOD OF MAKING THEREOF

FIELD

The present application is a continuation-in-part application of U.S. application Ser. No. 15/071,575 filed on Mar. 16, 2016, the entire contents of which are incorporated herein by reference.

FIELD

The present disclosure relates generally to the field of three-dimensional memory devices and specifically to three-dimensional memory devices including a vertical stack of multilevel memory arrays and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises: a first alternating stack of first insulating layers and first electrically conductive layers located over a top surface of a substrate; an insulating cap layer overlying the first alternating stack; a second alternating stack of second insulating layers and second electrically conductive layers overlying the insulating cap layer; a memory stack structure extending through the second alternating stack, the insulating cap layer, and the first alternating stack and comprising a semiconductor channel and a memory film including a plurality of charge storage regions; and an annular spacer located within the insulating cap layer and laterally surrounding the memory stack structure.

According to another aspect of the present disclosure, a method of forming a monolithic three-dimensional memory device includes forming a first alternating stack of first insulating layers and first spacer material layers over a substrate, forming an insulating cap layer over the first alternating stack, forming a first memory opening through the insulating cap layer and the first alternating stack, forming a sacrificial pillar structure in the first memory opening, forming a second alternating stack of second insulating layers and second spacer material layers over the insulating cap layer, forming a second memory opening through the second alternating stack, forming an inter-stack memory opening by removing the sacrificial pillar structure, forming a memory film and a first semiconductor channel layer in the inter-stack memory opening, anisotropically etching a horizontal bottom portion of the memory film and the first semiconductor channel layer to expose the substrate at the bottom of the inter-stack memory opening such that damage to portions of the first semiconductor channel layer and the memory film located adjacent to the insulating cap layer is reduced or avoided, and forming a second semiconductor channel layer in contact with the exposed substrate in the inter-stack memory opening.

According to yet another aspect of the present disclosure, a monolithic three-dimensional memory device is provided, which comprises: a first alternating stack of first insulating layers and first electrically conductive layers located over a top surface of a substrate; an insulating cap layer overlying the first alternating stack; a second alternating stack of second insulating layers and second electrically conductive layers overlying the insulating cap layer; and a memory stack structure extending through the second alternating stack, the insulating cap layer, and the first alternating stack and comprising a semiconductor channel and a memory film including a plurality of charge storage regions. The insulating cap layer comprises a first concave surface having a first radius of curvature, laterally surrounding the memory stack structure, and adjoined to an upper periphery of a substantially vertical sidewall of the memory stack structure. The insulating cap layer comprises a second concave surface having a second radius of curvature that is greater than the first radius of curvature, laterally surrounding the memory stack structure, and adjoined to an upper periphery of the first concave surface.

According to still another aspect of the present disclosure, a method of forming a device includes forming a first alternating stack of first insulating layers and first spacer material layers over a substrate; forming an insulating cap layer over the first alternating stack; forming a sacrificial material portion in a first memory opening extending through the insulating cap layer and the first alternating stack; performing a set of etch steps at least twice, the set of etch steps comprising a recess etch step that vertically recesses the top surface of the sacrificial material portion downward, and an isotropic etch step that isotropically etches a material of the insulating cap layer selective to the sacrificial material portion, wherein a remaining portion of the sacrificial material portion constitutes a sacrificial pillar structure; forming an fill material portion in an upper portion of the memory opening that overlies the sacrificial pillar structure; forming a second alternating stack of second insulating layers and second spacer material layers over the insulating cap layer; forming a second memory opening through the second alternating stack; and forming an inter-stack memory opening by removing the sacrificial pillar structure from below the second memory opening.

BRIEF DESCRIPTION OF THE DRAWINGS

FIGS. 40A-40C illustrate an exemplary processing sequence that can be employed to form substantially vertical sidewalls of first memory openings through the first alternating stack of any of the exemplary structures of the present disclosure.

FIGS. 41A and 41B are vertical cross-sectional views of an alternative embodiment of the fourth exemplary structure after formation of the recess regions and the etch stop material portions, respectively, according to an embodiment of the present disclosure.

FIGS. 42A and 42B are vertical cross-sectional views of the alternative embodiment of the fourth exemplary structure after formation of a second alternating stack and second memory openings according to an embodiment of the present disclosure.

FIG. 43 is a vertical cross-sectional view of the alternative embodiment of the fourth exemplary structure after formation of memory stack structures according to an embodiment of the present disclosure.

DETAILED DESCRIPTION

Figure 1:
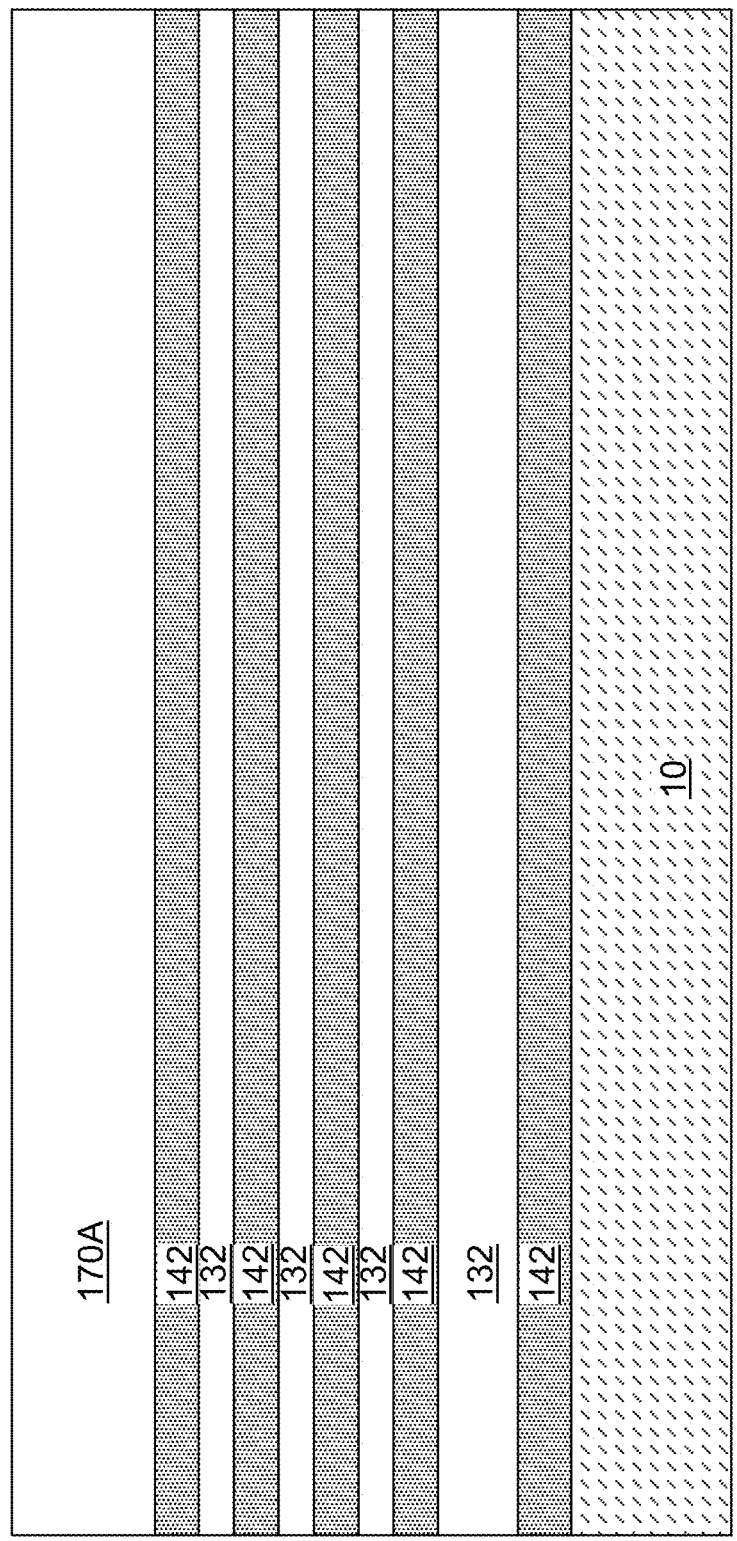
FIG. 1 is a vertical cross-sectional view of a first exemplary structure after formation of a first alternating stack of first insulating layers and first sacrificial material layers and formation of an overlying first insulating cap layer according to an embodiment of the present disclosure.

As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 10. The substrate semiconductor layer 10 can be a semiconductor material layer, and can include at least one elemental semiconductor material, at least one III-V compound semiconductor material, at least one II-VI compound semiconductor material, at least one organic semiconductor material, or other semiconductor materials known in the art. The substrate semiconductor layer 10 can comprise a single crystalline semiconductor material, such as a single crystal silicon wafer.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10. While the substrate semiconductor layer 10 is alternatively referred to as the substrate 10 in the present disclosure, it is understood that the substrate 10 may optionally include additional material layers (such as a handle substrate and a buried insulator layer as in the case of a semiconductor-on-insulator substrate).

The first exemplary structure includes a device region, in which memory devices can be subsequently formed, and a contact region (not shown), in which stepped surfaces are subsequently formed. As used herein, a "contact region" refers to a region in which contact via structures are to be formed. At least one semiconductor device for a peripheral circuitry can be formed in a peripheral device region (not shown). The at least one semiconductor device can include, for example, one or more field effect transistors. The least one semiconductor device for the peripheral circuitry can contain a driver circuit for memory devices to be subsequently formed, which can include at least one NAND device.

Optionally, a doped semiconductor well (not separately shown) can be provided in an upper portion of the substrate semiconductor layer 10. The doped semiconductor well can be formed, for example, by implantation of electrical dopants (p-type dopants or n-type dopants) into an upper portion of the substrate semiconductor layer 10, or by deposition of a single crystalline semiconductor material, for example, by selective epitaxy. In one embodiment, the doped semiconductor well can include a single crystalline semiconductor material (e.g., p-well).

An alternating stack of first material layers and second material layers is subsequently formed. Each first material layer can include a first material, and each second material layer can include a second material that is different from the first material. The alternating stack is herein referred to as a first alternating stack. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the semiconductor substrate layer 10, which is a portion of a substrate. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first insulating cap layer 170A is sequentially formed. The first insulating cap layer 170A includes a dielectric material, which can be any dielectric material that can be employed for the first insulating layers 132. In one embodiment, the first insulating cap layer 170A includes the same dielectric material as the first insulating layers 132. The thickness of the insulating cap layer 170A can be in a range from 20 nm to 300 nm, although lesser and greater thicknesses can also be employed.

Optionally, the first insulating cap layer 170A and the first alternating stack (132, 142) can be patterned to form first stepped surfaces in a contact region (not shown). The contact region includes a first stepped area in which the first stepped surfaces are formed, and a second stepped area in which additional stepped surfaces are to be subsequently formed in a second tier structure (to be subsequently formed over a first tier structure). The first stepped surfaces can be formed, for example, by forming a mask layer with an opening therein, etching a cavity within the levels of the first insulating cap layer 170A, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first retro-stepped dielectric material portion (not shown). As used herein, a "retro-stepped" element refers to an element that has stepped surfaces and a horizontal cross-sectional area that increases monotonically as a function of a vertical distance from a top surface of a substrate on which the element is present.

Figure 2:
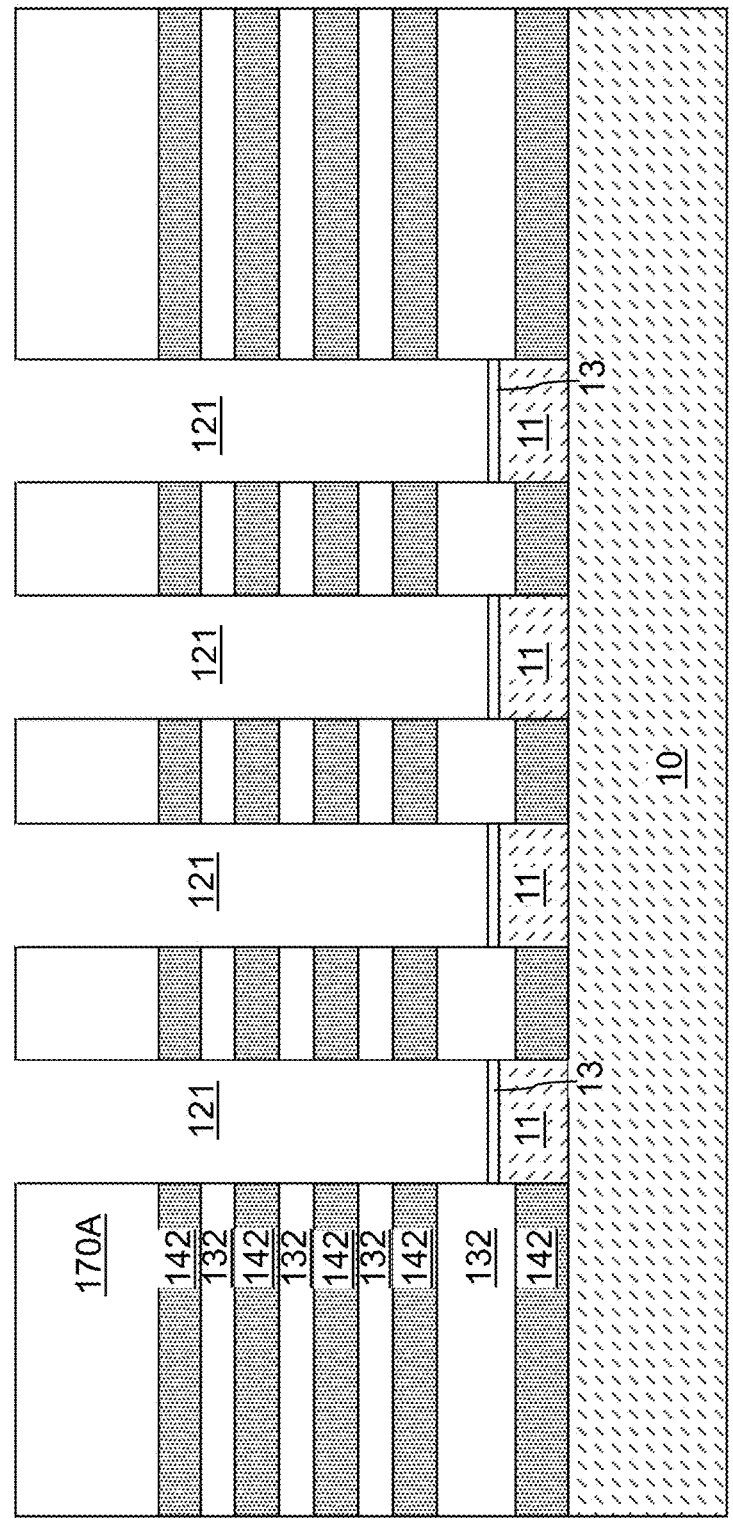
FIG. 2 is a vertical cross-sectional view of the first exemplary structure after formation of lower memory openings, optional epitaxial channel portions, and semiconductor oxide portions according to an embodiment of the present disclosure.

Referring to FIG. 2, lower memory openings 121 extending to a top surface of the substrate 10 are formed through the first alternating stack (132, 142). The lower memory openings 121 can be formed in the device region. For example, a lithographic material stack (not shown) including at least a photoresist layer can be formed over the first insulating cap layer 170A, and can be lithographically patterned to form openings within the lithographic material stack. The pattern in the lithographic material stack can be transferred through the first insulating cap layer 170A and through the entirety of the first alternating stack (132, 142) by at least one anisotropic etch that employs the patterned lithographic material stack as an etch mask. Portions of the first insulating cap layer 170A and the first alternating stack (132, 142) underlying the openings in the patterned lithographic material stack are etched to form the lower memory openings 121. In other words, the transfer of the pattern in the patterned lithographic material stack through the first insulating cap layer 170A and the first alternating stack (132, 142) forms the lower memory openings 121.

In one embodiment, the chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches. The sidewalls of the lower memory openings 121 can be substantially vertical, or can be tapered. Subsequently, the patterned lithographic material stack can be subsequently removed, for example, by ashing.

A selective epitaxy process can be performed to deposit a semiconductor material on physically exposed semiconductor surfaces. Specifically, epitaxial channel portions 11 can grow from the semiconductor surfaces at the bottom of the lower memory openings 121 during the selective epitaxy process. The epitaxial channel portions 11 comprise a single crystalline semiconductor material in epitaxial alignment with the single crystalline substrate semiconductor material of the substrate semiconductor layer 10.

In one embodiment, the deposited semiconductor material may be doped with in-situ doping of a p-type dopant or an n-type dopant. Thus, the epitaxial channel portions 11 can be doped with electrical dopants of a suitable conductivity type. In one embodiment, the substrate semiconductor layer 10 and the epitaxial channel portions 11 can have a doping of the first conductivity type (e.g., p-type). The epitaxial channel portions 11 may comprise silicon.

The selective epitaxy process can be performed, for example, by sequentially or simultaneously flowing a reactant gas (such as $SiH_4$, $SiH_2Cl_2$, $SiHCl_3$, $SiCl_4$, $Si_2H_6$, $GeH_4$, $Ge_2H_6$, other semiconductor precursor gases, or combinations there) with an etchant gas (such as HCl). The deposition rate of the semiconductor material on amorphous surfaces (such as the surfaces of dielectric materials) is less than the etch rate of the semiconductor material by the etchant, while the deposition rate of the semiconductor material on crystalline surfaces (such as the top surface of the substrate semiconductor layer 10) is greater than the etch rate of the semiconductor material by the etchant. Thus, the semiconductor material is deposited only on the semiconductor surface, which is the physically exposed portion of the top surface of the substrate semiconductor layer 10. The process conditions (such as the deposition temperature, the partial pressure of the various gases in a process chamber, etc.) can be selected such that the deposited semiconductor material is epitaxial, i.e., single crystalline silicon or another semiconductor material with atomic alignment with the single crystalline structure of the substrate semiconductor layer 10 (e.g., p-well). Each epitaxial channel portion 11 can be formed at a bottom portion of a respective lower memory opening 121.

Subsequently, a thermal oxidation process or a plasma oxidation process can be performed to oxidize a surface portion of each epitaxial channel portion 11, thereby converting the surface portion into a respective semiconductor oxide portion 13. The thickness of the semiconductor oxide portion 13 can be in a range from 1 nm to 10 nm, although lesser and greater thicknesses can also be employed.

Figure 3:
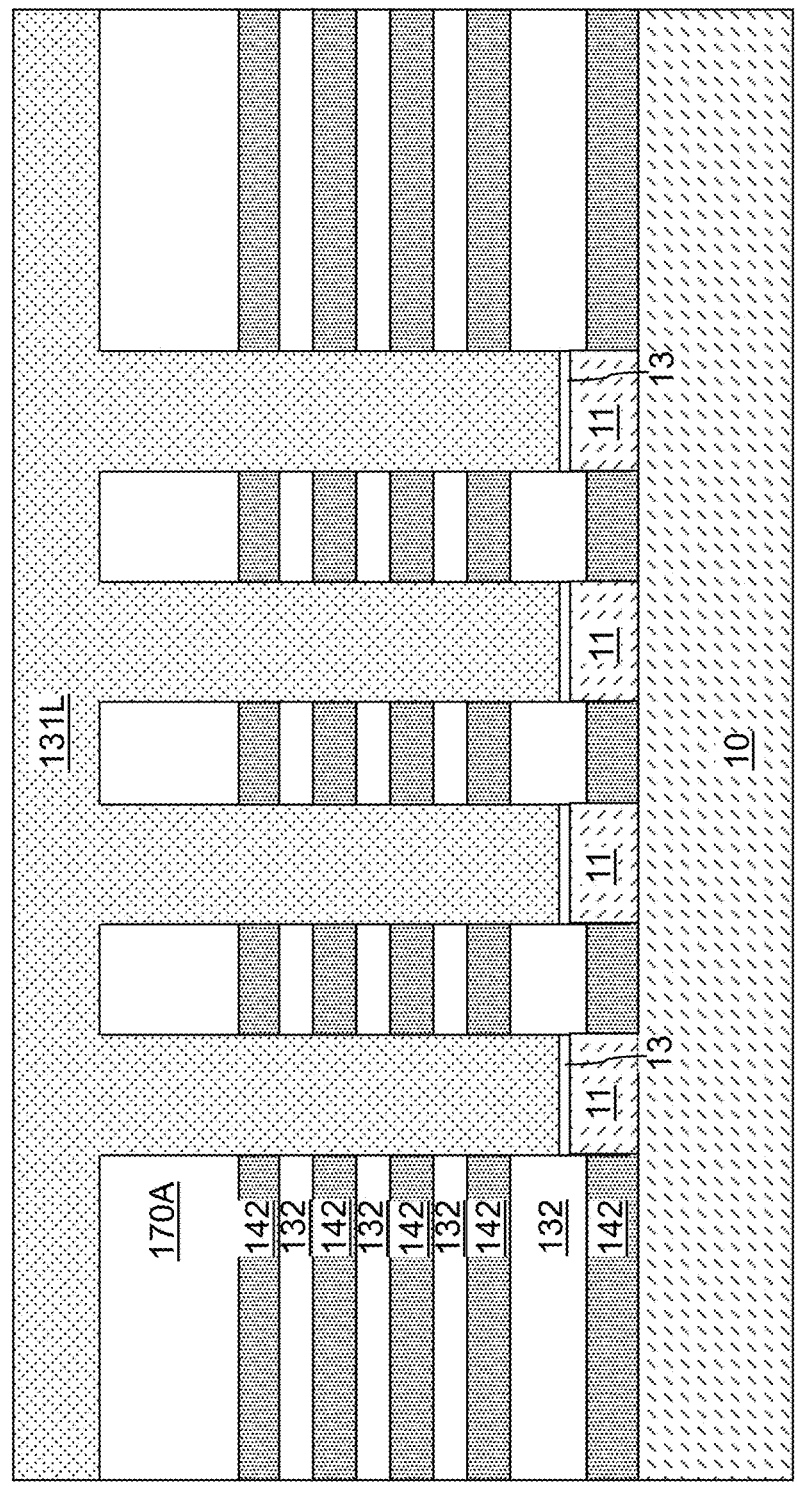
FIG. 3 is a vertical cross-sectional view of the first exemplary structure after deposition of a sacrificial fill material layer according to an embodiment of the present disclosure.

Referring to FIG. 3, a sacrificial fill material layer 131L can be deposited over the epitaxial channel portions 11 in the lower memory openings 121. The sacrificial fill material layer 131L includes a temporary material, i.e., a sacrificial material, which is subsequently removed selective to the materials of the first insulator layers 132 and the first sacrificial material layers 142. In one embodiment, the sacrificial fill material layer 131L includes a semiconductor material such as silicon, a silicon-germanium alloy, germanium, a III-V compound semiconductor material, or a combination thereof. The sacrificial fill material layer 131L may be formed by a non-conformal deposition or a conformal deposition method. In one embodiment, a cavity may be formed inside one or more of the lower memory openings 121 in case a non-conformal deposition method is employed to form the sacrificial fill material layer 131L. In one embodiment, the sacrificial fill material layer 131L can be formed directly on the semiconductor oxide portions 13.

In one embodiment, the sacrificial fill material layer 131L can include an undoped semiconductor material. As used herein, an "undoped" semiconductor material refers to a semiconductor material that is intrinsic, or not intentionally doped, and thus, having a low dopant concentration such as less than $1.0 \times 10^{17}/cm^3$. In one embodiment, the sacrificial fill material layer 131L can be an amorphous or polycrystalline silicon layer including undoped amorphous or polycrystalline silicon.

Figure 4:
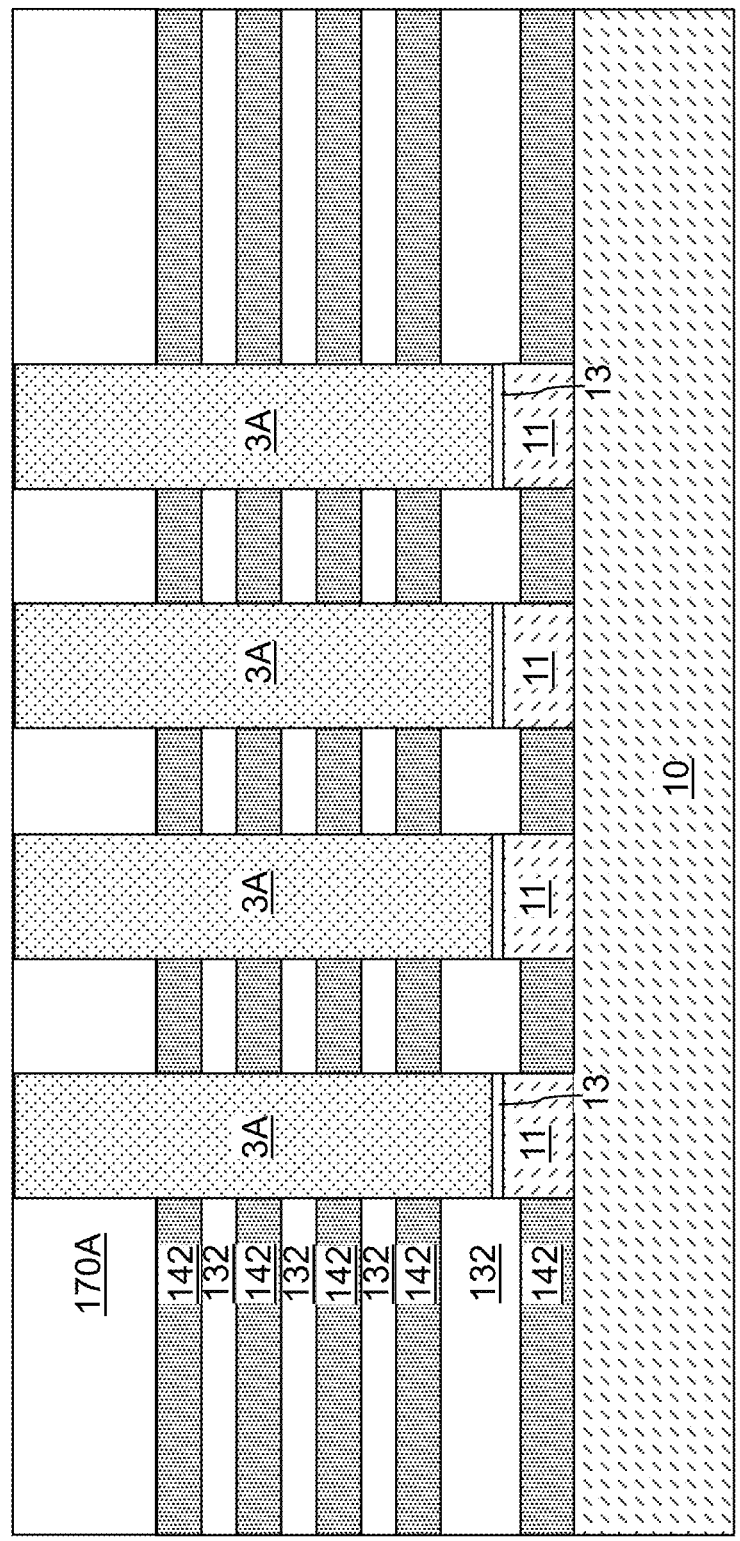
FIG. 4 is a vertical cross-sectional view of the first exemplary structure after formation of sacrificial pillar structures according to an embodiment of the present disclosure.

Referring to FIG. 4, portions of the deposited sacrificial material can be removed from above the first insulating cap layer 170A. Specifically, the sacrificial fill material layer 131L can be recessed to a top surface of the first insulating cap layer 170A employing a planarization process. The planarization process can include a recess etch, chemical mechanical planarization (CMP), or a combination thereof. The top surface of the first insulating layer 170A can be employed as an etch stop layer or a planarization stop layer. Each remaining portion of the sacrificial material in a lower memory opening constitutes a sacrificial pillar structure 3A. The top surfaces of the sacrificial pillar structures 3A can be coplanar with the top surface of the first insulating cap layer 170A. The sacrificial pillar structures 3A may, or may not, include cavities therein.

Figure 5:
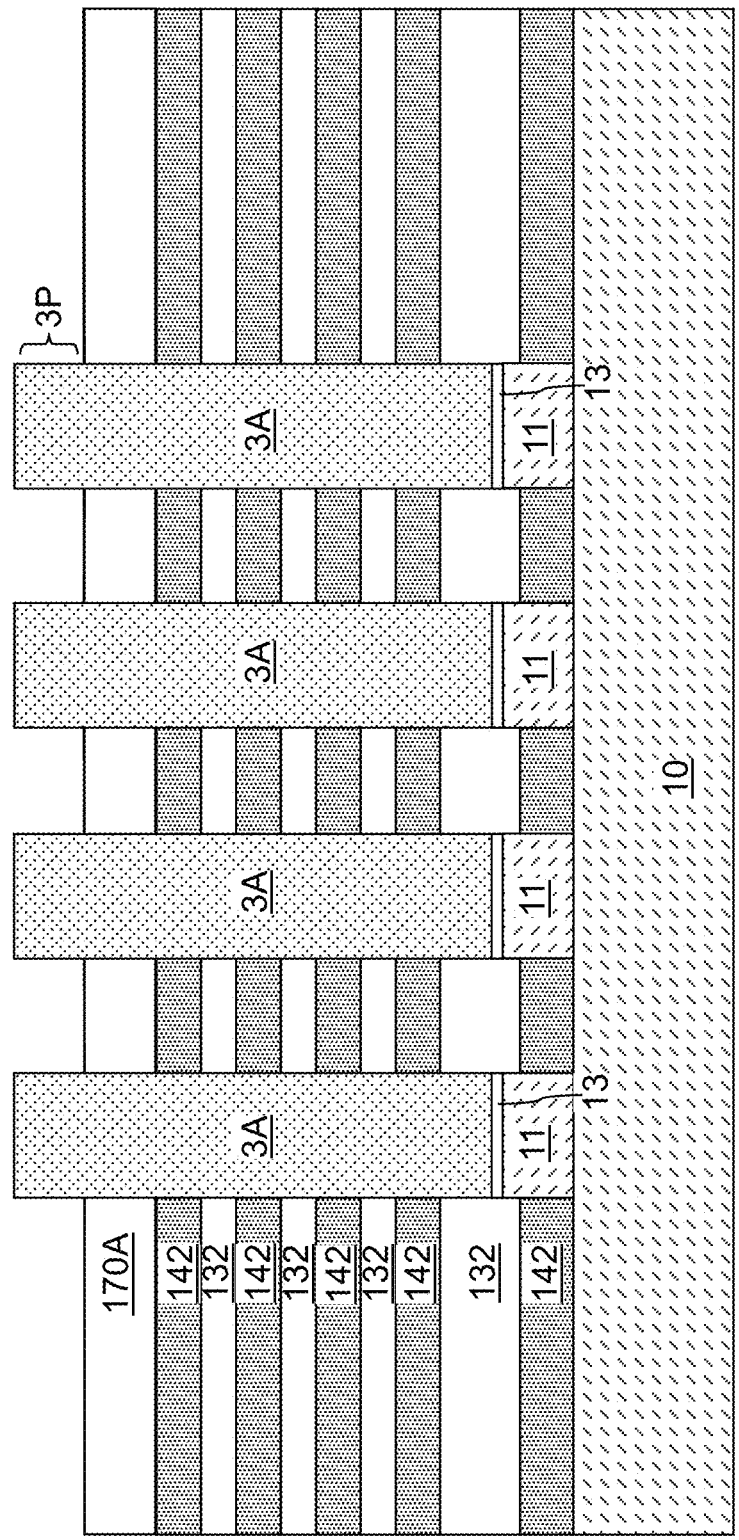
FIG. 5 is a vertical cross-sectional view of the first exemplary structure after recessing the first insulating cap layer according to an embodiment of the present disclosure.

Referring to FIG. 5, the first insulating cap layer 170A can be recessed selective to the material of the sacrificial pillar structures 3A. The recessing of the first insulating cap layer 170A with respect to the top surfaces of the sacrificial pillar structures 3A can be performed employing a selective etch process, which can be an isotropic etch or an anisotropic etch. In an illustrative example, if the first insulating cap layer 170A includes silicon oxide and if the sacrificial pillar structures 3A include semiconductor materials, the first insulating cap layer 170A can be recessed by a wet etch employing KOH. The recess depth can be in a range from 10% to 90% of the initial thickness of the first insulating cap layer 170A, and may be in a range from 25% to 75% of the initial thickness of the first insulating cap layer 170A. The recess depth is the same as the height of the protruding portions 3P of the sacrificial pillar structures above the recessed top surface of the first insulating cap layer 170A. In an illustrative example, the recess depth can be in a range from 20 nm to 200 nm, although lesser and greater thicknesses can also be employed.

Figure 6:
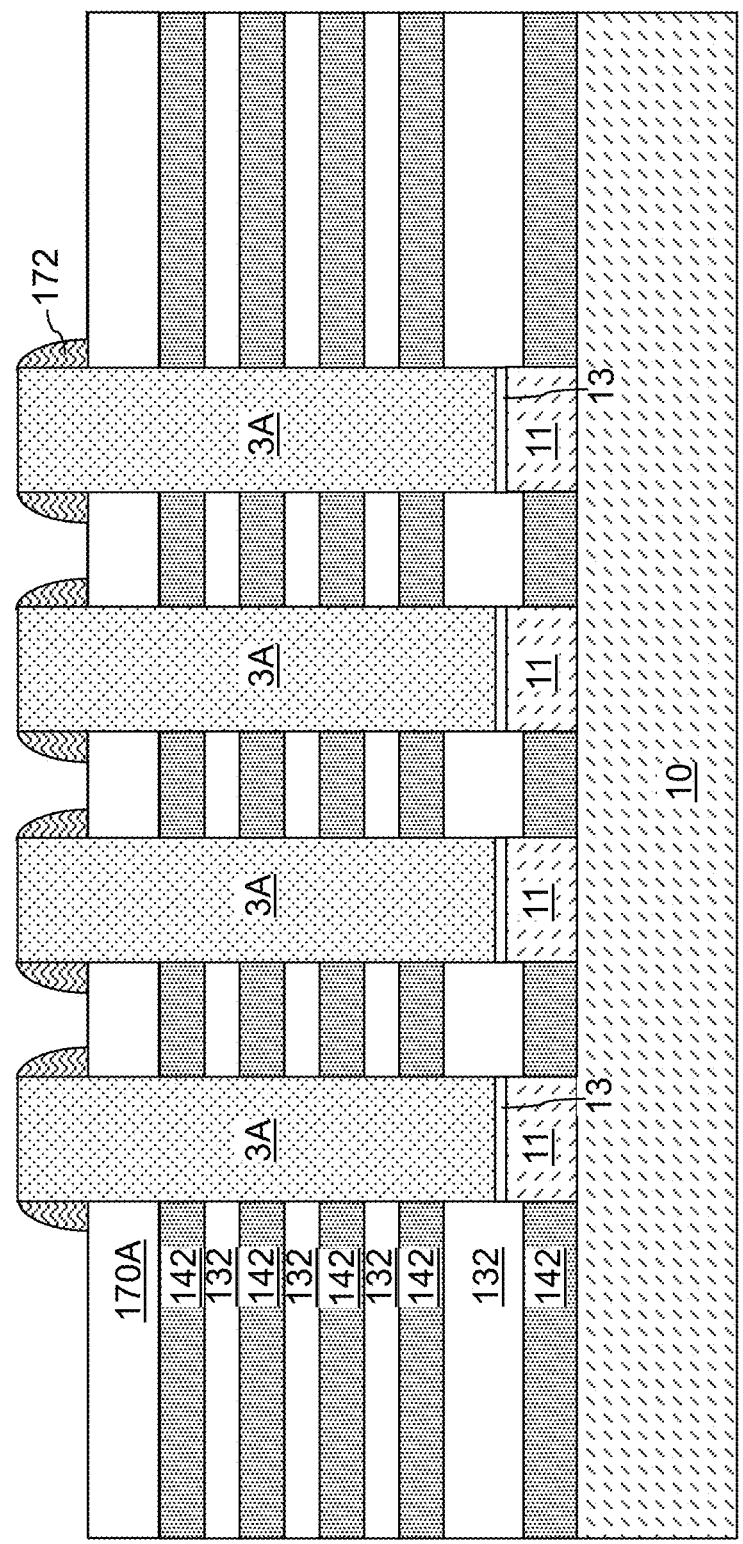
FIG. 6 is a vertical cross-sectional view of the first exemplary structure after formatting of annular spacers around protruding portions of the sacrificial pillar structures according to an embodiment of the present disclosure.

Referring to FIG. 6, annular spacers 172 can be formed around protruding portions 3P of the sacrificial pillar structures 3A. As used herein, an "annular" element refers to an element that is topologically homeomorphic to a torus, and thus, topologically homeomorphic to a ring with a single hole. As used herein, a first element is "topologically homeomorphic" to a second element if the first element can be continuously stretched into the second element without destroying a pre-existing hole and without creating a new hole. Each annular spacer 172 can be formed on sidewalls of the protruding portion 3P of a respective sacrificial pillar structure 3A above a recessed top surface of the first insulating cap layer 170A. For example, a spacer material layer can be formed over the sacrificial pillar structures 3A and over the recessed top surface of the first insulating cap layer and around the protruding portion of the sacrificial pillar structures 3A. The spacer material layer includes a material that is different from the material of the sacrificial pillar structures 3A. In one embodiment, the sacrificial material layer includes a semiconductor material that is different from the material of the sacrificial pillar structures 3A. In one embodiment, the sacrificial pillar structures 3A include undoped amorphous or polycrystalline silicon, and the spacer material layer includes a heavily doped semiconductor material (such as heavily doped silicon, such as heavily doped amorphous or polycrystalline silicon). As used herein, a "heavily doped" semiconductor material refers to a semiconductor material that is doped with p-type dopants or n-type dopants at a dopant concentration greater than $1.0 \times 10^{18}/cm^3$, such as $1.0 \times 10^{19}/cm^3$ to $1.0 \times 10^{22}/cm^3$, including $1.0 \times 10^{20}/cm^3$ to $1.0 \times 10^{21}/cm^3$. In one embodiment, the spacer material layer can be a conformal material layer having a uniform thickness in a range from 20 nm to 100 nm, although lesser and greater thicknesses can also be employed.

The spacer material layer can be anisotropically etched using any suitable sidewall spacer anisotropic etch to remove horizontal portions of the spacer material layer from above the top surfaces of the sacrificial pillar structures 3A and from portions of the recessed top surface of the first insulating cap layer 170A that are spaced from the sidewalls of the sacrificial pillar structures 3A by more than the thickness of the spacer material layer. Each remaining annular portion of the spacer material layer constitutes an annular spacer 172. The lateral thickness of each annular spacer 172, as measured at the bottom portion thereof between the outer sidewall and a most proximate portion of the inner sidewall, can be substantially the same as the initial thickness of the sacrificial material layer.

Figure 7:
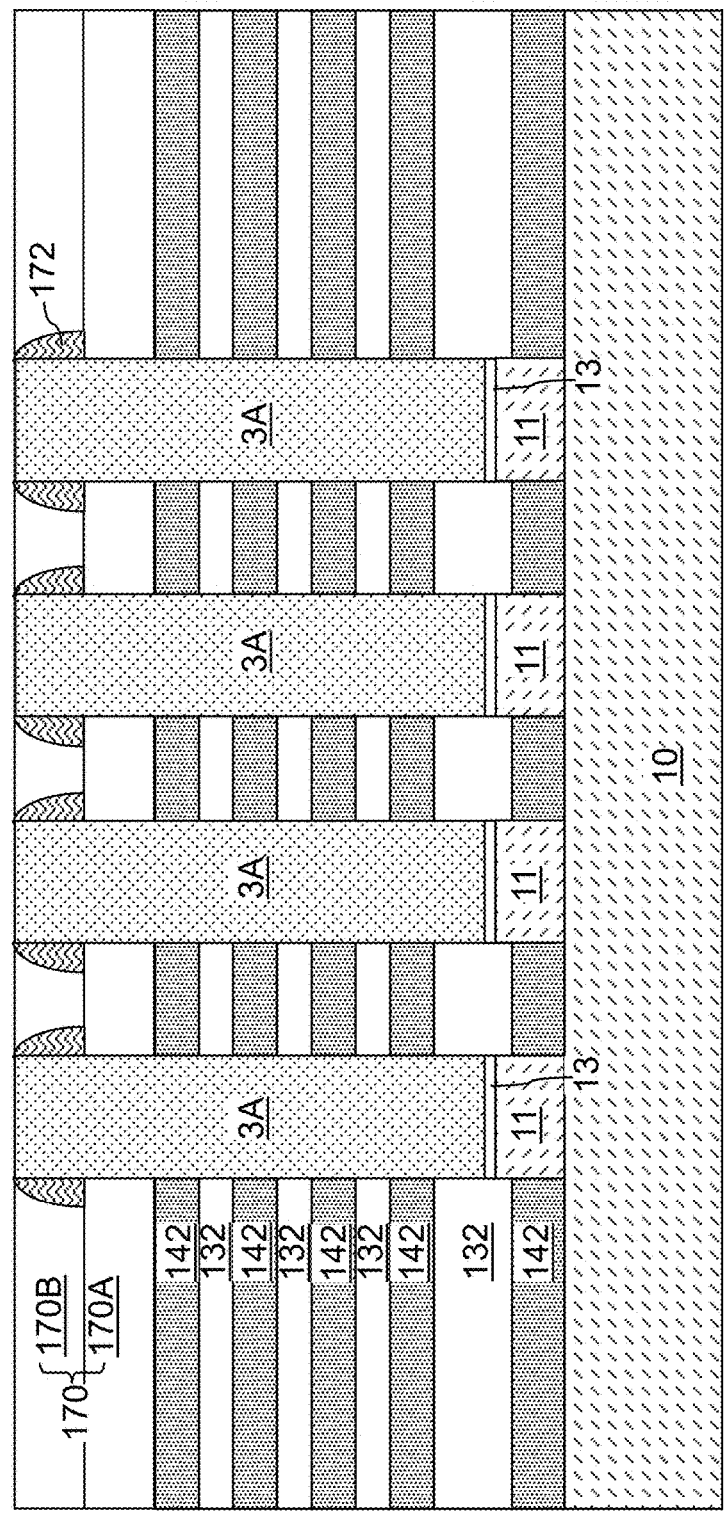
FIG. 7 is a vertical cross-sectional view of the first exemplary structure after deposition and planarization of a second insulating cap layer according to an embodiment of the present disclosure.

Referring to FIG. 7, a second insulating cap layer 170B can be deposited over the annular spacers 172, the sacrificial pillar structures 3A, and the physically exposed surfaces of the first insulating cap layer 170A. The second insulating cap layer 170B includes a dielectric material that can be subsequently planarized. For example, the second insulating cap layer 170B can include doped silicate glass, undoped silicate glass (e.g., silicon oxide deposited by CVD using a TEOS source), or organosilicate glass. The second insulating cap layer 170B can be formed employing chemical vapor deposition (CVD) or spin-on coating.

Subsequently, the second insulating cap layer 170B can be planarized to remove portions above a horizontal plane including the top surfaces of the sacrificial pillar structures 3A. The planarization of the second insulating cap layer 170B can be performed, for example, by chemical mechanical planarization employing the sacrificial pillar structures 3A as stopping structures. In one embodiment, a planarized top surface of the second insulating cap layer 170B can be within a same horizontal plane as the topmost surfaces of each annular spacer 172. The first insulating cap layer 172A and the second insulating cap layer 172B are collectively referred to a first insulating cap layer 170. The first alternating stack (132, 142), the first insulating cap layer 170, and elements embedded in the first alternating stack (132, 142) (e.g., elements 3A and 172) collectively constitute a first tier structure (132, 142, 170, 3A).

Figure 8:
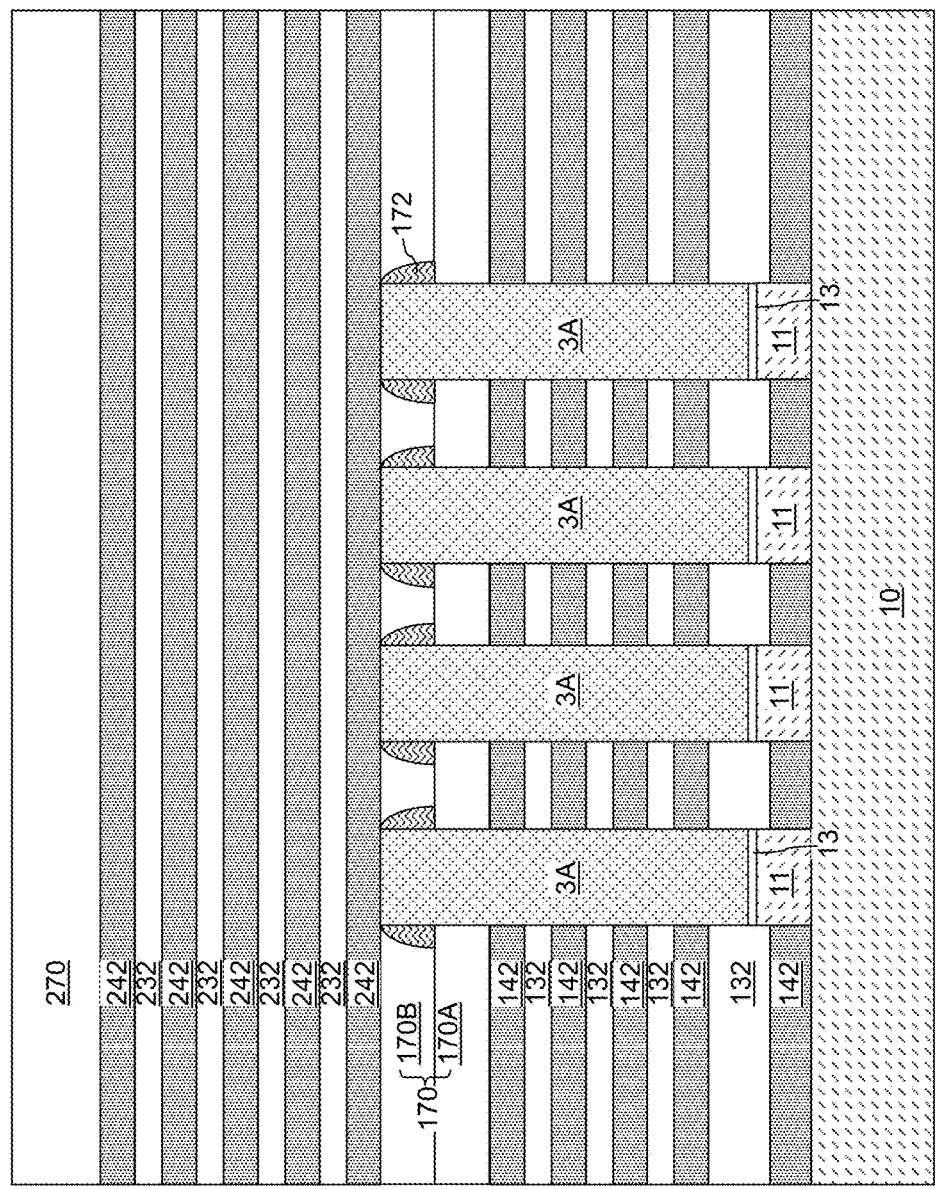
FIG. 8 is a vertical cross-sectional view of the first exemplary structure after formation of a second alternating stack of second insulating layers and second sacrificial material layers according to an embodiment of the present disclosure.

Referring to FIG. 8, a second tier structure can be formed over the first tier structure (132, 142, 170, 3A). The second tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A second insulating cap layer 270 can be subsequently formed over the second stack (232, 242). The second insulating cap layer 270 includes a dielectric material that is different from the material of the second sacrificial material layers 242. In one embodiment, the insulating cap layer 70 can include silicon oxide. In one embodiment, the first and second sacrificial material layers (142, 242) can comprise silicon nitride. Optionally, second stepped surfaces (not shown) can be region in the contact region in the same manner as formation of the first stepped surfaces. A second retro-stepped dielectric material portion may be formed over the second stepped surfaces.

Figure 9:
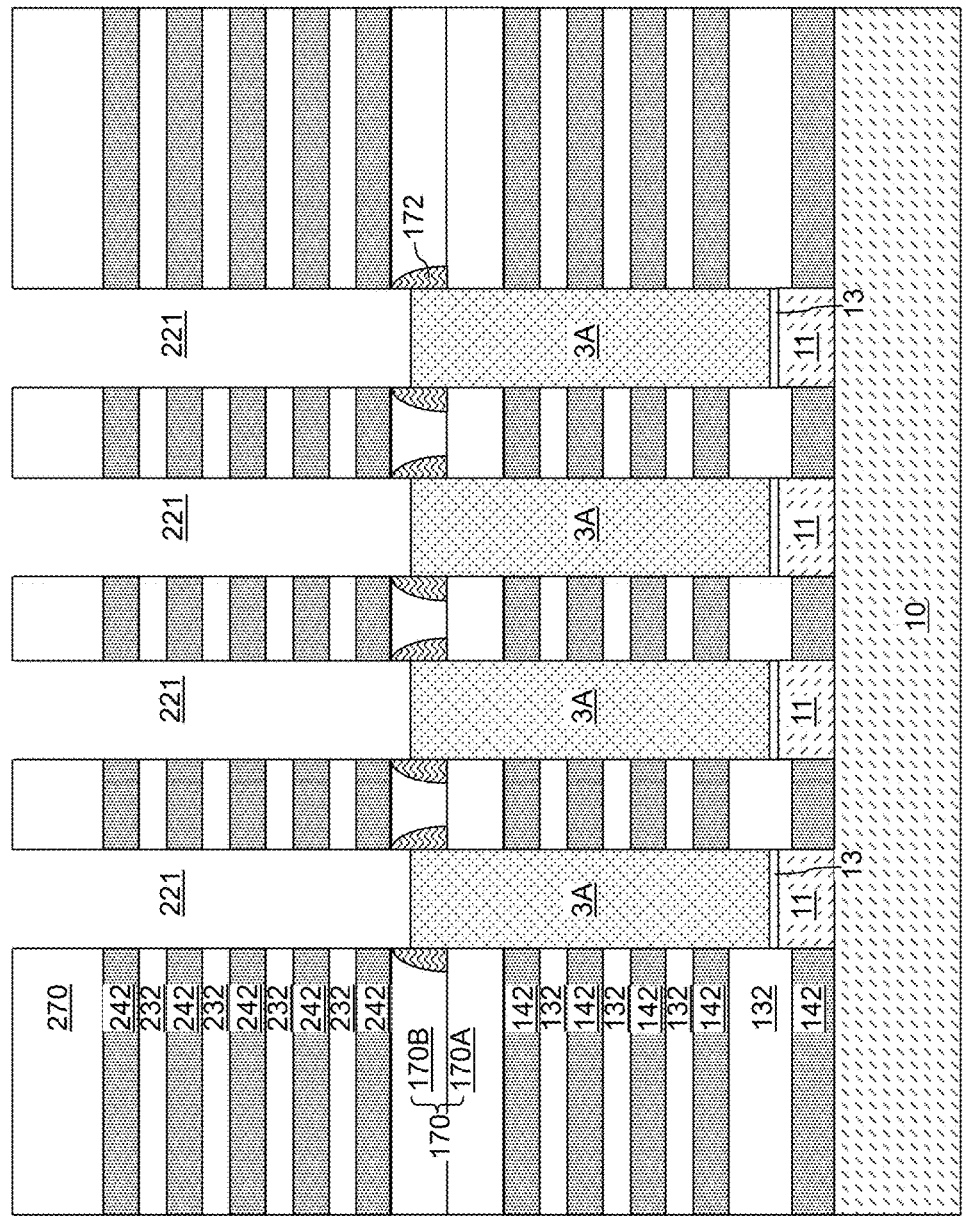
FIG. 9 is a vertical cross-sectional view of the first exemplary structure after formation of second memory openings according to an embodiment of the present disclosure.

Referring to FIG. 9, second memory openings 221 can be formed through the second tier structure (232, 242, 270) in an area overlying the lower memory openings 121, i.e., in areas that substantially coincides with the areas of the lower memory openings 121. The second memory openings 221 can be formed to the top surface of the sacrificial pillar structures 3A. For example, a lithographic material stack (not shown) including at least a photoresist layer can be formed over the second insulating cap layer 270 and the second tier structure (232, 242, 270), and can be lithographically patterned to form openings within the lithographic material stack. The pattern in the lithographic material stack can be transferred through the entirety of the second tier structure (232, 242, 270) by at least one anisotropic etch that employs the patterned lithographic material stack as an etch mask. Portions of the second insulating cap layer 270 and the second tier structure (232, 242, 270) underlying the openings in the patterned lithographic material stack are etched to form the second memory openings 221. In other words, the transfer of the pattern in the patterned lithographic material stack through the second insulating cap layer 270 and the second tier structure (232, 242, 270) forms the second memory openings 221. While not illustrated in FIG. 9, a misalignment can occur between the second memory openings 221 and the lower memory openings 121 due to overlay variations that are inherent in lithographic alignment of a new pattern (the pattern of the openings for the second memory openings) with a pre-existing pattern (the pattern of the sacrificial fill structures 3A).

In one embodiment, the chemistry of the anisotropic etch process employed to etch through the materials of the second stack (232, 242) can alternate to optimize etching of the third and fourth materials in the second stack (232, 242). The anisotropic etch can be, for example, a series of reactive ion etches. The sidewalls of the second memory openings 221 can be substantially vertical, or can be tapered. In one embodiment, the sacrificial pillar structures 3A may be employed as stopping structures for the anisotropic etch process that forms the second memory openings 221. An overetch into upper portions of the sacrificial pillar structures 3A can occur during the anisotropic etch. In other words, the second memory openings 221 can be formed employing an anisotropic etch process that stops at a height between a first horizontal plane including topmost surfaces of the annular spacers 172 and a second horizontal plane including bottom surfaces of the annular spacers 172.

Figure 10:
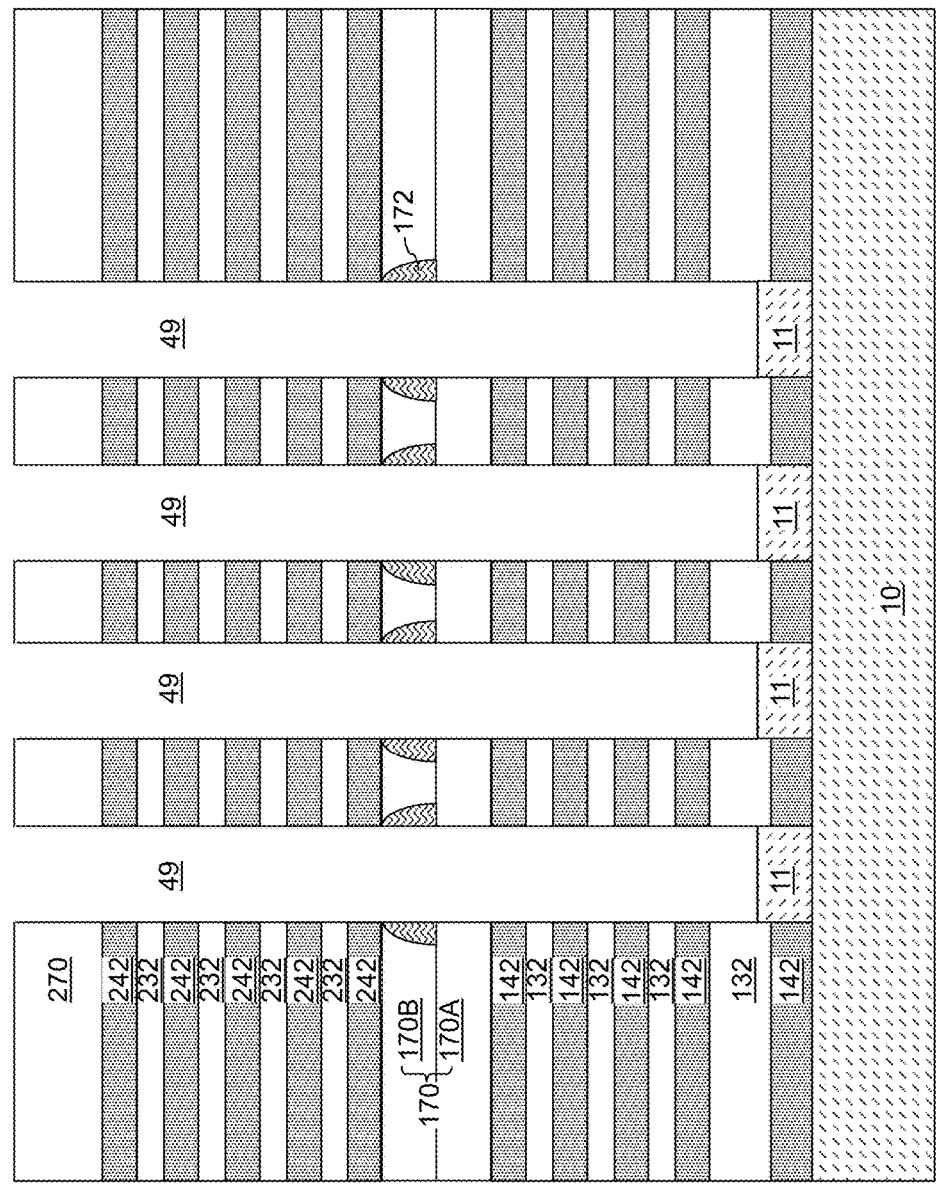
FIG. 10 is a vertical cross-sectional view of the first exemplary structure after removal of the sacrificial pillar structures to form memory openings according to an embodiment of the present disclosure.

Referring to FIG. 10, the sacrificial pillar structures 3A can be removed selective to the materials of the annular spacers 172, the first and second insulating cap layers (170, 270), the lower and second tier structures (132, 142, 232, 242), and the semiconductor oxide portions 13. In case the sacrificial pillar structures 3A comprise an undoped semiconductor material (such as undoped amorphous silicon or polycrystalline silicon), an etch chemistry that removes the undoped semiconductor material selective to dielectric materials and to the material of the annular spacers 172 can be employed. If the annular spacers 172 includes heavily doped semiconductor material (such as heavily doped amorphous or polycrystalline silicon), a wet etch employing hot trimethyl-2 hydroxyethyl ammonium hydroxide ("hot TMY") can be employed. A plurality of memory openings 49 can be formed through the first and second tier structures (132, 142, 232, 242, 170, 270).

In one embodiment, removal of the sacrificial pillar structures 3A can be performed selective to the annular spacers 172 such that the spacers 172 are substantially retained employing an etch chemistry that provides differential etch rates that depend on the concentration of electrical dopants (e.g., which etches the pillar structures 3A at a rate that is at least 50 times greater, such as 100 to 150 times greater, than the spacers 172). In one embodiment, the sacrificial pillar structures 3A can include a first semiconductor material that does not include electrical dopants or includes electrical dopants at an atomic concentration less than $1.0 \times 10^{17}/cm^3$, and the annular spacers 172 can include a second semiconductor material that includes electrical dopants at an atomic concentration greater than $1.0 \times 10^{18}/cm^3$. In one embodiment, the sacrificial pillar structures 3A can include amorphous or polycrystalline silicon that does not include electrical dopants or includes electrical dopants at an atomic concentration less than $1.0 \times 10^{17}/cm^3$, the annular spacers 172 can include amorphous or polycrystalline silicon that includes electrical dopants at an atomic concentration greater than $1.0 \times 10^{18}/cm^3$, and removal of the sacrificial pillar structures 3A selective to the annular spacers 172 can be performed employing hot trimethyl-2 hydroxyethyl ammonium hydroxide.

Subsequently, semiconductor oxide portions 13 may be optionally removed to physically expose the top surfaces of the epitaxial channel portions 11. In one embodiment, the semiconductor oxide portions 13 can be removed by a wet etch employing hydrofluoric acid. In another embodiment, the semiconductor oxide portions are not removed.

Figure 11:
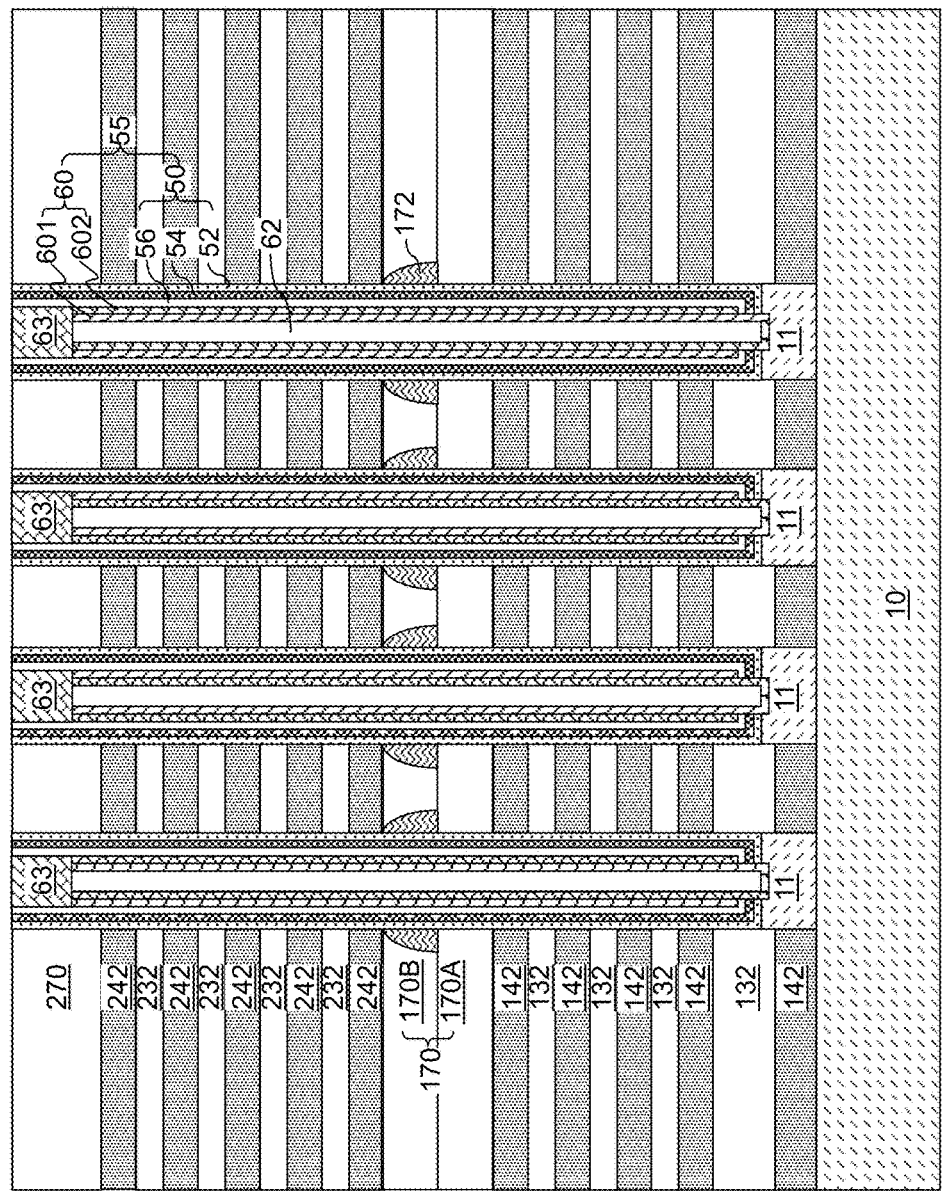
FIG. 11 is a vertical cross-sectional view of the first exemplary structure after formation of memory stack structures, dielectric cores, and drain regions according to an embodiment of the present disclosure.

Referring to FIG. 11, memory stack structures 55 can be formed in the memory openings 49. In an illustrative example, each memory stack structure 55 can include a memory film 50 and a vertical semiconductor channel 60. In one embodiment, each memory film 50 can include a blocking dielectric layer 52, a memory material layer 54, and a tunneling dielectric layer 56. In one embodiment, each vertical semiconductor channel 60 can include a first semiconductor channel 601 and a second semiconductor channel 602.

The blocking dielectric layer 52 includes a blocking dielectric layer material such as silicon oxide, a dielectric metal oxide (such as aluminum oxide), or a combination thereof. Alternatively, the blocking dielectric layer 52 may be omitted during this processing step and instead be formed through backside recesses as will be described in more detail below. In one embodiment, the memory material layer 54 can be a charge trapping material including a dielectric charge trapping material, which can be, for example, silicon nitride.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed. Each portion of the memory material layer 54 located at the levels of the electrically conductive layers (146, 246).

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. The thickness of the tunneling dielectric layer 56 can be in a range from 2 nm to 20 nm, although lesser and greater thicknesses can also be employed.

A first semiconductor channel layer can be deposited over the memory films 50 by a conformal deposition method such as low pressure chemical vapor deposition (LPCVD). The thickness of the first semiconductor channel layer can be in a range from 2 nm to 10 nm, although lesser and greater thicknesses can also be employed. The first semiconductor channel layer and the memory films 50 can be anisotropically etched to remove horizontal portions thereof. A horizontal bottom portion of each memory film 50 can be removed from the bottom of each memory opening. Each remaining portion of the first semiconductor channel layer constitutes a first semiconductor channel 601. The first semiconductor channels can include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channels 601 can include amorphous silicon or polysilicon. The memory film 50 and the first semiconductor channel 601 are anisotropically etched to remove the memory film 50 and the first semiconductor channel 601 (and layer 13 if present) at the bottom of the memory opening 49 to expose the structures 11, while leaving the memory film 50 and the first semiconductor channel 601 on the sidewalls of the memory opening 49.

A second semiconductor channel layer can be deposited on the first semiconductor channels 601 (i.e., the remaining vertical portions of the first semiconductor channel layer) and on top surface of the epitaxial channel portions 11 (or of the substrate semiconductor layer 10 in case the epitaxial channel portions 11 are not present). The second semiconductor channel layer includes a semiconductor material, which can be any semiconductor material that can be employed for the first semiconductor channel layer. The first and second semiconductor channel layers can have a doping of the first conductivity type (i.e., the same conductivity type as the substrate semiconductor layer 10) or can be substantially intrinsic, i.e., having a dopant concentration that does not exceed $1.0 \times 10^{17}/cm^3$. In one embodiment, the second semiconductor channel layer can include amorphous silicon or polysilicon. The thickness of the second semiconductor channel layer can be in a range from 2 nm to 10 nm, although lesser and greater thicknesses can also be employed.

A dielectric material can be deposited in cavities surrounded by the second semiconductor channel layer, and subsequently recessed below the top surface of the second dielectric tier cap layer 270. Each remaining portion of the dielectric material in the memory openings constitutes a dielectric core 62. A doped semiconductor material having a second conductivity type (which is the opposite of the first conductivity type) can be deposited over the dielectric cores 62 and within the cavities in the memory openings to form drain regions 63. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain region 63. Each remaining portion of the second semiconductor channel layer constitutes a second semiconductor channel 602. A combination of a first semiconductor channel 601 and a second semiconductor channel 602 inside a memory opening constitutes a vertical semiconductor channel 60.

Each memory film 50 can include a blocking dielectric layer 52 contacting a sidewall of the memory opening, a plurality of charge storage regions (embodied as portions of a memory material layer 54 at each level of the sacrificial material layers (142, 242)) located on an inner sidewall of the blocking dielectric layer 52, and a tunneling dielectric layer 56 located inside the plurality of charge storage regions.

Figure 12B:
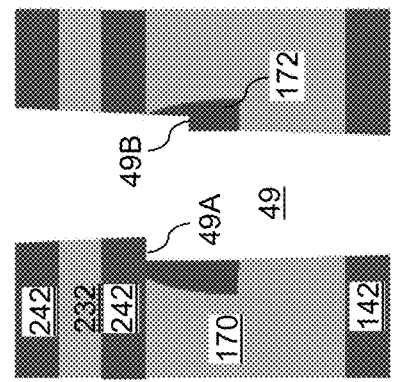
FIG. 12A-12D are sequential vertical cross-sectional views of a joint region during formation of a second memory opening, removal of an underlying sacrificial pillar structure, and formation of a memory stack structure and a dielectric core according to an embodiment of the present disclosure.
Figure 12D:
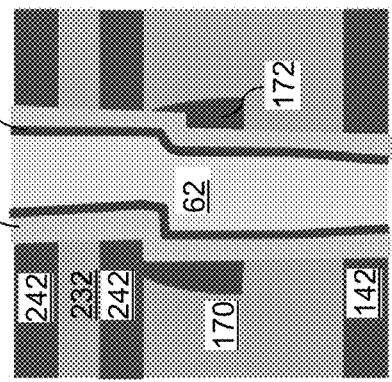
Figure 12A:
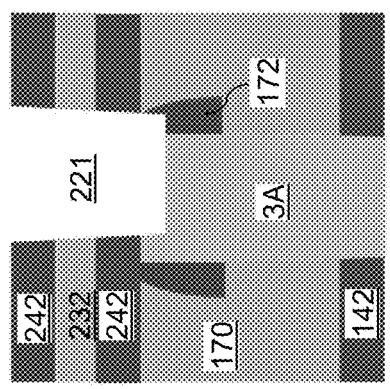

FIGS. 12A-12D illustrate a joint region between the first tier structure (132, 142, 170) and the second tier structure (232, 242, 270) during formation of a second memory opening 221 (corresponding to the processing steps of FIG. 9), removal of an underlying sacrificial pillar structure 3A (corresponding to the processing steps of FIG. 10), and formation of a memory stack structure 55 and a dielectric core 62 (corresponding to the processing steps of FIG. 11), respectively. While FIGS. 9-11 illustrate a configuration in which the overlay variation between the sacrificial pillar structure 3A and the second memory opening 221 is zero, overlay variations that are inherent in the lithographic process that provides the pattern for the second memory openings 221 with respect to the underlying pattern of the sacrificial pillar structures 3A can cause the lateral offset between an underlying sacrificial pillar structure 3A and an overlying second memory opening 221 as illustrated in FIG. 12A. In other words, sidewalls of the underlying sacrificial pillar structure 3A can be laterally offset with respect to sidewalls of the second memory opening 221 that is formed through the second alternating stack (w32, 242). In this case, a first side of the annular spacer 172 can be partly etched during an anisotropic etch that forms the second memory opening 221, and a second side of the annular spacer 172 that faces the first side may not be etched during the anisotropic etch.

Referring to FIG. 12B, the processing steps of FIG. 10 can be performed to form a memory opening 49 that extends through the first tier structure (132, 142, 170) and the second tier structure (232, 242, 270). The memory opening 49 has first horizontal ledge 49A at an interface between the insulating cap layer 170 and the second alternating stack (232, 242), and a second horizontal ledge 49B that contacts a horizontal surface of the annular spacer 172 between a top surface of the annular spacer 172 and a bottom surface of the annular spacer 172.

Figure 12C:
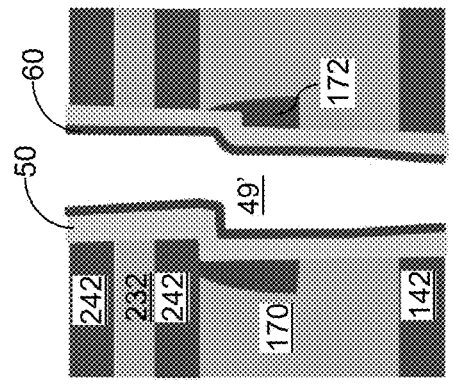

Referring to FIGS. 12C and 12D, the processing steps of FIG. 11 can be performed to form a memory film 50, a vertical semiconductor channel 60, and a dielectric core 62. In the first exemplary structure illustrated in FIGS. 11 and 12D, the memory film 50 is formed inside a remaining portion of the annular spacer 172 within each memory opening 49.

Figure 13:
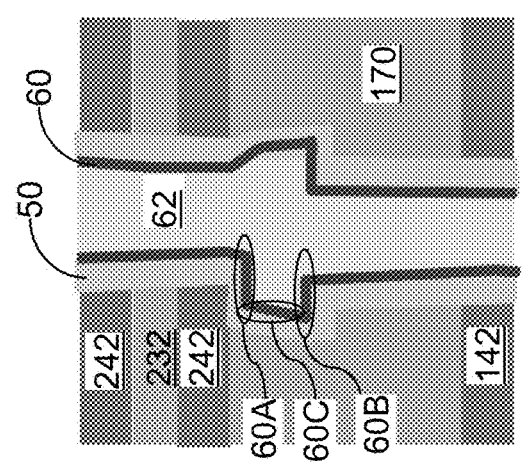
FIG. 13 is a vertical cross-sectional view of a reference structure for comparison with the first exemplary structure according to an embodiment of the present disclosure.

Referring to FIG. 13, a reference structure is illustrated for comparison with the first exemplary structure of embodiments of the present disclosure. The reference structure can be derived from the first exemplary structure of FIG. 12A by removing the annular spacers 172 concurrently with removal of the sacrificial pillar structure 3A. In that case, substantially horizontal portions (60A, 60B) of the semiconductor channel 60 can face each other in the memory opening. Portions 60A, 60B are connected by a substantially vertical portion 60C which together form a convex portion of the semiconductor channel 60 which bows in an outward direction from the dielectric fill 62. The convex portion (60A, 60B, 60C) increases the channel 60 resistance, decreases cell current and increases electric field concentration. By not removing the annular spacer 172 and depositing the memory film 50 on the inner sidewalls of the annular spacer 172 in each memory opening 49, as shown in FIG. 12D, decreases the channel 60 resistance, increases cell current and decreases electric field concentration.

Figure 14:
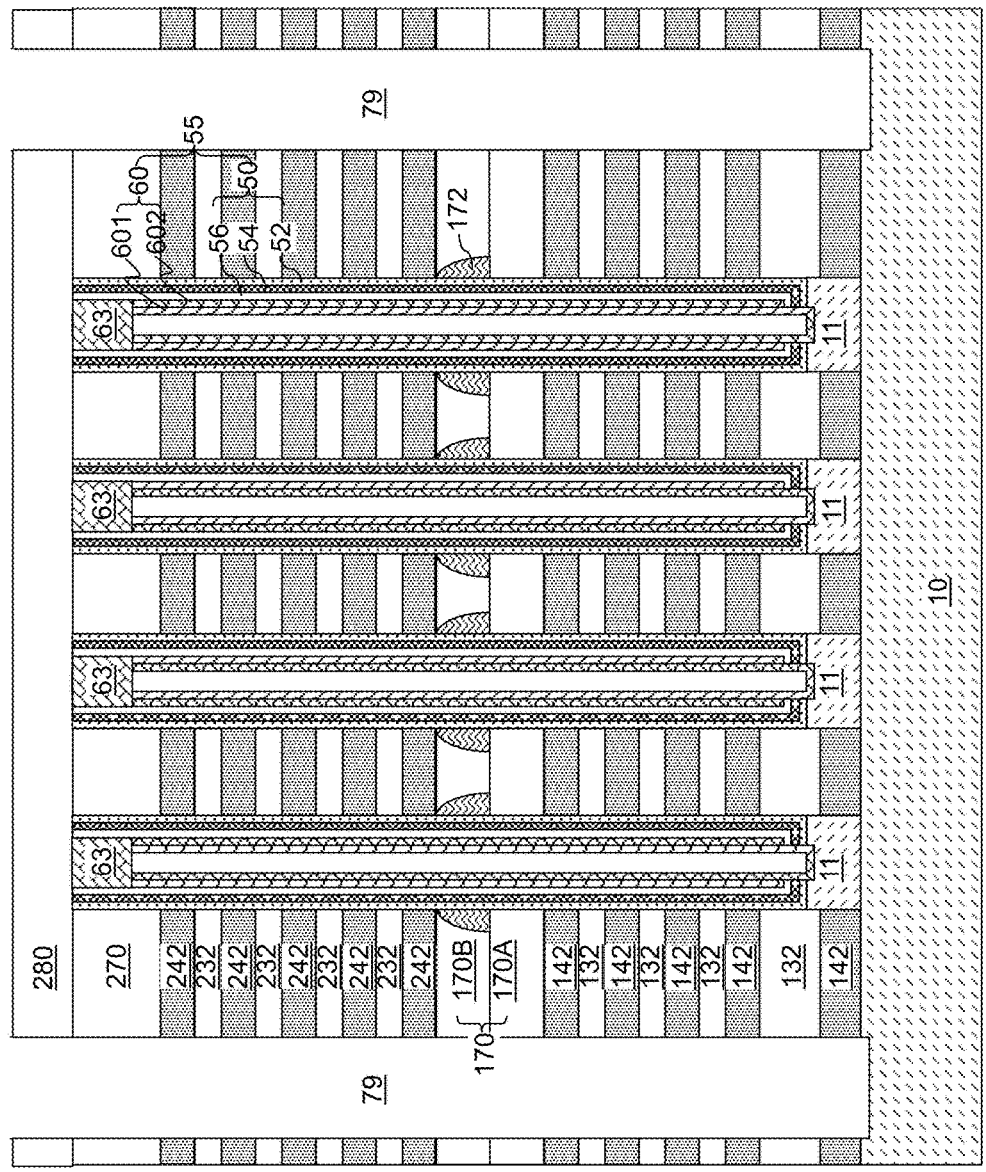
FIG. 14 is a vertical cross-sectional view of the first exemplary structure after formation of backside trenches according to an embodiment of the present disclosure.

Referring to FIG. 14, a planarization material layer 280 can be formed over the second insulating cap layer 270. The planarization material layer 280 may be selected as an in-process structure that is consumed during subsequent planarization processes. In one embodiment, the planarization material layer 280 can include a silicon oxide material deposited by chemical vapor deposition such as tetraethylorthosilicate (TEOS) silicon oxide. The thickness of the planarization material layer 280 can be in a range from 50 nm to 300 nm, although lesser and greater thicknesses can also be employed.

At least one backside trench 79 can be formed through the upper and first tier structures, for example, by applying a photoresist layer (not shown), lithographically patterning the photoresist layer, and transferring the pattern in the photoresist layer through the upper and first tier structures employing an anisotropic etch. The anisotropic etch that forms the at least one backside trench 79 can stop on the substrate 10. The photoresist layer can be subsequently removed, for example, by ashing.

Figure 15:
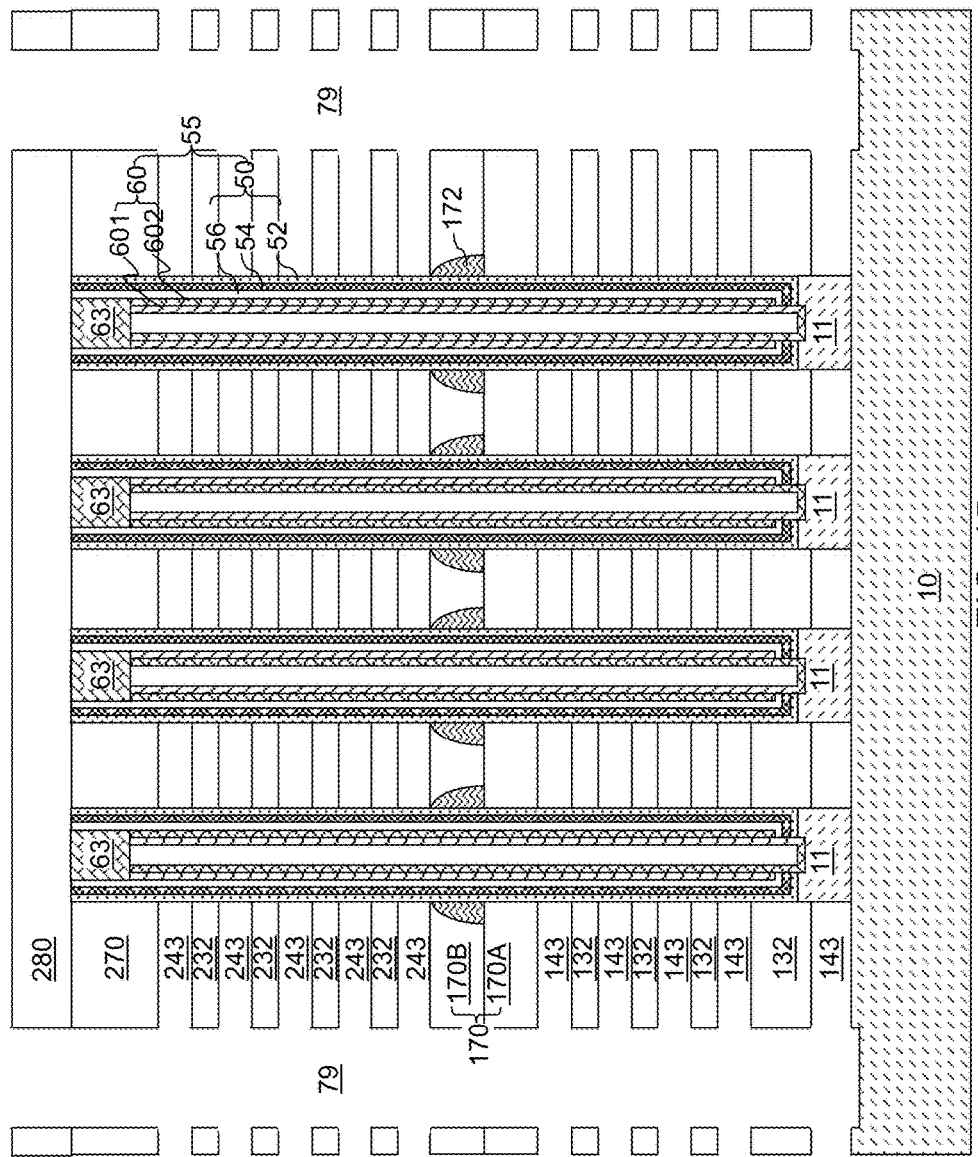
FIG. 15 is a vertical cross-sectional view of the first exemplary structure after formation of backside recesses by removal of the sacrificial material layers according to an embodiment of the present disclosure.

Referring to FIG. 15, an etchant that selectively etches the materials of the first and second sacrificial material layers (142, 242) with respect to the materials of the first and second insulating layers (132, 232), the material of the dielectric oxide layer 51L, and the first and second insulating cap layers (170, 270) can be introduced into the backside trench 79, for example, employing an isotropic etch process. First backside recesses 143 are formed in volumes from which the first sacrificial material layers 142 are removed. Second backside recesses 243 are formed in volumes from which the second sacrificial material layers 242 are removed. The removal of the materials of the first and second sacrificial material layers (142, 242) can be selective to the materials of the first and second insulating layers (132, 232), and the material of the dielectric oxide layer 51L. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 10. A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

In one embodiment, a sidewall surface of each epitaxial channel portion 11 and a top surface of a semiconductor material layer in the substrate (i.e., the substrate semiconductor layer 10) can be physically exposed below the bottommost first backside recess 143 after removal of the first and second sacrificial material layers (142, 242).

Figure 16:
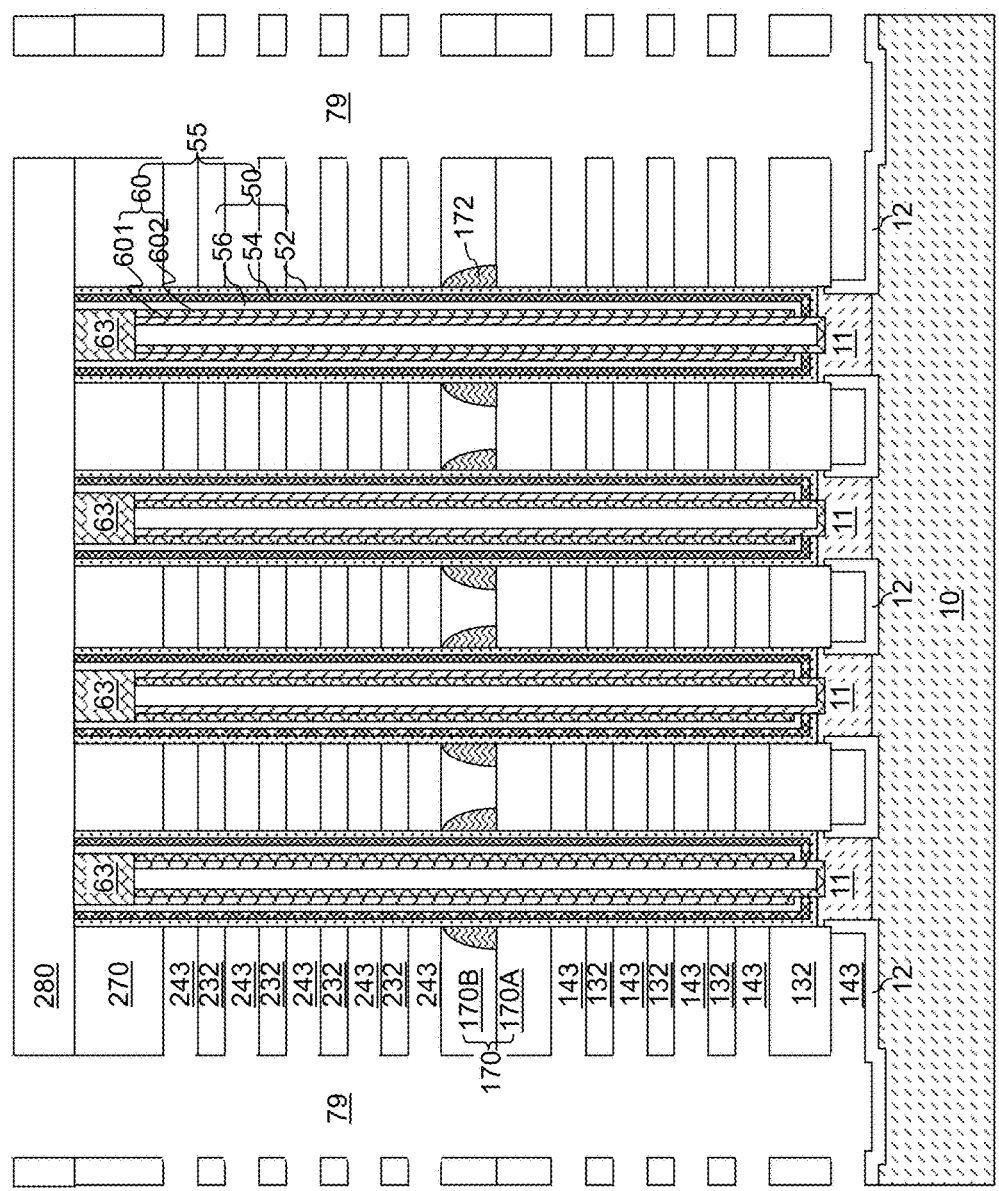
FIG. 16 is a vertical cross-sectional view of the first exemplary structure after formation of a gate dielectric layer according to an embodiment of the present disclosure.

Referring to FIG. 16, a gate dielectric layer 12 can be formed by converting surface portions of the epitaxial channel portions 11 and the semiconductor material layer (the substrate semiconductor layer 10) into a continuous dielectric material layer. In one embodiment, the gate dielectric layer 12 can be formed by thermal conversion of the surface portions of the epitaxial channel portions 11 and the substrate semiconductor layer 10. In one embodiment, the thermal conversion process can include a thermal oxidation process and/or a thermal nitridation process. In one embodiment, the gate dielectric layer 12 can include a thermal oxide of the semiconductor material of the substrate semiconductor layer 10. The gate dielectric layer 12 can be formed as a single continuous layer.

Figure 17:
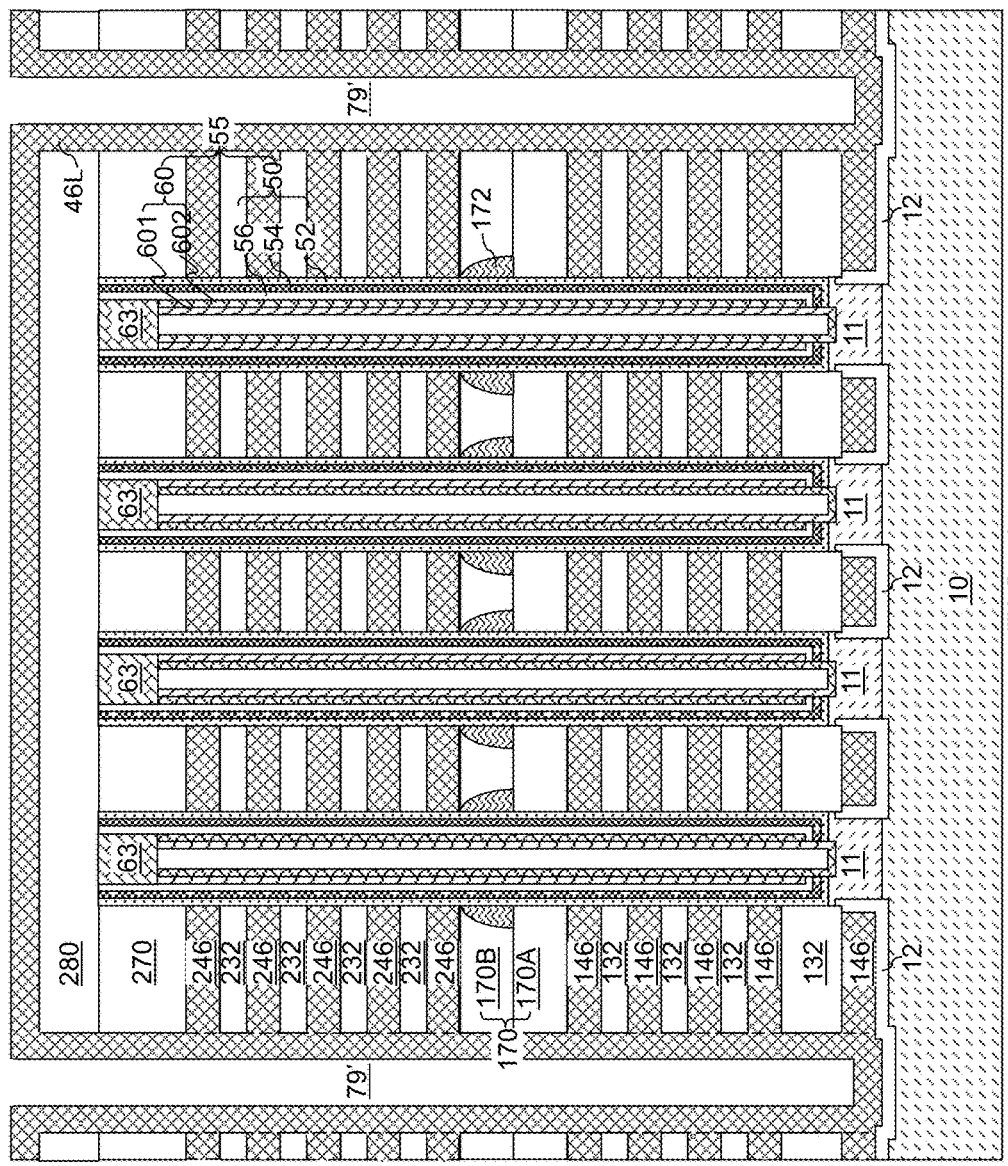
FIG. 17 is a vertical cross-sectional view of the first exemplary structure after formation of electrically conductive layers according to an embodiment of the present disclosure.

Referring to FIG. 17, a backside blocking dielectric layer (not shown) can be optionally deposited in the backside recesses (143, 243) and the backside trenches 79 and over the planarization dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (143, 243), on the sidewalls of the backside trench 79, and over the planarization dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer 46L can be formed on the sidewalls of each backside trench 79 and over the planarization dielectric layer 280. In embodiments in which the first spacer material layers and the second spacer material layers are provided as first sacrificial material layers 142 and second sacrificial material layers 242, the first and second sacrificial material layers (142, 242) can be replaced with the first and second conductive material layers (146, 246), respectively. Specifically, each first sacrificial material layer 142 can be replaced with a portion of the backside blocking dielectric layer and a first electrically conductive layer 146, and each second sacrificial material layer 242 can be replaced with a portion of the backside blocking dielectric layer and a second electrically conductive layer 246. A backside cavity is present in the portion of each backside trench 79 that is not filled with the continuous metallic material layer 46L.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses (143, 243) can be a combination of titanium nitride layer and a tungsten fill material. In one embodiment, the metallic material can be deposited by chemical vapor deposition or atomic layer deposition.

Figure 18:
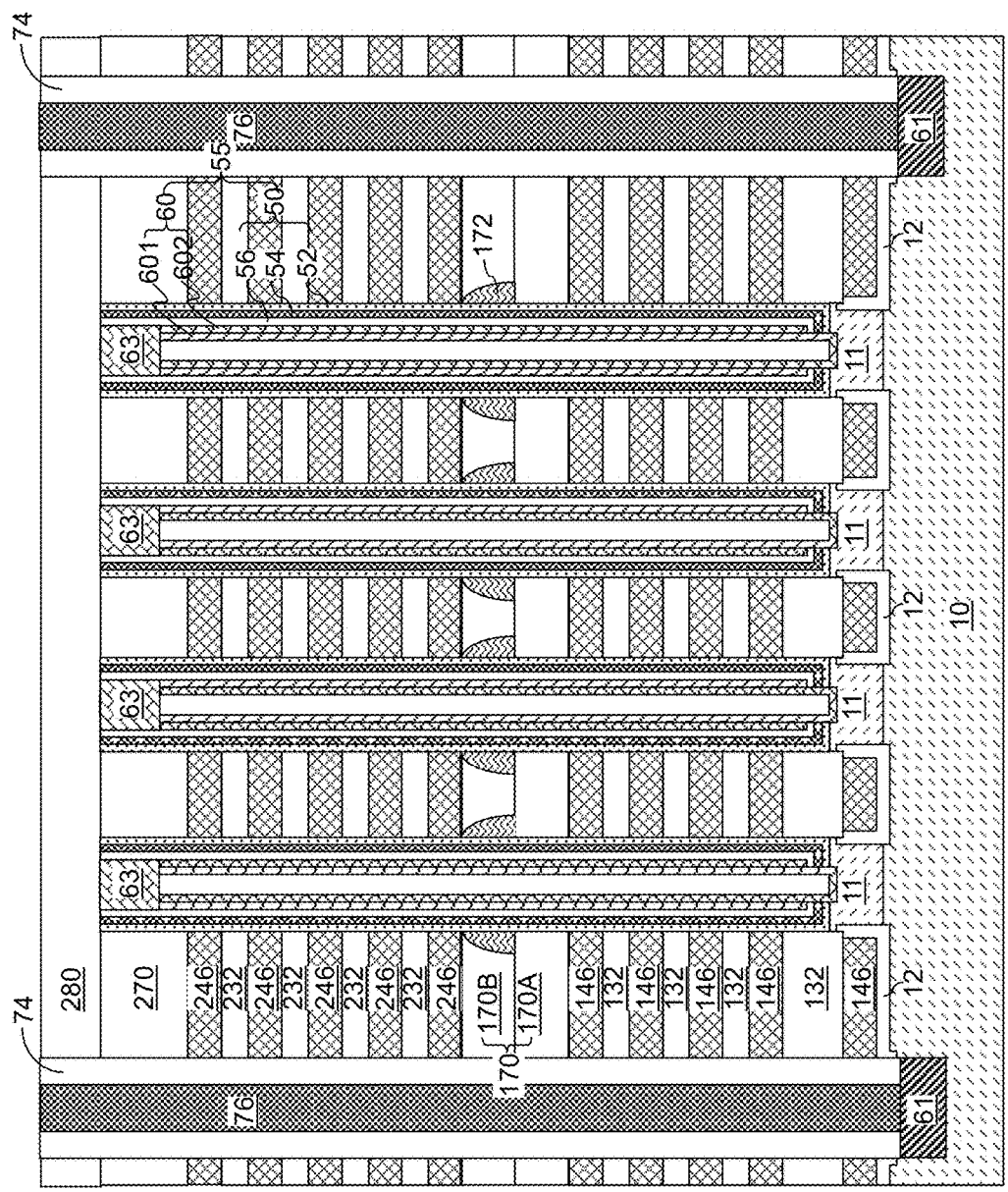
FIG. 18 is a vertical cross-sectional view of the first exemplary structure after removal of residual materials from the backside trenches, formation of source regions, and formation of insulating spacers and backside contact structures according to an embodiment of the present disclosure.

Referring to FIG. 18, residual material can be removed from each backside trench 79. Specifically, the deposited metallic material of the continuous metallic material layer 46L can be etched back from the sidewalls of each backside trench 79 and from above the planarization dielectric layer 280, for example, by an isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each electrically conductive layer (146, 246) can be a conductive line structure.

Each electrically conductive layer (146, 246) except the bottommost electrically conductive layer (i.e., the bottommost first electrically conductive layer 146) can function as a combination of a plurality of control gate electrodes located at a same level and a word line electrically interconnecting, i.e., electrically shorting, the plurality of control gate electrodes located at the same level. The control gate electrodes within each electrically conductive layer (146, 246) are the control gate electrodes for a vertical memory device including the memory stack structure 55.

The bottommost first electrically conductive layer 146 can be a source select gate electrode located over the gate dielectric layer 12, which can control activation of a horizontal channel portion of a semiconductor channel that extends between a source region 61 (which is previously formed or which will be subsequently formed underneath each backside trench 79) and drain regions 63. In one embodiment, the backside blocking dielectric layer may be present as a single continuous material layer. In another embodiment, the vertical portions of the backside blocking dielectric layer may be removed from within the backside trenches 79, and the backside blocking dielectric layer can have a plurality of physically disjoined backside blocking dielectric layer portions that are located at each level of the electrically conductive layers (146, 246).

Dopants of a second conductivity type, which is the opposite of the first conductivity type of the substrate semiconductor layer 10, can be implanted into a surface portion of the substrate semiconductor layer 10 to form a source region 61 underneath the bottom surface of each backside trench 79. An insulating spacer 74 including a dielectric material can be formed at the periphery of each backside trench 79, for example, by deposition of a conformal insulating material (such as silicon oxide) and a subsequent anisotropic etch. The planarization dielectric layer 280 may be thinned due to a collateral etch during the anisotropic etch that removes the vertical portions of horizontal portions of the deposited conformal insulating material.

A backside contact via structure 76 can be formed in the remaining volume of each backside trench 79, for example, by deposition of at least one conductive material and removal of excess portions of the deposited at least one conductive material from above a horizontal plane including the top surface of the planarization dielectric layer 80 by a planarization process such as chemical mechanical planarization or a recess etch. Optionally, each backside contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside trenches 79 and removing the deposited doped semiconductor material from upper portions of the backside trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the planarization dielectric layer 280. The planarization dielectric layer 280 can be thinned and removed during a latter part of the planarization process, which may employ chemical mechanical planarization (CMP), a recess etch, or a combination thereof. Each backside contact via structure 76 can be formed through the at least one tier structure (132, 146, 232, 246) and on a source region 61, which may be a source region. The top surface of each backside contact via structure 76 can be formed within the horizontal plane that includes the top surfaces of the memory stack structures 55.

Figure 19:
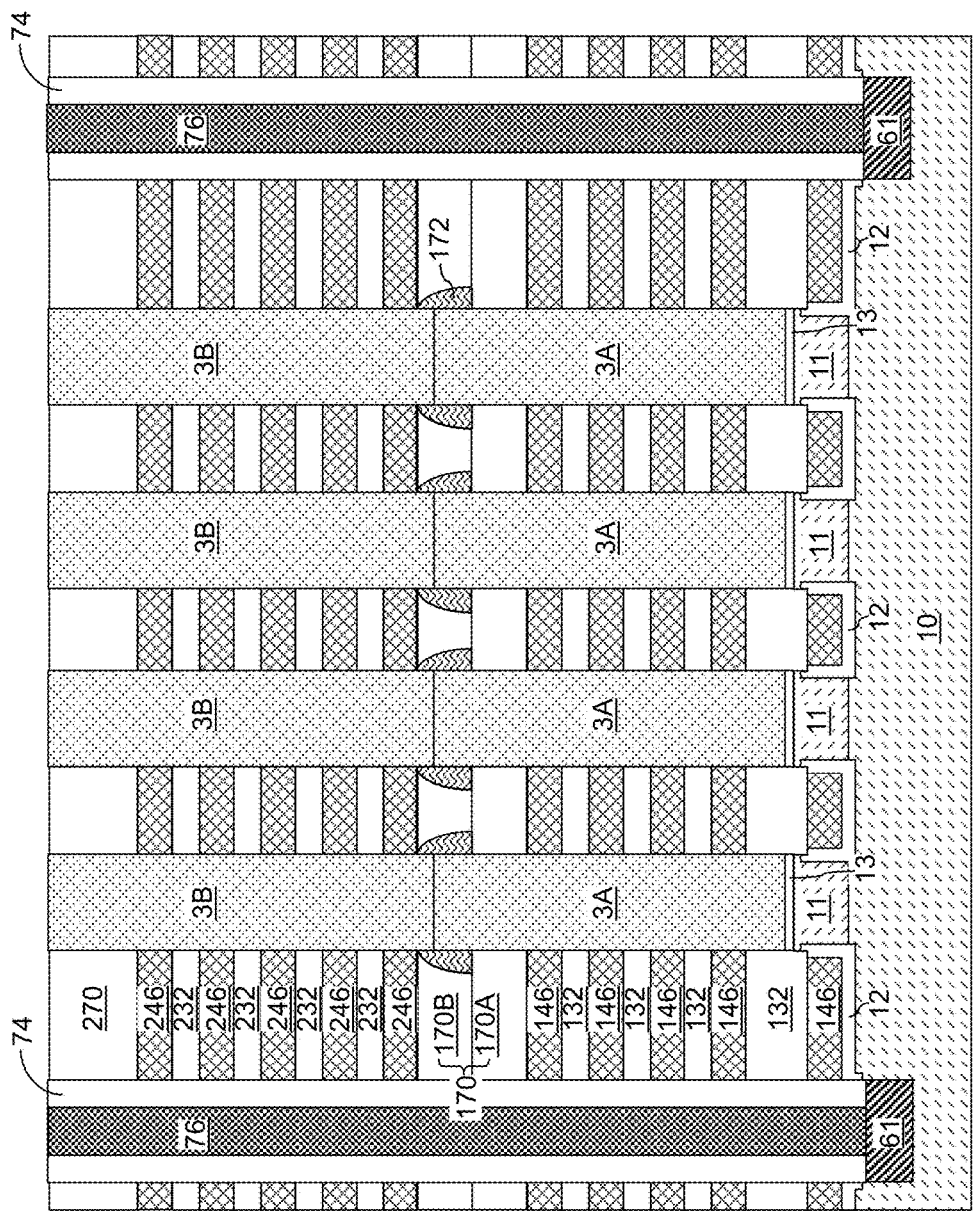
FIG. 19 is vertical cross-sectional view of an alternate embodiment of the first exemplary structure after formation of upper sacrificial pillar structures and backside contact structures according to an embodiment of the present disclosure.

Referring to FIG. 19, an alternate embodiment of the first exemplary structure can be derived from the first exemplary structure of FIG. 9 by forming upper sacrificial pillar structures 3B in the second memory openings 221. The sacrificial pillar structures 3A underlying the upper sacrificial pillar structures are herein referred to as lower sacrificial pillar structures. The upper sacrificial pillar structures 3B can include any material that may be employed for the lower sacrificial pillar structures 3A as described above. The upper sacrificial pillar structures 3B may include the same material as, or may include a material different from, the lower sacrificial pillar structures 3A. For example, the upper and lower sacrificial pillar structures (3A, 3B) can include polycrystalline or amorphous undoped silicon. Each adjoining pair of a lower sacrificial pillar structure 3A and an upper sacrificial pillar structure 3B constitutes a pillar structure stack (3A, 3B).

The processing steps of FIGS. 14-18 can be performed to form electrically conductive layers (146, 246), source regions 61, insulating spacers 74, and backside contact via structures 76. While the illustrated embodiment corresponds to a case in which the second insulating cap layer 280 is not employed or is thinned and removed, embodiments are expressly contemplated herein, in which the second insulating cap layer 280 is present after the processing steps of FIG. 19.

Figure 20:
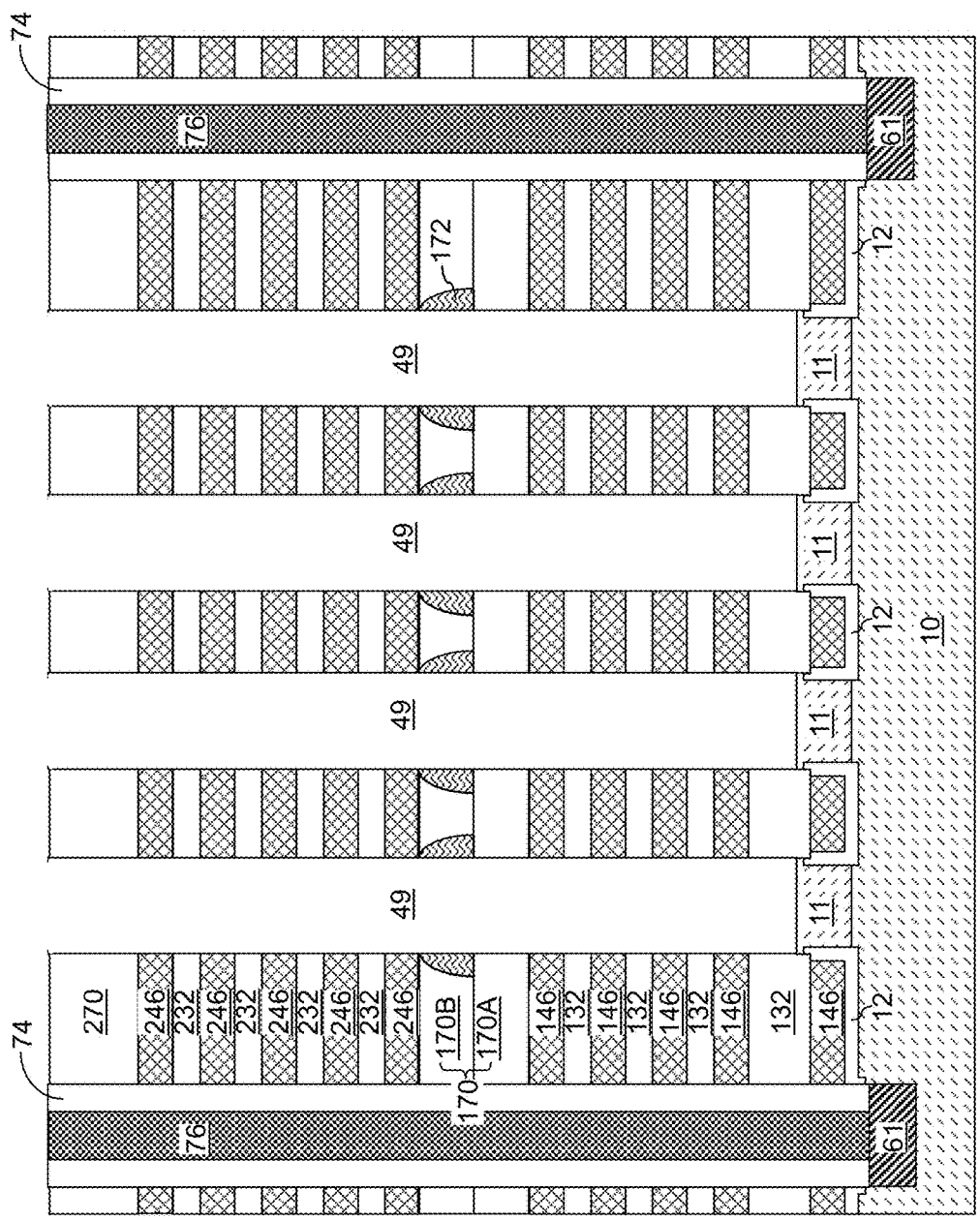
FIG. 20 is a vertical cross-sectional view of the alternate embodiment of the first exemplary structure after removal of the sacrificial pillar structures according to an embodiment of the present disclosure.

Referring to FIG. 20, the pillar structure stacks (3A, 3B) can be removed selective to the annular spacers 172, the first and second insulating layers (132, 142), the first and second electrically conductive layers (146, 246), the first and second insulating cap layers (170, 270), and the epitaxial channel portions 11. The same etch chemistry can be employed as the etch chemistry employed at the processing steps of FIG. 10.

In one embodiment, removal of the pillar structure stacks (3A, 3B) can be performed selective to the annular spacers 172 employing an etch chemistry that provides differential etch rates that depend on the concentration of electrical dopants. In one embodiment, the pillar structure stacks (3A, 3B) can include a first semiconductor material that does not include electrical dopants or includes electrical dopants at an atomic concentration less than $1.0 \times 10^{17}/cm^3$, and the annular spacers 172 can include a second semiconductor material that includes electrical dopants at an atomic concentration greater than $1.0 \times 10^{18}/cm^3$. In one embodiment, the pillar structure stacks (3A, 3B) can include amorphous or polycrystalline silicon that does not include electrical dopants or includes electrical dopants at an atomic concentration less than $1.0 \times 10^{17}/cm^3$, the annular spacers 172 can include amorphous or polycrystalline silicon that includes electrical dopants at an atomic concentration greater than $1.0 \times 10^{18}/cm^3$, and removal of the pillar structure stacks (3A, 3B) selective to the annular spacers 172 can be performed employing hot trimethyl-2 hydroxyethyl ammonium hydroxide.

Figure 21:
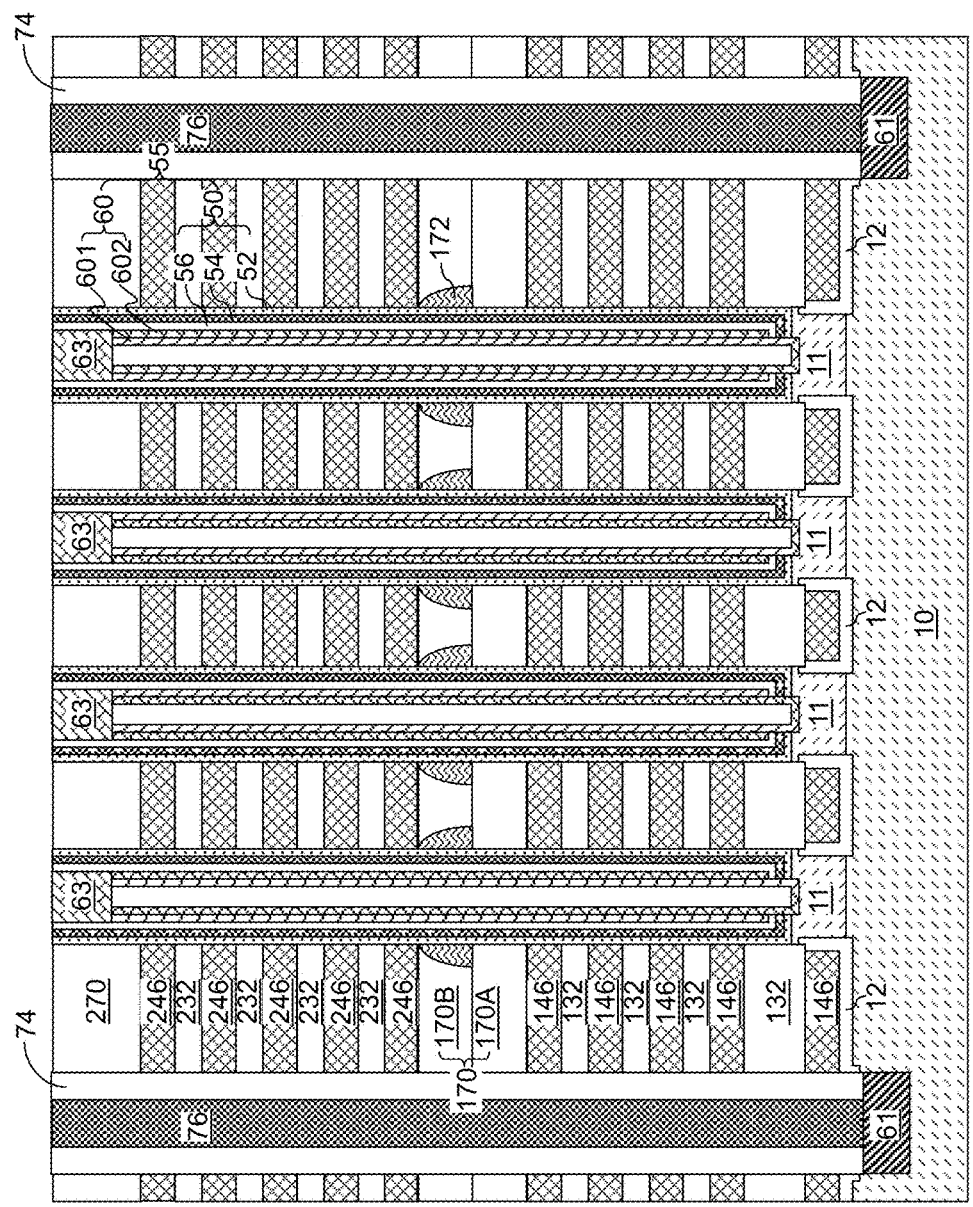
FIG. 21 is a vertical cross-sectional view of the alternate embodiment of the first exemplary structure after formation of memory stack structures, dielectric cores, and drain regions according to an embodiment of the present disclosure.

Referring to FIG. 21, the processing steps of FIG. 11 can be performed to form memory stack structures 55, dielectric cores 62, and drain regions 63. The first exemplary structures illustrated in FIGS. 18 and 21 can include a monolithic three-dimensional memory device. The monolithic three-dimensional memory device can include a first alternating stack of first insulating layers 132 and first electrically conductive layers 146 located over a top surface of a substrate 10; an insulating cap layer 270 overlying the first alternating stack (132, 146); a second alternating stack located over the insulating cap layer 170 and comprising a second alternating stack of second insulating layers 232 and second electrically conductive layers 246; a memory opening extending through the second alternating stack (232, 246), the insulating cap layer 170, and the firsts tier structure (132, 146); a memory stack structure 55 located within the memory opening and comprising a memory film 50 including a plurality of charge storage regions (as embodied as portions of the memory material layer 54) located at the levels of the electrically conductive layers (146, 246); and an annular spacer 172 located within the insulating cap layer 170 and laterally surrounding the memory stack structure 55.

In one embodiment, an inner sidewall of the annular spacer 172 contacts a portion of an outer sidewall of the memory film 50. In one embodiment, a bottom surface of the annular spacer 172 is vertically spaced from a bottom surface of the insulating cap layer 170. In one embodiment, the annular spacer 172 has a horizontal bottom surface and a tapered sidewall surface. In one embodiment, the insulating cap layer 170 can comprise a first insulating cap layer 170A having a top surface that is coplanar with a bottom surface of the annular spacer 172, and a second insulating cap layer 170B having a top surface that is coplanar with a topmost surface of the annular spacer 172. In one embodiment, the annular spacer 172 can comprise a doped semiconductor material.

In one embodiment, the memory opening 49 can have a first horizontal ledge 49A at an interface between the insulating cap layer 170 and the second alternating stack (232, 246), and a second horizontal ledge 49B that contacts a horizontal surface of the annular spacer 172 between a top surface of the annular spacer 172 and a bottom surface of the annular spacer 172, as illustrated in FIG. 12B. The first and second horizontal ledges (49A, 49B) extend substantially parallel to the top surface of the substrate 10, and the second horizontal ledge 49B is located closer to the top surface of the substrate 10 than the first horizontal ledge 49A. In one embodiment, first sidewalls of the memory opening 49 located in a lower portion of the insulating cap layer 170 (e.g., in layer 170A) can be laterally offset with respect to second sidewalls of the memory opening located in the upper portion of the insulating cap layer (e.g., in layer 170B) and in the second alternating stack (232, 246), which is derived from the structure of FIG. 12D by replacement of the sacrificial material layers (142, 242) with electrically conductive layers (146, 246). In one embodiment, one of the first sidewalls of the memory opening 49 can extend to a horizontal plane including an interface (e.g., ledge 49A in FIG. 12B) between the insulating cap layer 170 and the second alternating stack (232, 246), and one of the second sidewalls of the memory opening 49 can extend into a middle portion of the annular spacer 172 at ledge 49B, as illustrated in FIG. 12B. The memory film 50 has the same contour as the memory opening 49.

According to another aspect of the present disclosure, a second exemplary structure according to an embodiment of the present disclosure can be derived from the first exemplary structure of FIG. 4 by performing a set of etch steps at least twice, such as twice, three times, four times, etc. The set of etch steps includes a recess etch step that vertically recesses the top surfaces of sacrificial material portions (such as the sacrificial pillar structures 3A as provided at the processing step of FIG. 4) downward, and an isotropic etch step that isotropically etches the material of the insulating cap layer 170A selective to the sacrificial material portions. After performing the set of etch steps at least twice, each remaining portion of the sacrificial pillar structures 3A constitutes a sacrificial pillar structure 3A.

Figure 22:
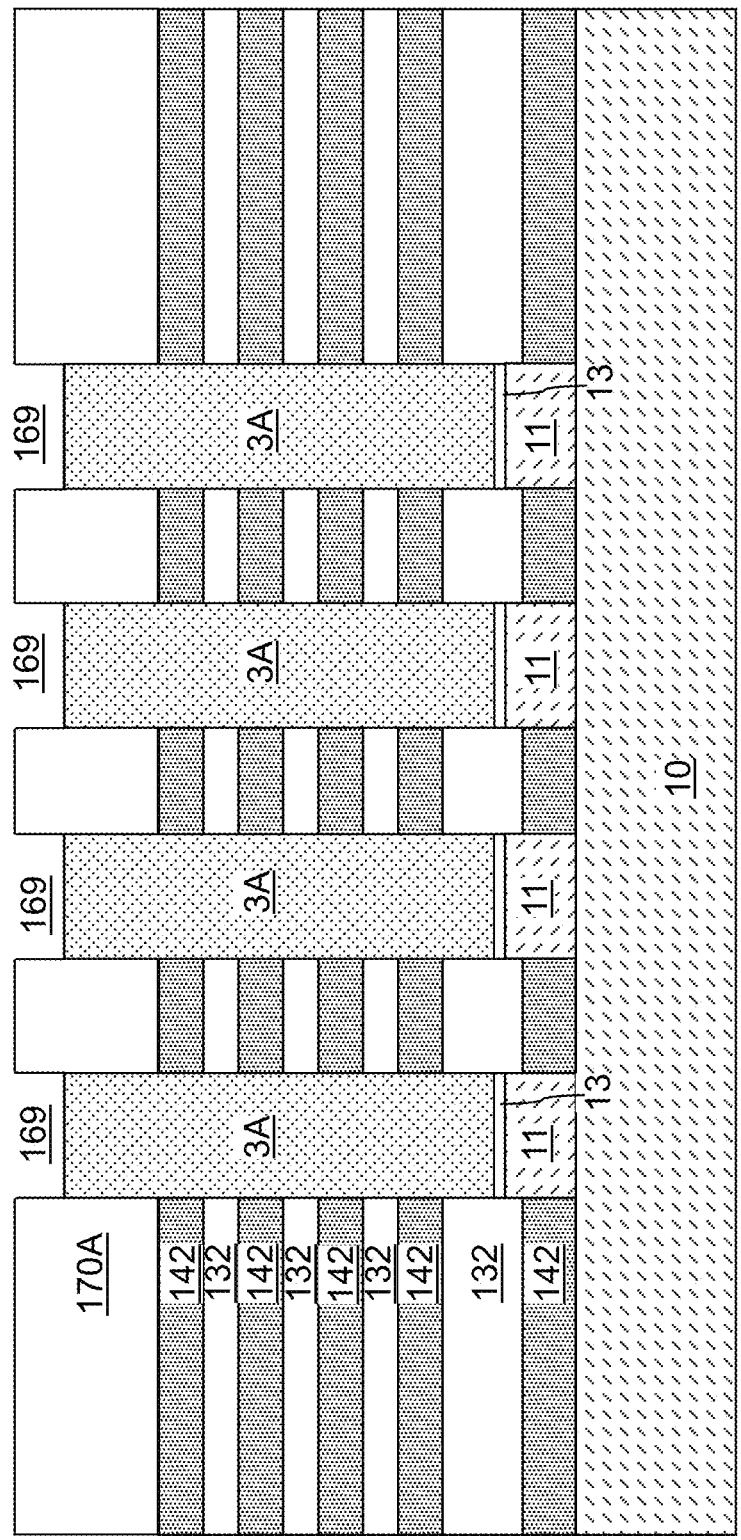
FIG. 22 is a vertical cross-sectional view of a second exemplary structure after formation of sacrificial pillar structures according to an embodiment of the present disclosure.

Exemplary implementation of the set of etch steps twice is illustrated in FIGS. 22-25. Referring to FIG. 22, the sacrificial pillar structures 3A in the first exemplary structure of FIG. 4 are vertically recessed such that the recessed top surfaces of the sacrificial pillar structures 3A are located between a first horizontal plane including the top surface of the first insulating cap layer 170A and a second horizontal plane including the bottom surface of the first insulating cap layer 170A. A recess region 169 is formed above each recessed top surface of the sacrificial pillar structures 3A. Each recess region 169 can have a substantially vertical sidewall having a top periphery and a bottom periphery that are congruent. The sacrificial pillar structures 3A are sacrificial material portions that are subsequently removed selective to the first alternating stack (132, 142) and the first insulating cap layer 170A.

Figure 23:
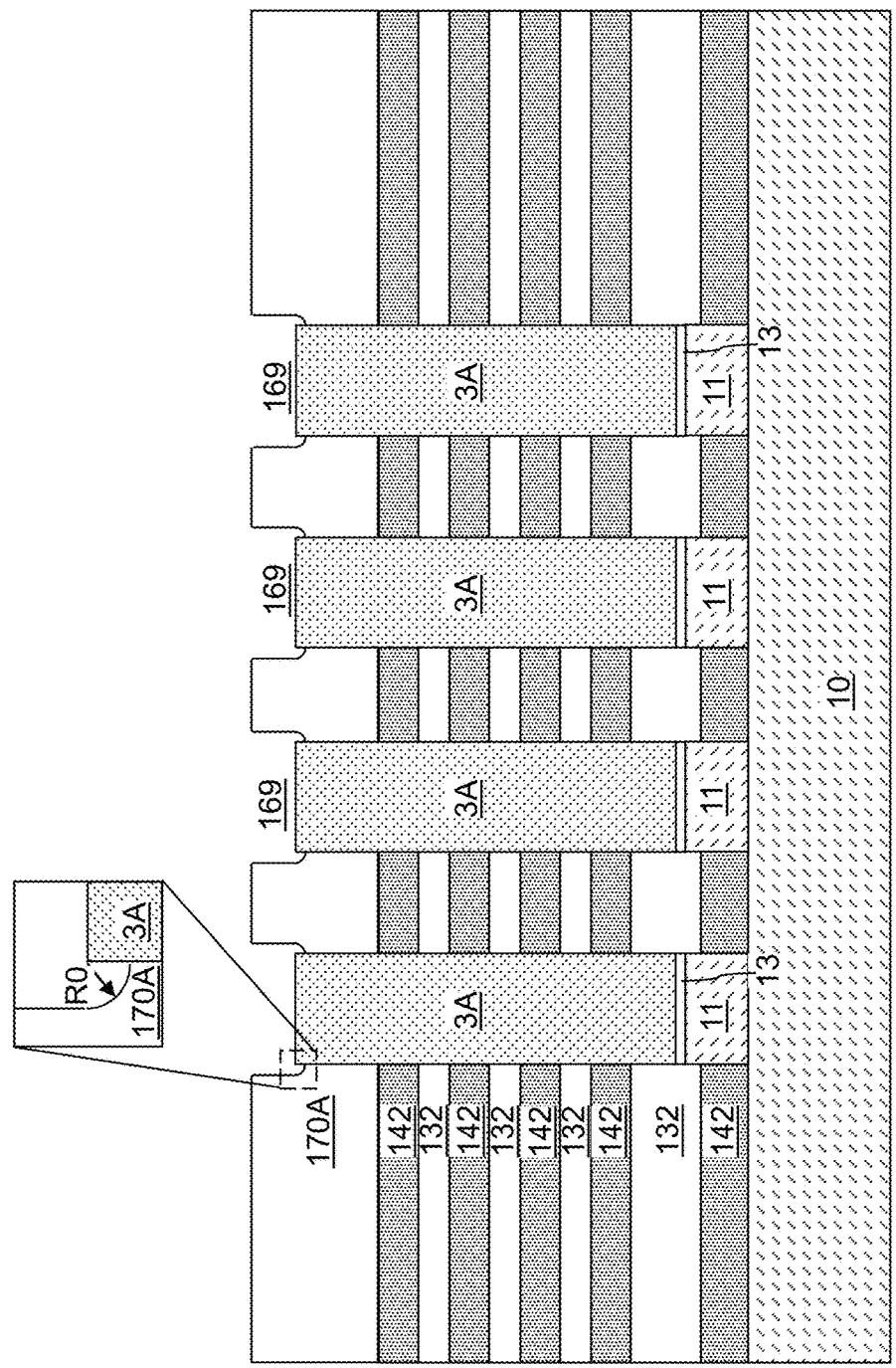
FIG. 23 is a vertical cross-sectional view of the second exemplary structure after a first isotropic etch process that etches a first insulating cap layer according to an embodiment of the present disclosure.

Referring to FIG. 23, a first isotropic etch process is performed, which etches the material of the first insulating cap layer 170A selective to the sacrificial material portions (i.e., the sacrificial pillar structures 3A). The volume of each recess region 169 can be expanded by etching the material of the first insulating cap layer 170A selective to the sacrificial pillar structures 3A. Each recess region 169 can have a vertical surface adjoined by a concave surface having an initial radius of curvature R0 due to the isotropic nature of the first isotropic etch process. In one embodiment, the foci of the center of radius of curvature of the concave surfaces can coincide with the peripheral edge of the top surface of each sacrificial pillar structure 3A. The processing steps of FIGS. 22 and 23 collectively correspond to one instance of implementation of the set of etch steps, such as wet etching steps using dilute hydrofluoric acid to selectively etch silicon oxide material of layer 170A. If layer 170A comprises material other than silicon oxide, then another etching fluid may be used to selectively etch layer 170A.

Figure 24:
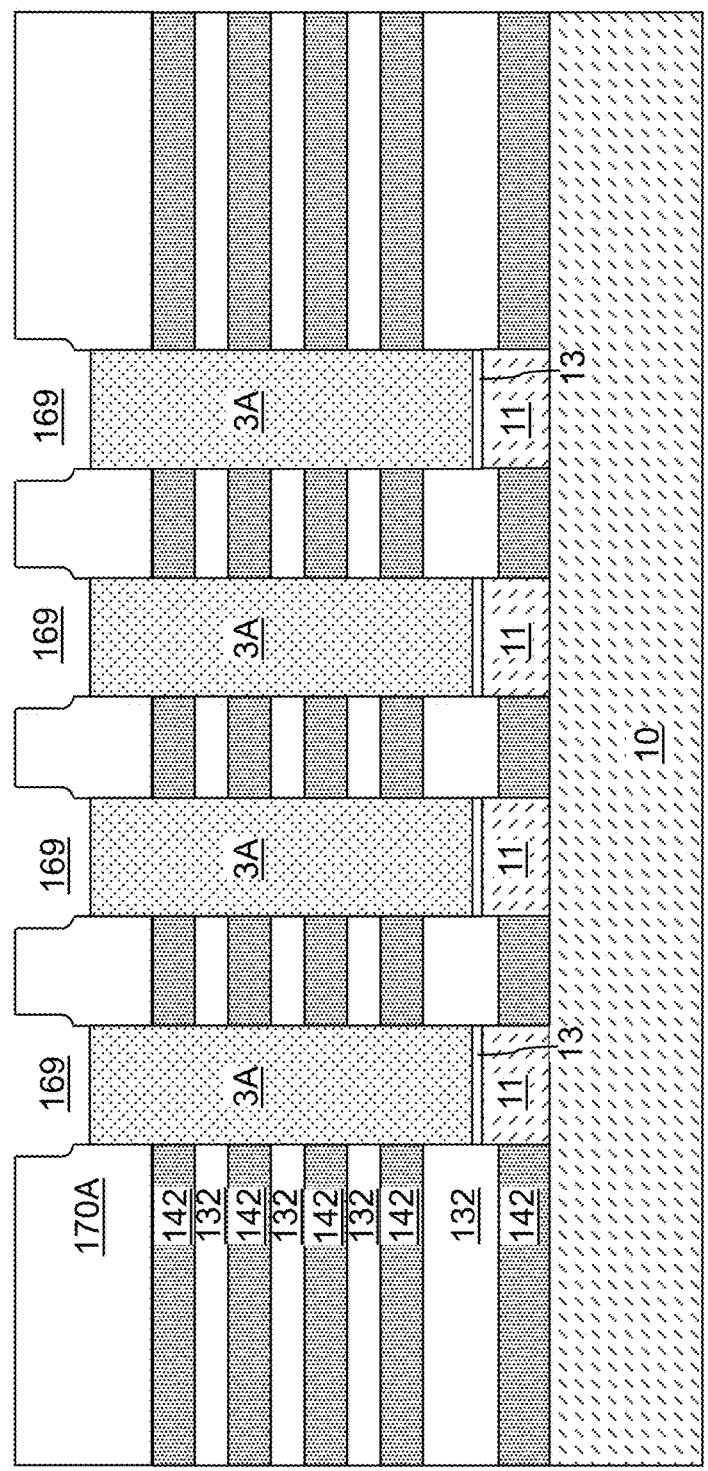
FIG. 24 is a vertical cross-sectional view of the second exemplary structure after recessing the sacrificial pillar structures according to an embodiment of the present disclosure.

Referring to FIG. 24, the sacrificial pillar structures 3A are vertically recessed selective to the dielectric material of the first insulating cap layer 170A. The recessed top surfaces of the sacrificial pillar structures 3A are located above the horizontal plane including the bottom surface of the first insulating cap layer 170A. Each recessed top surfaces of the sacrificial pillar structures 3A may be located below a peripheral bottom edge of the concave surfaces of the overlying recess region 169. A selective dry or wet etch may be used to selectively etch back the material of structures 3A (e.g., amorphous silicon) compared to the insulating materials of layers 132, 142 and 170A.

Figure 25:
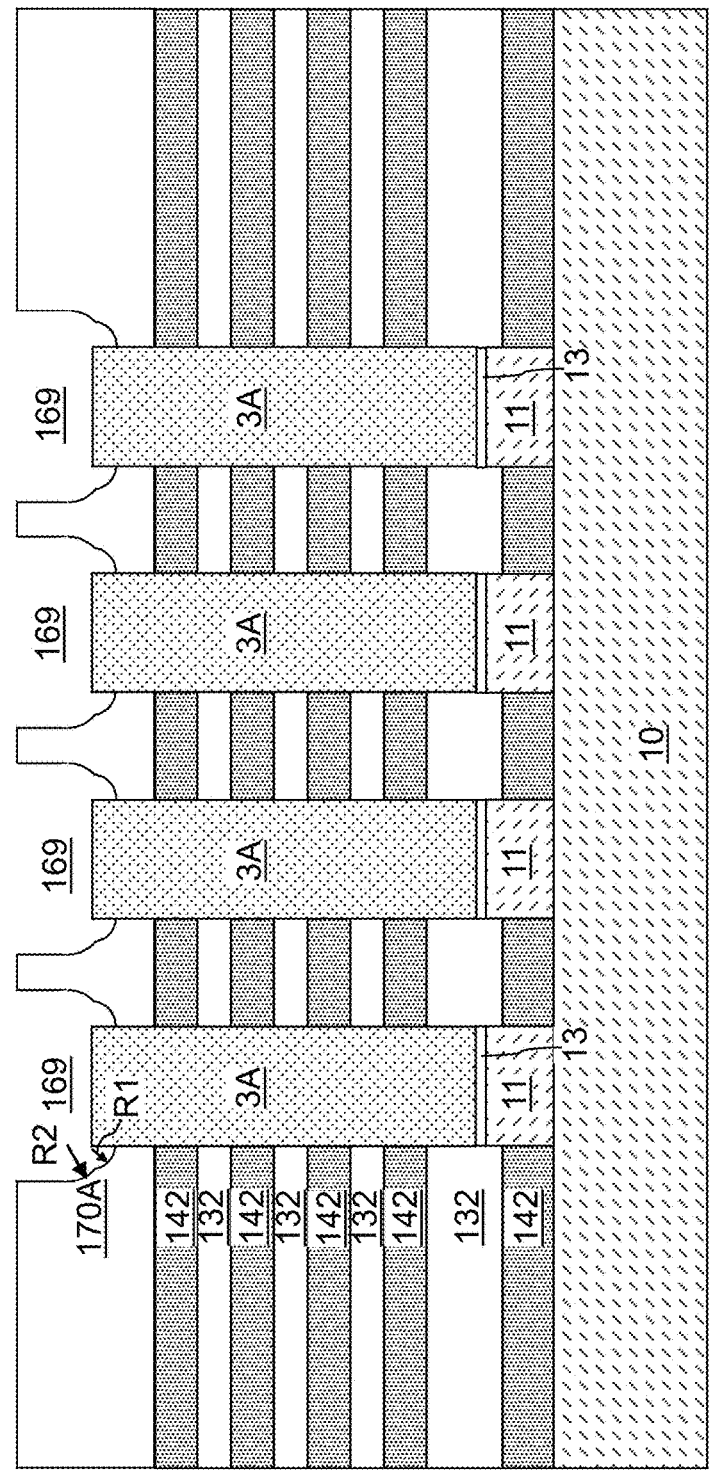
FIG. 25 is a vertical cross-sectional view of the second exemplary structure after a second isotropic etch process that etches the first insulating cap layer according to an embodiment of the present disclosure.

Referring to FIG. 25, a second isotropic etch process is performed, which etches the material of the first insulating cap layer 170A selective to the sacrificial material portions (i.e., the sacrificial pillar structures 3A). The volume of each recess region 169 can be expanded by etching the material of the first insulating cap layer 170A selective to the sacrificial pillar structures 3A. Each recess region 169 can have a first concave surface having a first radius of curvature R1 and adjoined to a sidewall of an underlying sacrificial pillar structure 3A, a second concave surface having a second radius of curvature R2 and adjoined to a top periphery of the first concave surface, and a vertical sidewall adjoined to a top periphery of the second concave surface. For each recess region 169, the foci of the center of first radius of curvature R1 of the first concave surface can coincide with the peripheral edge of the top surface of each sacrificial pillar structure 3A. The processing steps of FIGS. 24 and 25 collectively correspond to another instance of implementation of the set of etch steps. The second radius of curvature R2 can be the same as the sum of the initial radius of curvature R0 and the first radius of curvature due to the isotropic nature of the second isotropic etch. The net etch distance for the vertical sidewalls can be the same as the first radius of curvature R1. The foci of the second radius of curvature R2 can coincide with the foci of the initial radius of curvature R0 because the second isotropic etch proceeds isotropically by a distance that is equal to the first radius of curvature R1.

Optionally, the processing steps of FIGS. 24 and 25 can be repeated once or a plurality of times. As illustrated in FIGS. 22-25, each recess region 169 can be formed by expanding a first memory opening 121 within the first insulating cap layer 170A by performing the set of etch steps at least twice. Thus, the set of etch steps is performed at least twice through the processing steps of FIGS. 22-25 and any additional repetitions of the processing steps of FIGS. 24 and 25. The set of etch steps includes a recess etch step that vertically recesses the top surface of each sacrificial material portion (i.e., each sacrificial pillar structure 3A) downward; and an isotropic etch step that isotropically etches the material of the first insulating cap layer 170A selective to the sacrificial material portions.

At least two concave sidewalls are formed around each recess region 169, which is a portion of the volume of the expanded first memory opening 121. In one embodiment, the at least two concave sidewalls can include a first concave sidewall having a first radius of curvature R1 and adjoining a substantially vertical sidewall of the first insulating cap layer 170A that contacts a vertical sidewall of a respective sacrificial pillar structure 3A. The at least two concave sidewalls can further include a second concave sidewall having a second radius of curvature R2 that is greater than the first radius of curvature R1 and adjoining an upper edge (i.e., the top periphery) of the first concave sidewall.

Figure 26:
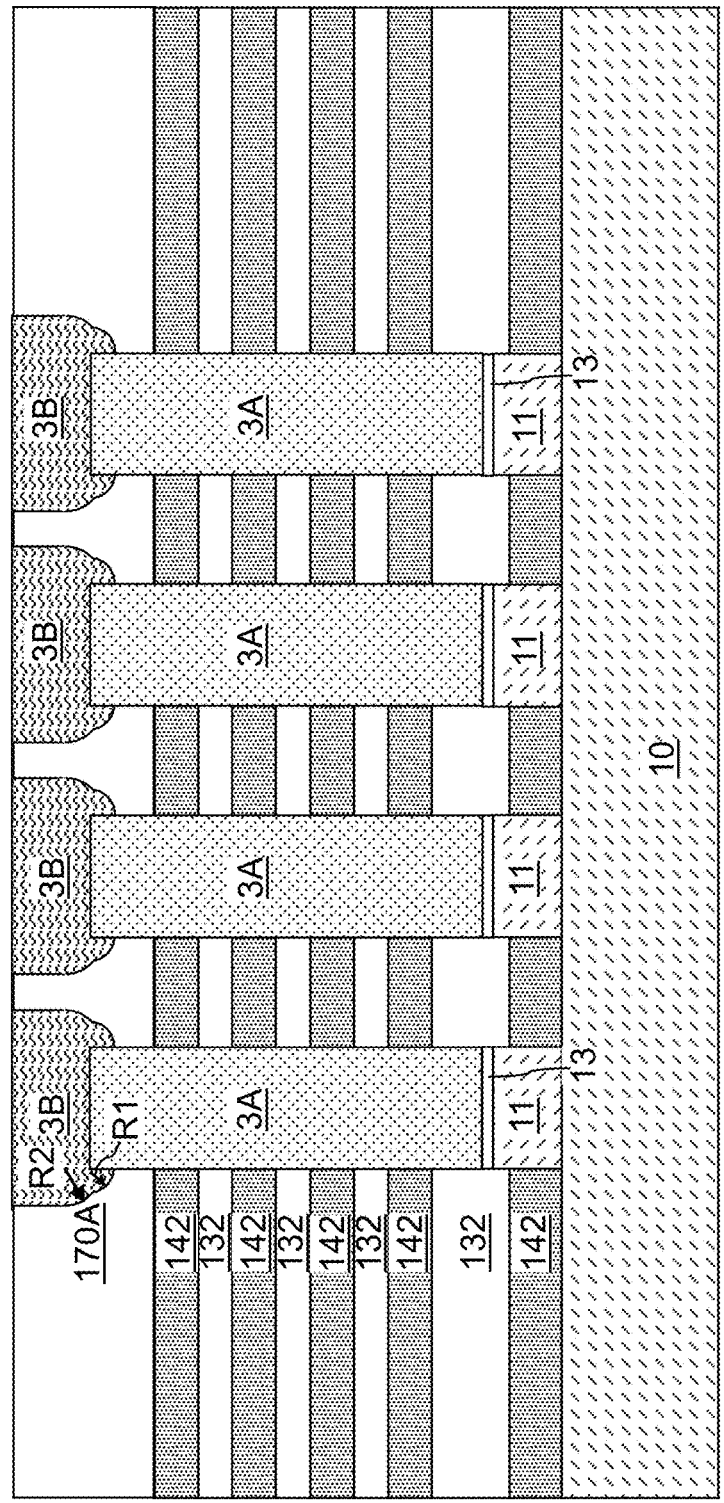
FIG. 26 is a vertical cross-sectional view of the second exemplary structure after formation of an etch stop material portion according to an embodiment of the present disclosure.

Referring to FIG. 26, a fill material portion 3B can be formed in each recess region 169 by deposition of a fill material and removal of excess portions of the fill material from above a horizontal plane including the top surface of the first insulating cap layer 170A. The fill material portions 3B include a sacrificial material that can be removed selected to the dielectric material of the first insulating cap layer 170A. The fill material portions 3B can include the same material as, or a different material from, the material of the sacrificial pillar structures 3A.

In one embodiment, the fill material portions 3B includes a material that can function as an etch stop material during a subsequent anisotropic etch process to be employed to form second memory openings through a second tier structure during a subsequent processing step. In this case, the fill material portions 3B can be etch stop material portions. In an illustrative example, the fill material portions 3B can include a doped semiconductor material (such as doped polysilicon or doped amorphous silicon) or an undoped semiconductor material (such as undoped polysilicon or undoped amorphous silicon). The sacrificial pillar structures 3A can include a material that can be removed concurrently with removal of the fill material portions 3B, or a material that can be removed selective to the fill material portions 3B. For example, if the sacrificial pillar structures 3A include a silicon-germanium alloy, the fill material portions 3B can include silicon to enable selective removal of the sacrificial pillar structures 3A. If the sacrificial pillar structures 3A include undoped silicon, the fill material portions 3B can include boron-doped silicon to enable selective removal of the sacrificial pillar structures. In some embodiments, the fill material portions 3B and the sacrificial pillar structures 3A include materials that can be simultaneously etched.

Figure 27:
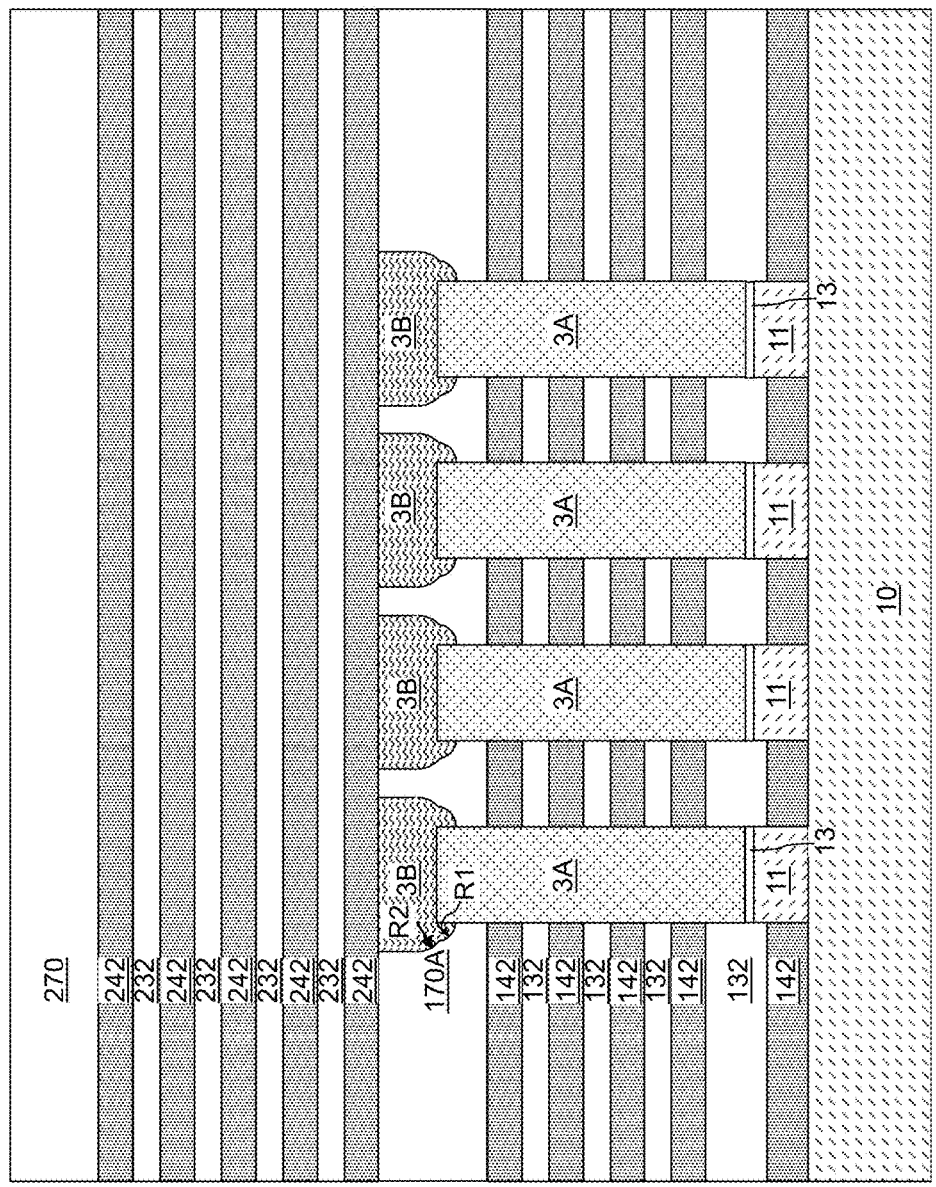
FIG. 27 is a vertical cross-sectional view of the second exemplary structure after formation of a second alternating stack of second insulating layers and second sacrificial material layers according to an embodiment of the present disclosure.

Referring to FIG. 27, the processing steps of FIG. 8 can be performed to form a second alternating stack of second insulating layers and second sacrificial material layers and a second insulating cap layer. Stepped terraces (not shown) can be formed by patterning the second alternating stack in a contact region located at a periphery of the array region including the sacrificial pillar structures 3A.

Figure 28:
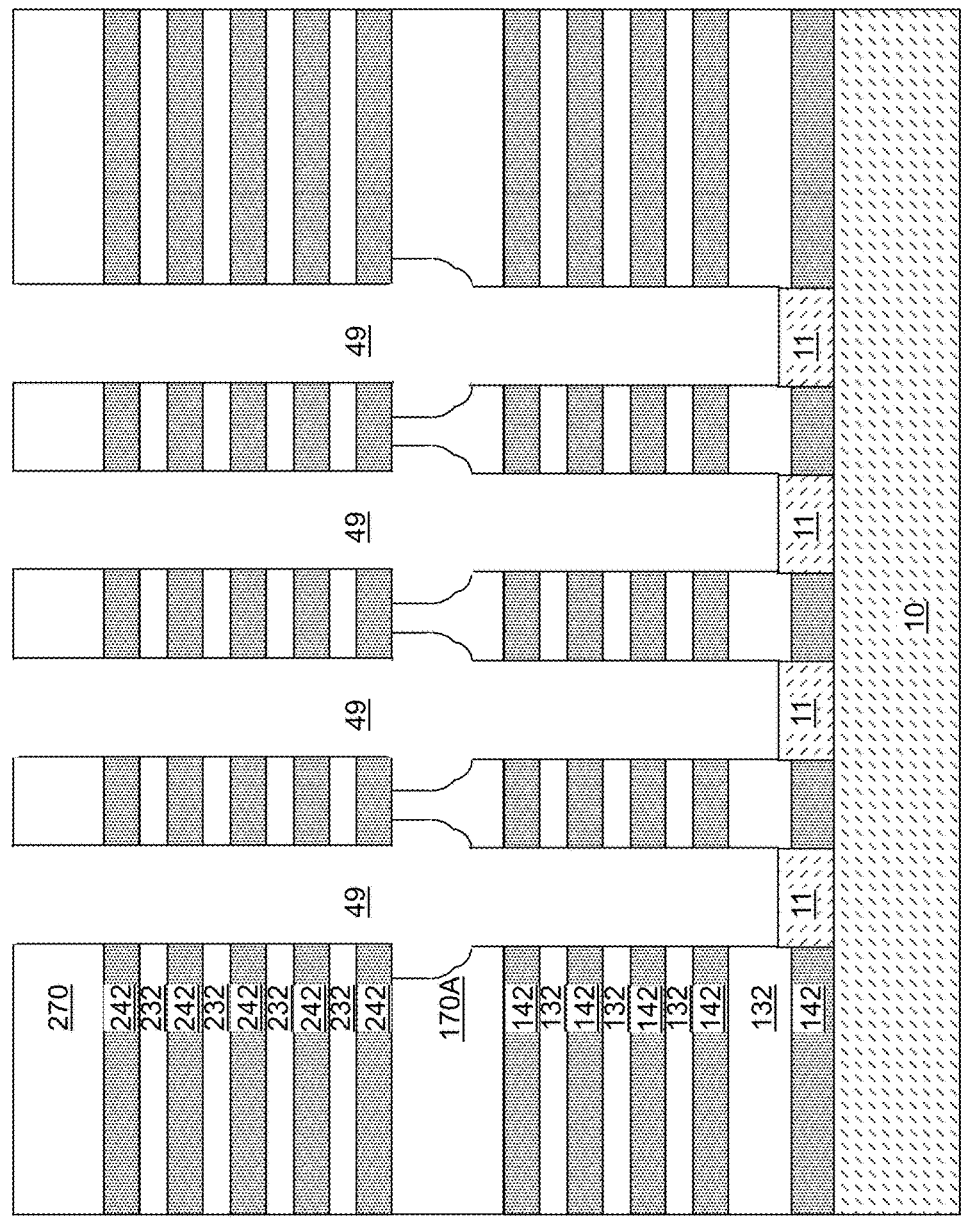
FIG. 28 is a vertical cross-sectional view of the second exemplary structure after formation of inter-stack memory openings according to an embodiment of the present disclosure.

Referring to FIG. 28, the processing steps of FIG. 9 can be performed to form second memory openings through the second tier structure. In one embodiment, the fill material portions 3B can be etch stop material portions. In this case, an anisotropic etch process employed to form the second memory openings can utilize the etch stop material portions as material portions that provide a greater etch resistance than the second insulating layers 232 and the second spacer material layers (i.e., the second sacrificial material layers 242). In another embodiment, the fill material portions 3B do not function as etch stop material portions.

The fill material portions 3B are subsequently removed, wholly or in part, to physically expose top surfaces of the sacrificial pillar structures 3A. The sacrificial pillar structures 3A are subsequently removed selective to the materials of the first alternating stack (132, 142), the second alternating stack (232, 242), and the first and second insulating cap layers (170A, 270). Any remaining portion of the fill material portions 3B can be removed, for example, employing an etch including an isotropic component prior to, during, or after, removal of the sacrificial pillar structures 3A. An inter-stack memory opening 49 is formed by removing the underlying sacrificial pillar structure 3A from below each second memory opening. Subsequently, the semiconductor oxide portions 13 can be removed, for example, by an etch process that employs HF chemistry. A top surface of an epitaxial channel portion 11 can be physically exposed at the bottom of each inter-stack memory opening 49.

Figure 29A:
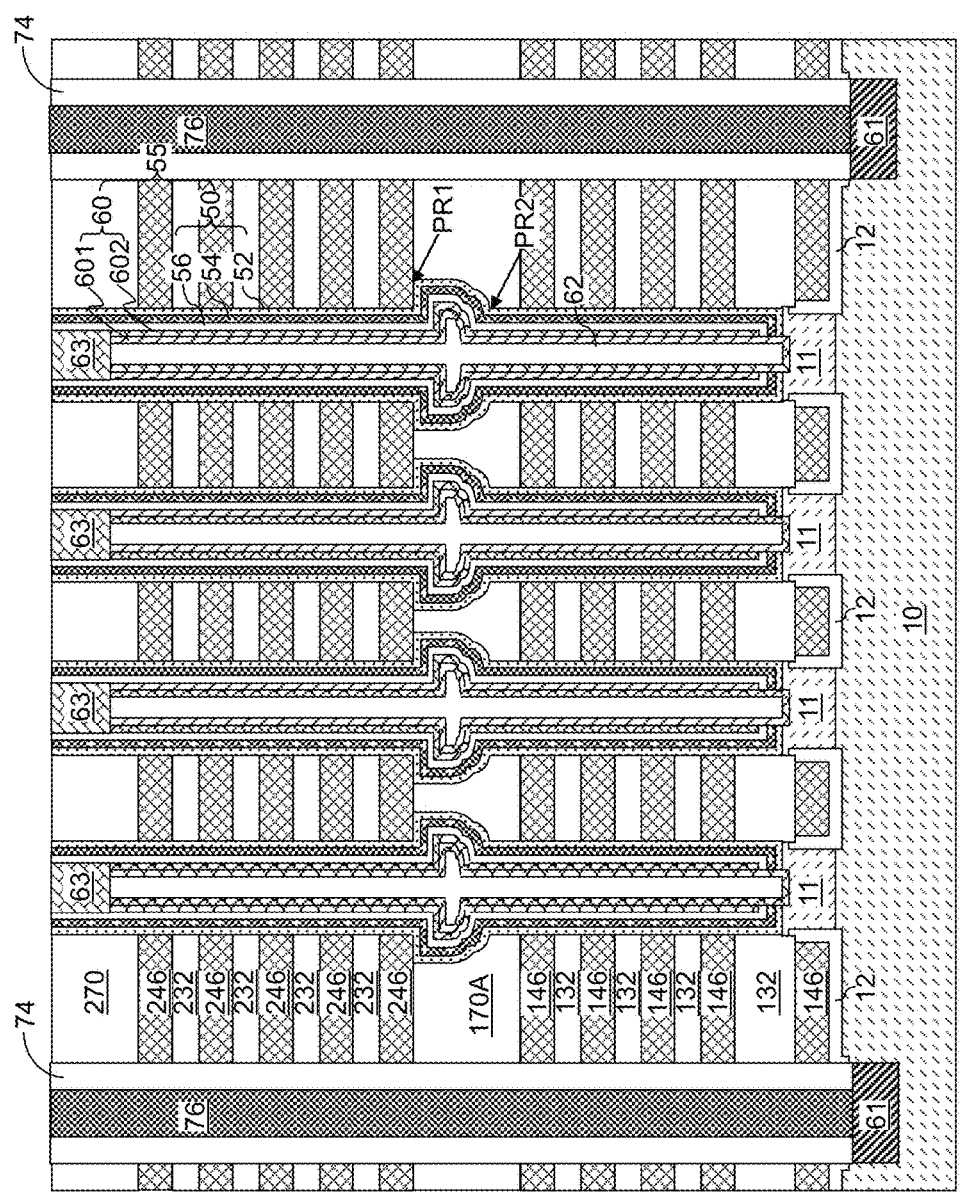
FIG. 29A is a vertical cross-sectional view of the second exemplary structure after formation of memory stack structures and backside contact via structures according to an embodiment of the present disclosure.
Figure 29B:
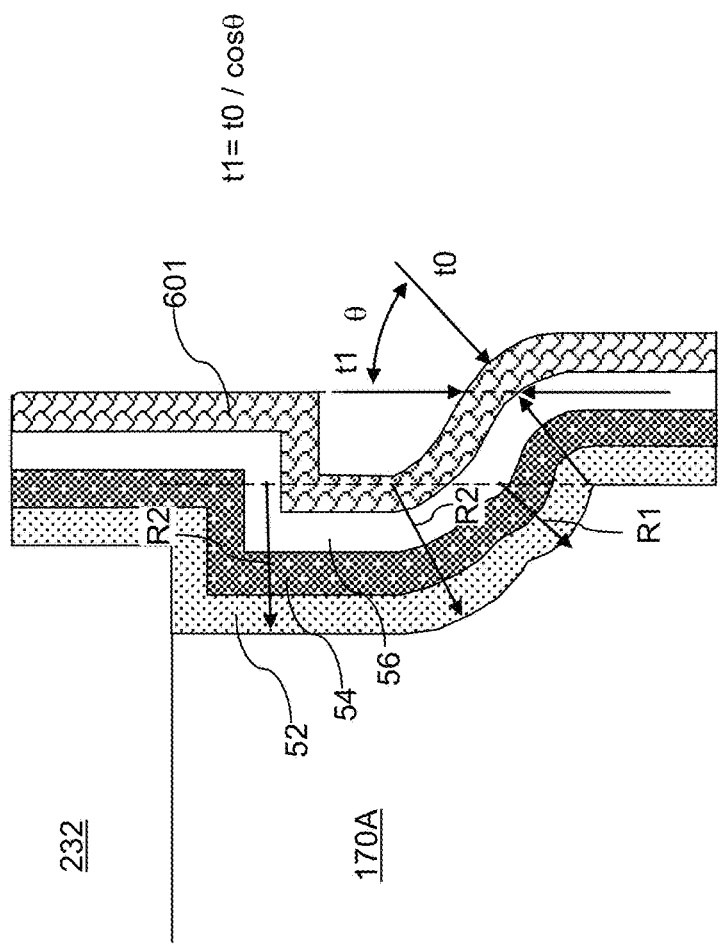
FIG. 29B is a magnified view of a region of the second exemplary structure of FIG. 29A.

Referring to FIGS. 29A and 29B, the processing steps of FIGS. 11 and 13-18 can be subsequently performed to form memory stack structures 55, a dielectric core 62, and a drain region 63 within each inter-stack memory opening 49, to form backside contact trenches 79 through the alternating stacks (132, 142, 232, 242), to replace the sacrificial material layers (142, 242) with electrically conductive layers (146, 246), to form source regions 61 within surface portions of the substrate 10, and insulating spacers 74 and backside contact via structures 76 in the backside contact trenches 79.

The second exemplary structure includes a monolithic three-dimensional memory device that includes a first alternating stack of first insulating layers 132 and first electrically conductive layers 146 located over a top surface of a substrate 10; an insulating cap layer 170A overlying the first alternating stack (132, 146); a second alternating stack of second insulating layers 232 and second electrically conductive layers 246 overlying the insulating cap layer 170A; and a memory stack structure 55 extending through the second alternating stack (232, 246), the insulating cap layer 170A, and the first alternating stack (132, 146) and comprising a semiconductor channel 60 and a memory film 50 including a plurality of charge storage regions (as embodied as portions of the memory material layer 54 located at levels of the electrically conductive layers (146, 246)). The insulating cap layer 170A comprises a first concave surface having a first radius of curvature R1, laterally surrounding the memory stack structure 55, and adjoined to an upper periphery of a substantially vertical sidewall of the memory stack structure 55 (that contacts the insulating cap layer 170A). The insulating cap layer 170A also comprises a second concave surface having a second radius of curvature R2 that is greater than the first radius of curvature R1, laterally surrounding the memory stack structure 55, and adjoined to an upper periphery of the first concave surface.

In one embodiment, an upper periphery of the second concave surface is adjoined to a lower periphery of a substantially vertical sidewall of the insulating cap layer 170A, of which the upper periphery is adjoined to the top surface of the insulating cap layer 170A. A first convex sidewall of the memory stack structure 55 contacts the first concave sidewall of the insulating cap layer 170A, and a second convex sidewall of the memory stack structure 55 contacts the second concave sidewall of the insulating cap layer 170A. Each the memory stack structure 55 can have a first periphery PR1 at which a substantially vertical outer sidewall of the structure 55 adjoins a top surface of the structure 55, and each memory stack structure 55 can have a second periphery PR2 at which a substantially vertical inner sidewall of the structure 55 adjoins a convex bottom surface of the structure 55.

The convex sidewall(s) of the structure 55 forms a thicker, sloped (i.e., tapered) surface which extends between a vertical and horizontal direction in structure 55 at the junction of openings 121 and 221 in layer 170A. This thicker, sloped surface of structure 55 prevents or reduces etching damage during the anisotropic etch of the horizontal surface of the bottom of the structure 55 at the interface of opening 121 and structure 11. In other words, the damage to the sloped surface of the structure 55 is reduced or avoided during the anisotropic etch of the first semiconductor channel layer 601 and the memory films 50 to remove the horizontal bottom portion of each memory film 50 from the bottom of each memory opening before the step of forming the second semiconductor channel layer 602 in contact with the structure 11. As shown in FIG. 29B, in case of a lateral offset between a second memory opening 221 and an underlying first memory opening 121, the effective thickness of the first semiconductor channel layer 601 along the direction of ions of the anisotropic etch of the bottom portion of the memory film is given by $t_1 = t_0/\cos(\theta)$, in which $t_0$ is the thickness of the as-deposited first semiconductor channel layer 601, and the angle $\theta$ is the taper angle of the first semiconductor channel layer 601 at the location at which the ions of the anisotropic etch impinges, where $0 < \theta < 90$ degrees, such as $20 < \theta < 70$ degrees. Thus, the tapered configuration of the first semiconductor channel layer 601 in the structure 55 provides a greater protection against collateral damage during the anisotropic etch that forms the second memory openings 221.

Figure 30:
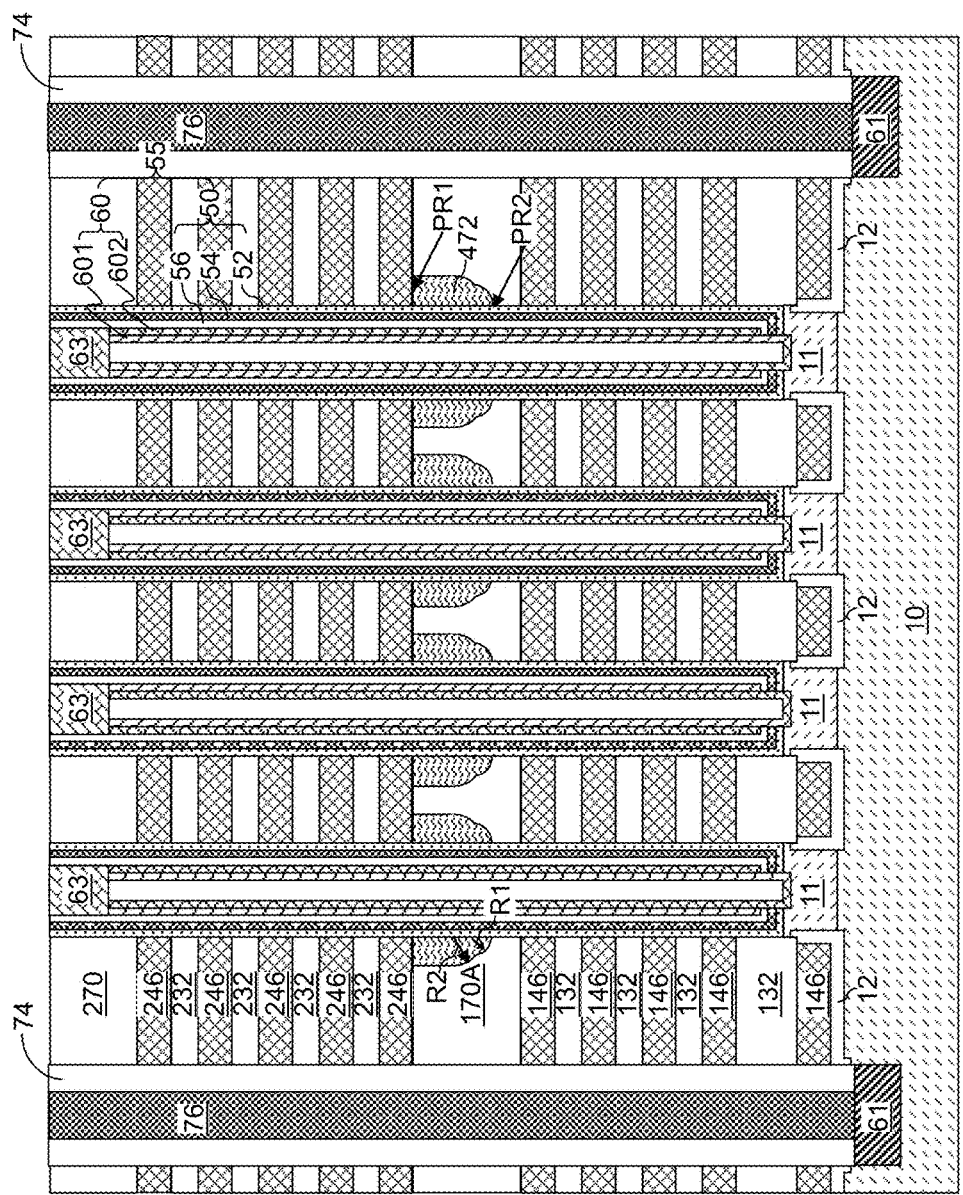
FIG. 30 is a vertical cross-sectional view of an alternative embodiment of the second exemplary structure according to an embodiment of the present disclosure.

Referring to FIG. 30, an alternative embodiment of the second exemplary structure can be derived from the second exemplary structure by anisotropically etching regions of the fill material portions 3B that underlie the second openings. An annular spacer 472 including a remaining annular portion of a fill material portion 3B can be formed underneath each second memory opening by etching through a portion of a fill material portion 3B (which may, or may not, be an etch stop material portion). In case the fill material portions 3B are employed as etch stop material portions, the second memory openings can be formed through the second alternating stack (232, 242) employing the etch stop material portion as a material portion that provides a greater etch resistance than the second insulating layers 232 and the second spacer material layers (such as the second sacrificial material layers 242). The etch stop material portion is patterned into an annular spacer 472.

A memory stack structure 55 can be formed on each annular spacer 472. Upon formation of the memory stack structures 55, the dielectric cores 62, and the drain regions 63, each annular spacer 472 laterally surrounds a respective memory stack structure 55. A first convex sidewall of the annular spacer 472 can contact the first concave sidewall of the insulating cap layer 170A, and a second convex sidewall of the annular spacer 472 can contact the second concave sidewall of the insulating cap layer 170A.

The alternate embodiment of the second exemplary structure includes a monolithic three-dimensional memory device, which comprises: a first alternating stack of first insulating layers 132 and first electrically conductive layers 146 located over a top surface of a substrate 10; an insulating cap layer 170A overlying the first alternating stack (132, 146); a second alternating stack of second insulating layers 232 and second electrically conductive layers 246 overlying the insulating cap layer 170A; a memory stack structure 55 extending through the second alternating stack (232, 246), the insulating cap layer 170A, and the first alternating stack (132, 146) and comprising a semiconductor channel 60 and a memory film 50 including a plurality of charge storage regions; and an annular spacer 472 located within the insulating cap layer 170A and laterally surrounding the memory stack structure 55. In one embodiment, the annular spacer 472 can have a planar top surface that contacts a bottommost layer within the second alternating stack (232, 246). In one embodiment, the annular spacer 472 can have a bottommost surface that is located above a horizontal plane including an interface between the first alternating stack (132, 146) and the insulating cap layer 170A. In one embodiment, a substantially vertical outer sidewall of the annular spacer 472 can laterally protrude farther outward than any portion of the memory stack structure 55 within the first alternating stack (132, 146). In one embodiment, the annular spacer 472 can include a material selected from a doped semiconductor material (such as undoped silicon or doped silicon) and a dielectric material (such as silicon oxide, silicon nitride, or a dielectric metal oxide).

In one embodiment, each annular spacer 472 can have a first periphery PR1 at which a substantially vertical outer sidewall of the annular spacer 472 adjoins a top surface of the annular spacer 472, and the annular spacer 472 can have a second periphery PR2 at which a substantially vertical inner sidewall of the annular spacer 472 adjoins a convex bottom surface of the annular spacer 472. The annular spacer 472 has a substantially vertical upper outer surface and a convex lower outer surface.

Figure 31:
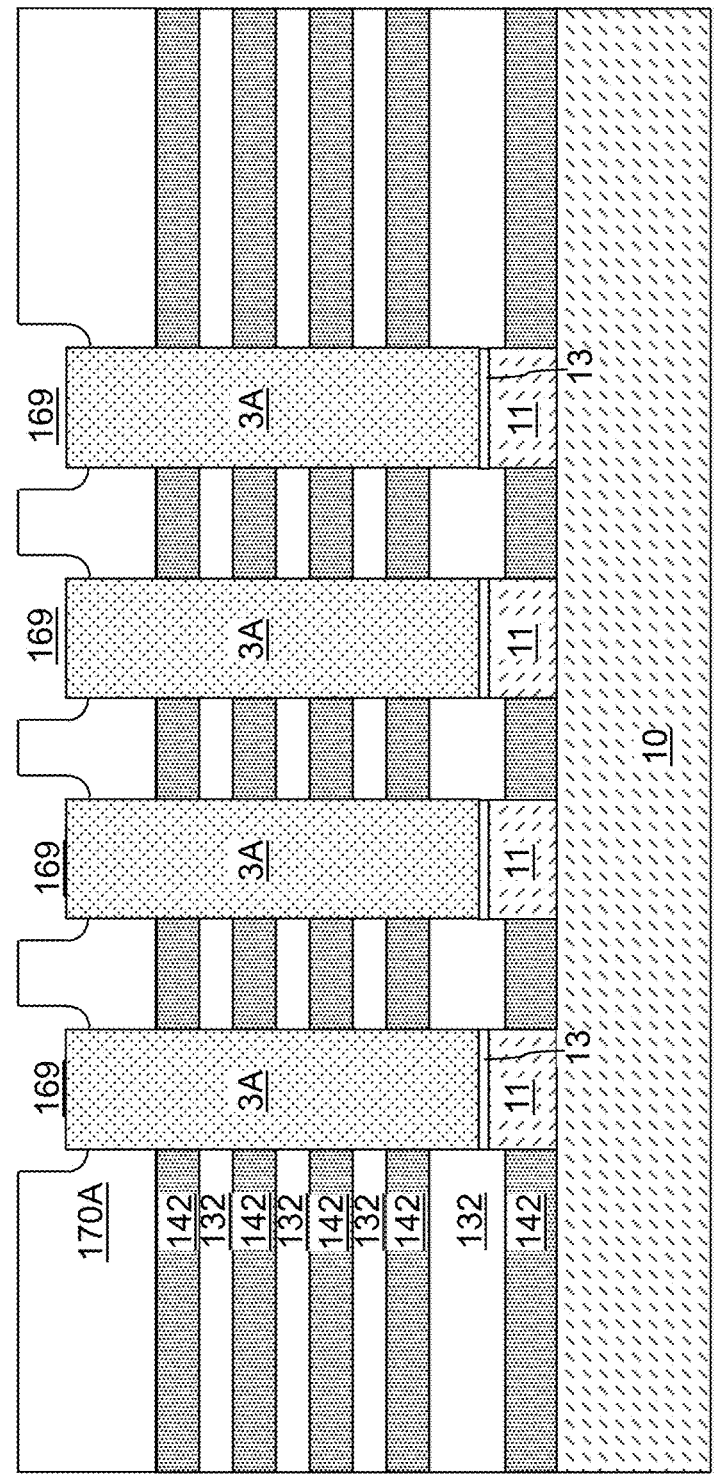
FIG. 31 is a vertical cross-sectional view of a third exemplary structure after isotropically etching a first insulating cap layer according to an embodiment of the present disclosure.

Referring to FIG. 31, a third exemplary according to an embodiment of the present disclosure can be derived from the second exemplary structure of FIG. 23 or FIG. 25. Specifically, a sacrificial material portion (such as a sacrificial pillar structure 3A) is formed in each first memory opening, and a recess region 169 is formed by recessing a top surface of the sacrificial material portions below a top surface of the first insulating cap layer 170A at least once. The volume of each recess region 169 is laterally expanded by etching the material of the first insulating cap layer 170A selective to the sacrificial pillar structures 3A. Thus, the first insulating cap layer 170A is isotropically etched at least once to form the recess regions 169. A remaining portion of the sacrificial material portion after the recess regions 169 are expanded constitutes a sacrificial pillar structure 3A illustrated in FIG. 31.

Figure 32:
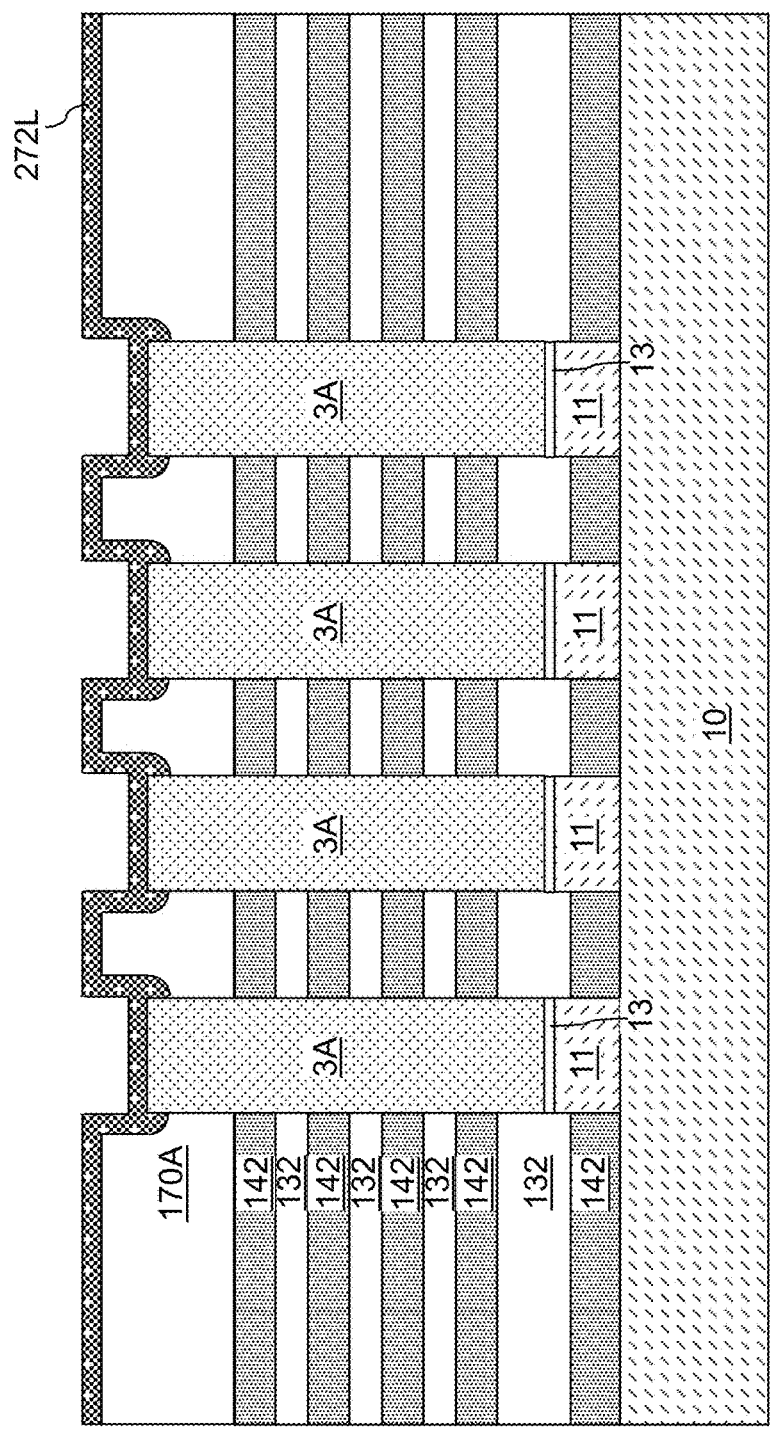
FIG. 32 is a vertical cross-sectional view of the third exemplary structure after formation of a conformal spacer material layer according to an embodiment of the present disclosure.

Referring to FIG. 32, a conformal spacer material layer 272L is formed in the recess regions 169 and over the first insulating cap layer 170A. In one embodiment, the conformal spacer material layer 272L may comprise a silicon nitride layer. In another embodiment, the conformal spacer material layer 272L can be an etch stop material layer that includes a material that can be employed as an etch stop material. For example, the conformal spacer material layer 272L can include a semiconductor material (such as silicon or a silicon-germanium alloy) or a dielectric material (such as a dielectric metal oxide). In one embodiment, the conformal spacer material layer 272L can include aluminum oxide.

Figure 33:
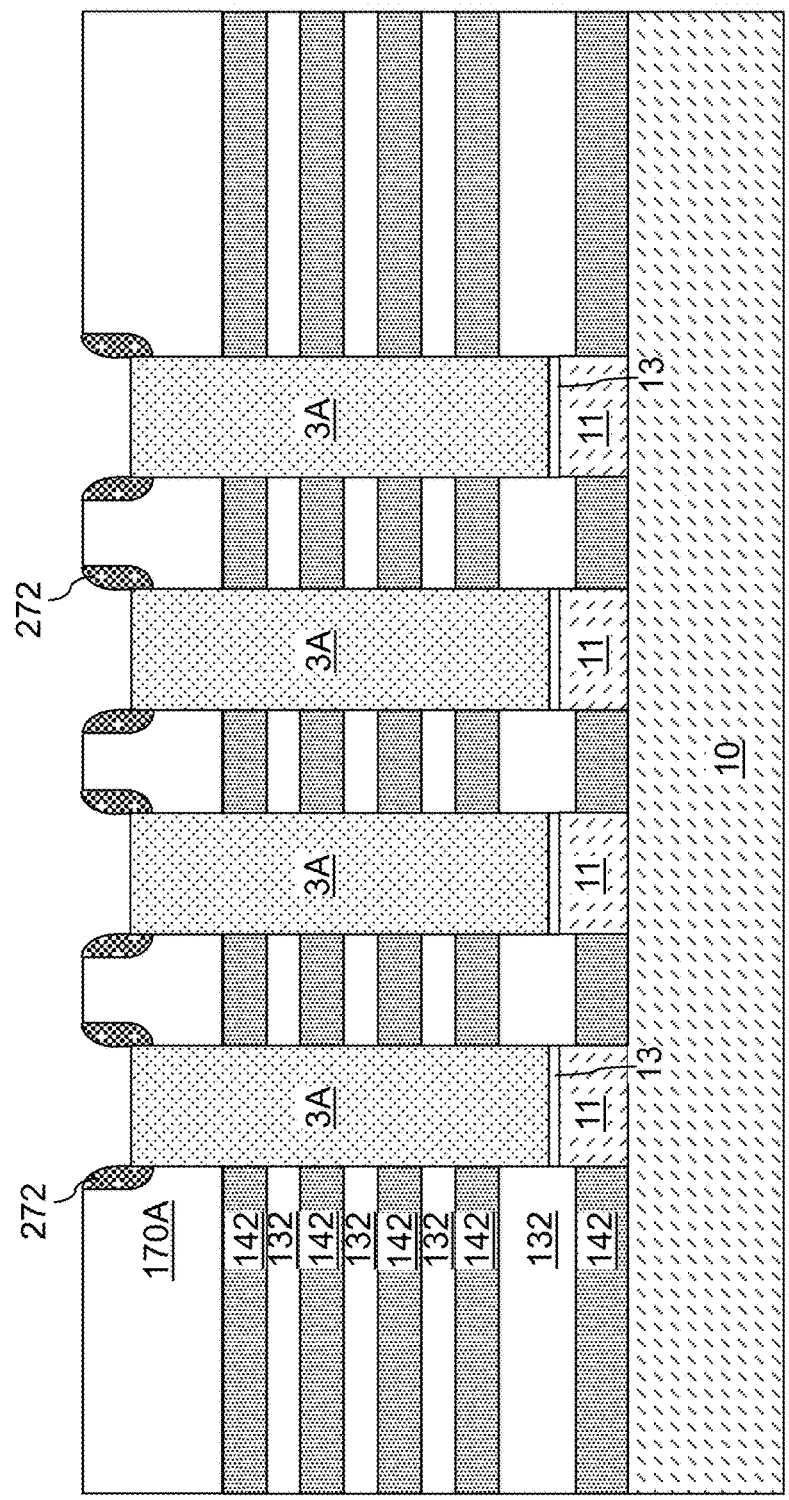
FIG. 33 is a vertical cross-sectional view of the third exemplary structure after formation of annular spacers according to an embodiment of the present disclosure.

Referring to FIG. 33, an anisotropic sidewall spacer etch can be performed to remove horizontal portions of the conformal spacer material layer 272L. Each remaining vertical portion of the conformal spacer material layer 272L constitutes an annular spacer 272 located at a periphery of a respective recess region 169. In one embodiment, the annular spacers 272 can be etch stop material portions that are subsequently employed as an etch stop structure during formation of second memory openings through a second alternating stack to be subsequently formed over the first alternating stack. In this case, the annular spacers 272 can be formed directly on a sidewall of the recess regions 169 by deposition of an etch stop material layer (i.e., the conformal spacer material layer) and an anisotropic etch of the etch stop material layer. If the annular spacers 272 comprise silicon nitride (e.g., not an etch stop material), then the top of the spacers 272 may be recessed below the top of layer 170A.

Figure 34:
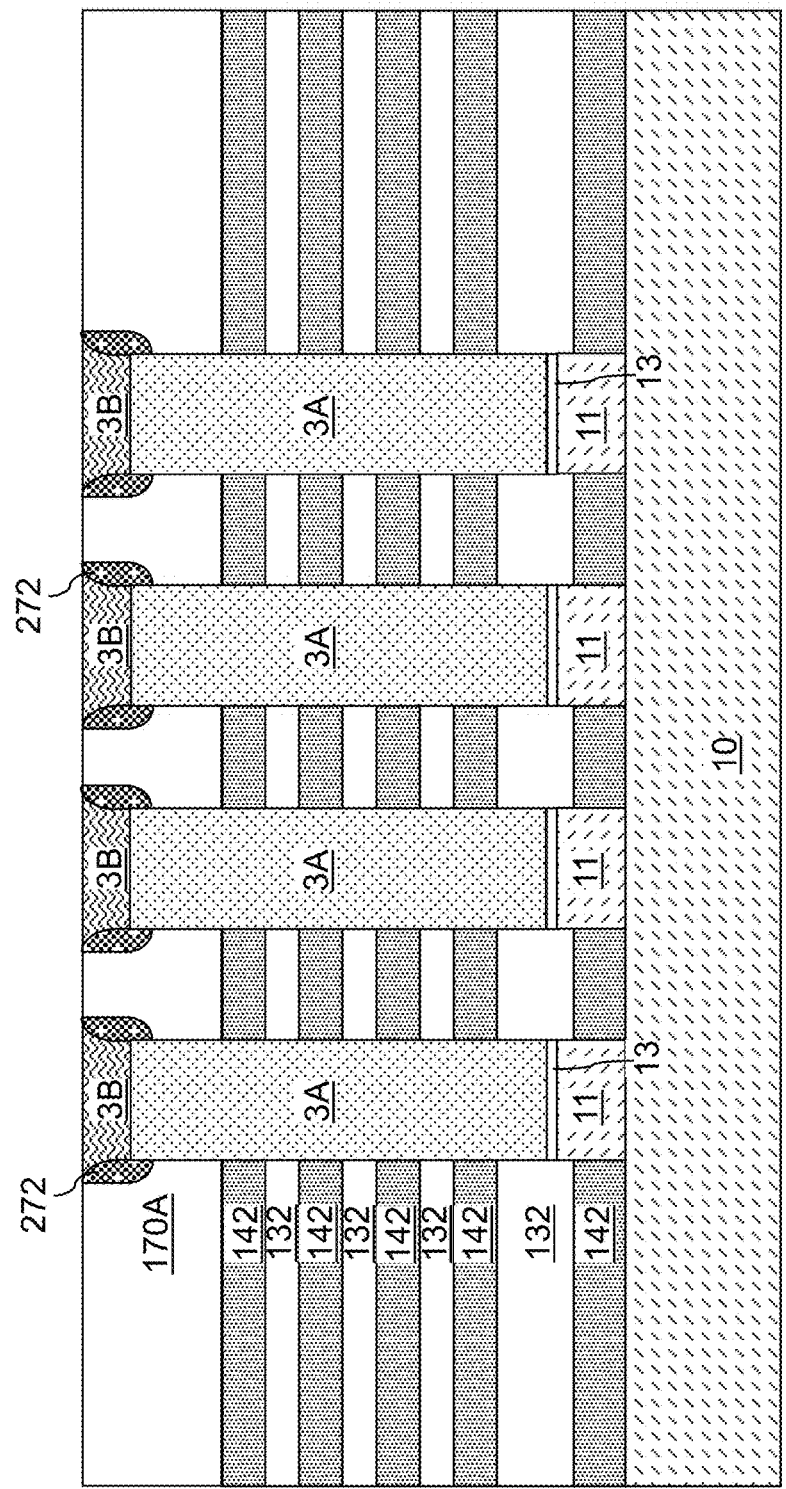
FIG. 34 is a vertical cross-sectional view of the third exemplary structure after formation of fill material portions according to an embodiment of the present disclosure.

Referring to FIG. 34, fill material portions 3B can be formed by performing the processing steps of FIG. 26. In one embodiment, the fill material portions 3B can be additional etch stop material portions that function as additional etch stop structure during subsequent formation of second memory openings. In one embodiment, the fill material portions 3B can be additional the etch stop material portions that are formed by depositing a second semiconductor material a greater dopant concentration than the first semiconductor material of the sacrificial pillar structures 3A. In one embodiment, the second semiconductor material can be boron-doped silicon.

A combination of a sacrificial pillar structure 3A and at least one etch stop material portion is formed in each first memory opening. The at least one etch stop material portion can be embodied as an annular spacer 272, and/or can be embodied as a fill material portion 3B.

Figure 35:
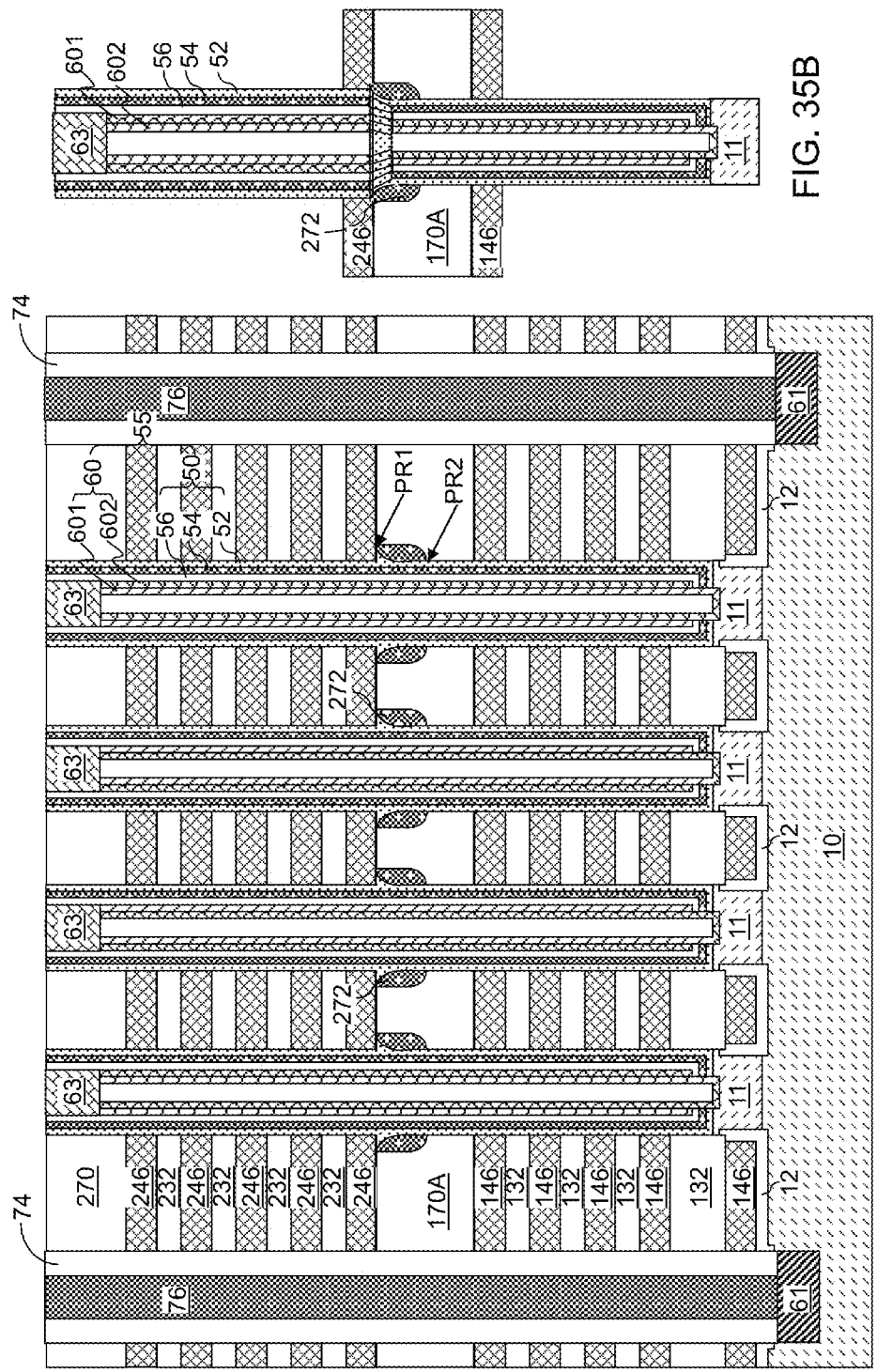
FIGS. 35A and 35B are vertical cross-sectional views of the third exemplary structure after formation of memory stack structures and backside contact structures according to an embodiment of the present disclosure.

Referring to FIG. 35A, the processing steps of FIG. 8 can be performed to form a second alternating stack of second insulating layers 232 and second spacer material layers (such as second sacrificial material layer 246). The processing steps of FIG. 9 can be performed to form second memory openings through the second tier structure. In an embodiment in which the annular spacers 272 are employed as etch stop material portions, the second memory openings can be formed through the second alternating stack (232, 242) employing the etch stop material portion as a material portion that provides a greater etch resistance than the second insulating layers 232 and the second spacer material layers (such as the second sacrificial material layers 242). In this case, the etch stop material portion is provided as an annular spacer 272. In one embodiment, the fill material portions 3B can be etch stop material portions. In this case, an anisotropic etch process employed to form the second memory openings can utilize the etch stop material portions (272 and/or 3B) as material portions that provide a greater etch resistance than the second insulating layers 232 and the second spacer material layers (i.e., the second sacrificial material layers 242). In another embodiment, the fill material portions 3B do not function as etch stop material portions.

The fill material portions 3B and the sacrificial pillar structures 3A are subsequently removed to form inter-stack memory openings 49 employing additional etch processes. The fill material portions 3B and the sacrificial pillar structures 3A are subsequently removed selective to the materials of the first alternating stack (132, 142), the second alternating stack (232, 242), the second insulating cap layer 270, and the annular spacers 272.

Subsequently, the processing steps of FIGS. 11 and 13-18 can be performed to form memory stack structures 55, a dielectric core 62, and a drain region 63 within each inter-stack memory opening 49, to form backside contact trenches 79 through the alternating stacks (132, 142, 232, 242), to replace the sacrificial material layers (142, 242) with electrically conductive layers (146, 246), to form source regions 61 within surface portions of the substrate 10, and insulating spacers 74 and backside contact via structures 76 in the backside contact trenches 79. As shown in the close up view of one memory stack structure 55 in FIG. 35B, the layers of the memory stack structure 55 (i.e., the memory film 50, the first semiconductor channel layer 601 and the second semiconductor channel layer 602) have an outward taper in the joint section adjacent to the annular spacer 272 in the insulating pad layer 170A between the first and the second alternating stacks because the layers follow the tapered contour of the inner sidewalls of the annular spacer 272.

The third exemplary structure can include a monolithic three-dimensional memory device, which can include: a first alternating stack of first insulating layers 132 and first electrically conductive layers 146 located over a top surface of a substrate 10; an insulating cap layer 170A overlying the first alternating stack (132, 146); a second alternating stack of second insulating layers 232 and second electrically conductive layers 246 overlying the insulating cap layer 170A; a memory stack structure 55 extending through the second alternating stack (232, 246), the insulating cap layer 170A, and the first alternating stack (132, 146) and comprising a semiconductor channel 60 and a memory film 50 including a plurality of charge storage regions; and an annular spacer 272 located within the insulating cap layer 170A and laterally surrounding the memory stack structure 55.

In one embodiment, the annular spacer 272 has a bottommost surface that is located above a horizontal plane including an interface between the first alternating stack (132, 146) and the first insulating cap layer 170A. In one embodiment, a substantially vertical outer sidewall of the annular spacer 272 can laterally protrude farther outward than any portion of the memory stack structure 55 within the first alternating stack (132, 146). In one embodiment, the annular spacer 272 can comprise a first periphery PR1 at which a substantially vertical outer sidewall of the annular spacer 272 adjoins a top surface of the annular spacer 272. In one embodiment, the annular spacer 272 can comprise a second periphery PR2 at which a substantially vertical inner sidewall of the annular spacer 272 adjoins a convex bottom surface of the annular spacer 272.

In one embodiment, the top surface of the annular spacer 272 can be a tapered convex surface adjoined to the substantially vertical inner sidewall of the annular spacer 272. In one embodiment, the annular spacer 272 can comprise a material selected from a doped semiconductor material and a dielectric material.

Figure 36:
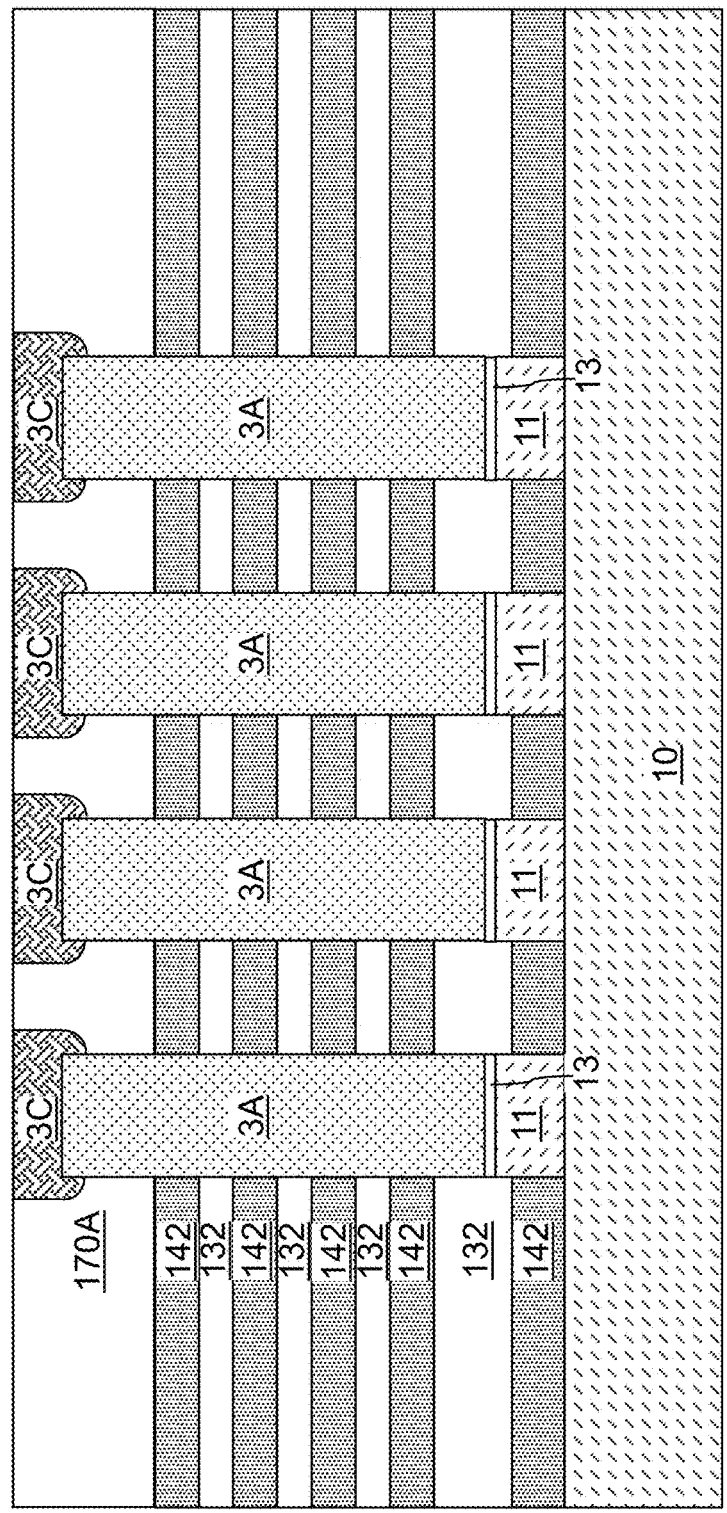
FIG. 36 is a vertical cross-sectional view of a fourth exemplary structure after formation of etch stop material portions according to an embodiment of the present disclosure.

Referring to FIG. 36, a fourth exemplary structure according to an embodiment of the present disclosure can be derived from the second exemplary structure of FIG. 23 or FIG. 25. Specifically, a sacrificial material portion (such as a sacrificial pillar structure 3A) is formed in each first memory opening, and a recess region 169 is formed by recessing a top surface of the sacrificial material portions below a top surface of the first insulating cap layer 170A at least once. The volume of each recess region 169 is laterally expanded by etching the material of the first insulating cap layer 170A selective to the sacrificial pillar structures 3A. Thus, the first insulating cap layer 170A is isotropically etched at least once to form the recess regions 169. A remaining portion of the sacrificial material portion after the recess regions 169 are expanded constitutes a sacrificial pillar structure 3A illustrated in FIG. 31.

Etch stop material portions 3C can be formed by depositing a material that can be employed as an etch stop material during subsequent formation of second memory openings. In one embodiment, the etch stop material having portions 3C can be formed by depositing a second semiconductor material a greater dopant concentration than the first semiconductor material of the sacrificial pillar structures 3A. In one embodiment, the second semiconductor material can be boron-doped silicon (e.g., boron doped amorphous silicon). A combination of a sacrificial pillar structure 3A and an etch stop material portion 3C is formed in each first memory opening. Each etch stop material portion 3C can fill the entire volume of a recess region 169.

Figure 37:
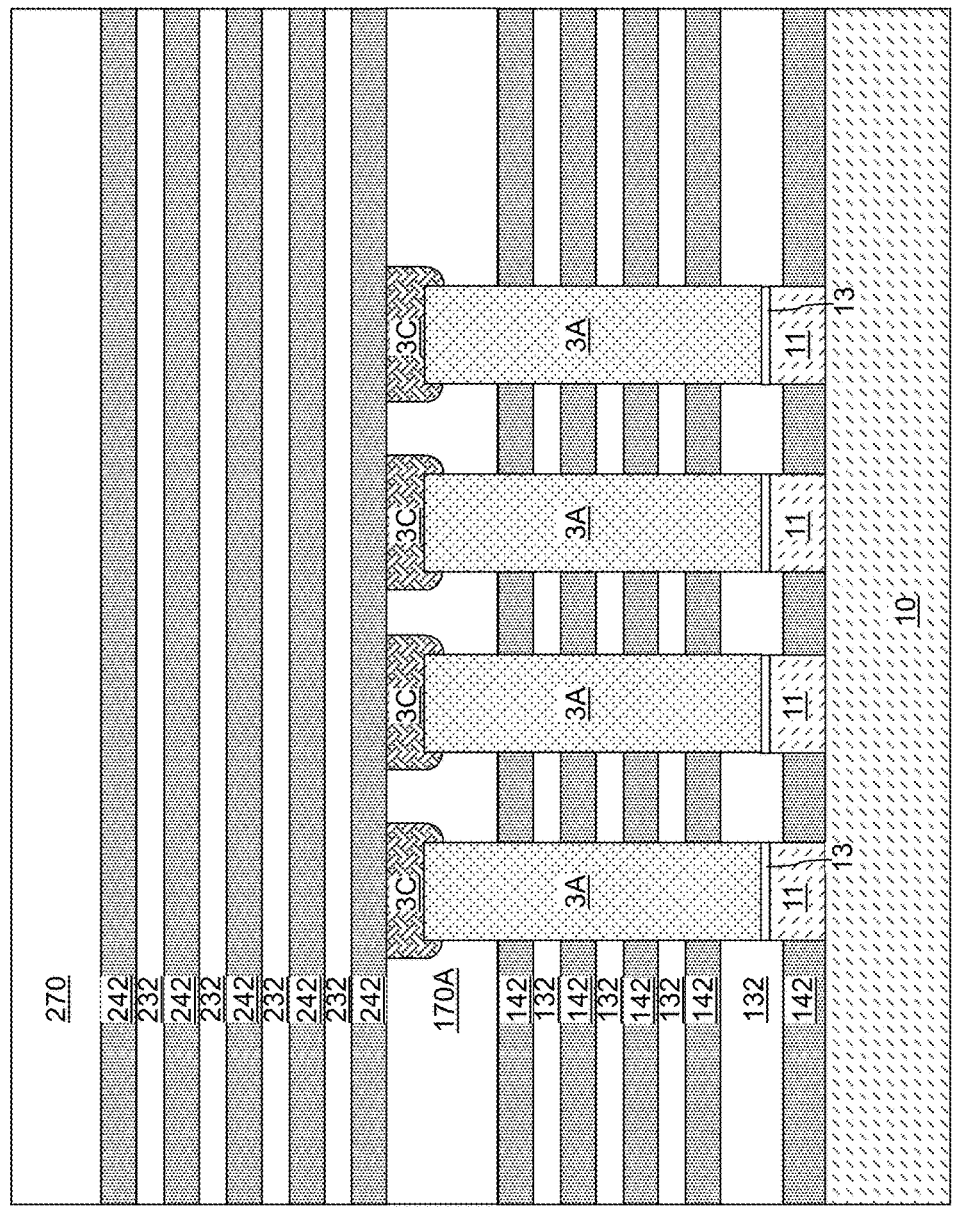
FIG. 37 is a vertical cross-sectional view of the fourth exemplary structure after formation of a second alternating stack of second insulating layers and second sacrificial material layers according to an embodiment of the present disclosure.

Referring to FIG. 37, the processing steps of the processing steps of FIG. 8 can be performed to form a second alternating stack of second insulator layers 232 and second spacer material layers, which can be second sacrificial material layers 242. A second insulating cap layer 270 can be formed over the second alternating stack (232, 242). Stepped terraces can be formed at a periphery of an array region including the sacrificial pillar structures 3A.

Figure 38:
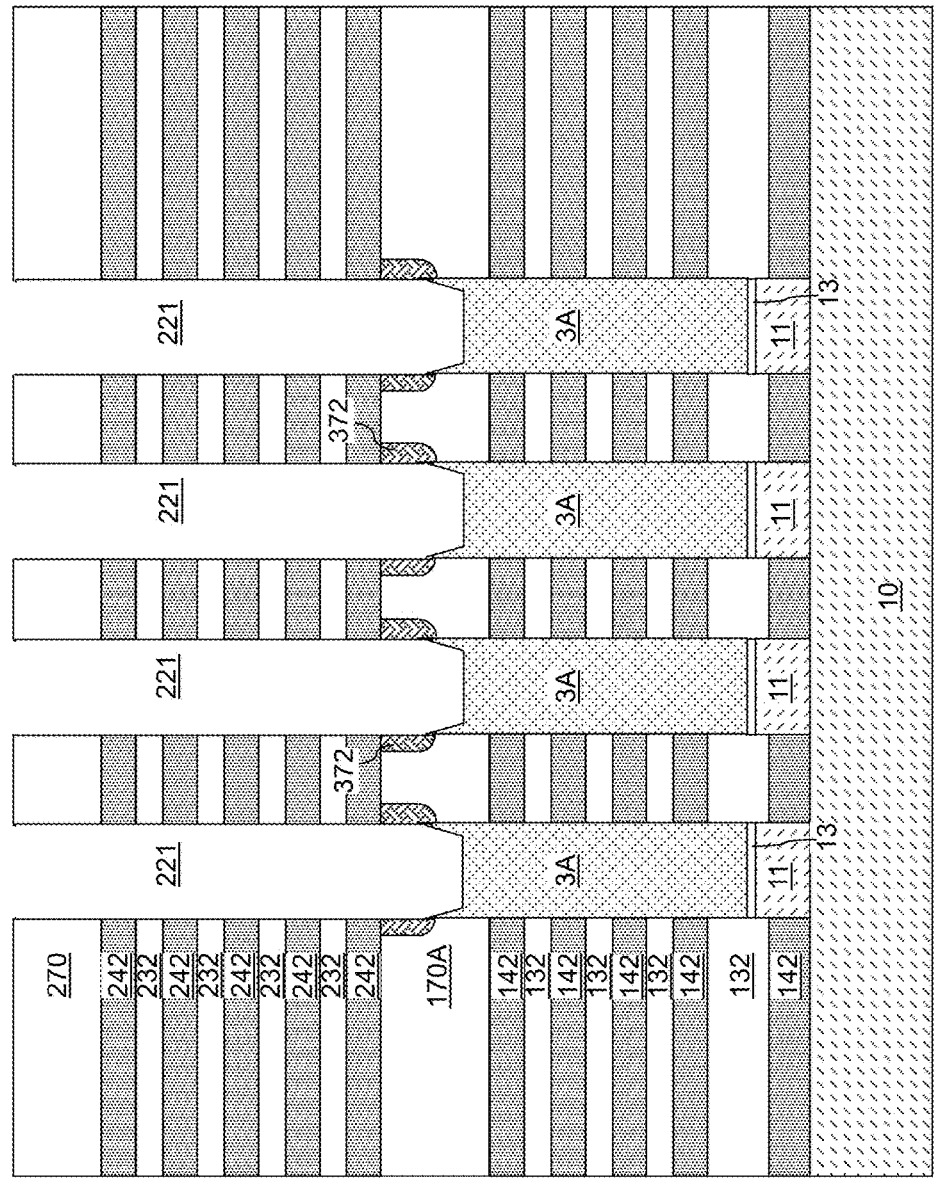
FIG. 38 is a vertical cross-sectional view of the fourth exemplary structure after formation of second memory openings according to an embodiment of the present disclosure.

Referring to FIG. 38, the processing steps of the processing steps of FIG. 9 can be performed to form second memory openings 221 through the second tier structure that includes the second alternating stack (232, 242) and the second insulating cap layer 270. The second memory openings 221 can be formed through the second alternating stack (232, 242) employing the etch stop material portions 3C as material portions that provide a greater etch resistance than the second insulating layers 232 and the second spacer material layers (such as the second sacrificial material layers 242). In this case, an anisotropic etch process employed to form the second memory openings 221 can utilize the etch stop material portions 3C as material portions that provide a greater etch resistance than the second insulating layers 232 and the second spacer material layers (i.e., the second sacrificial material layers 242).

Another anisotropic etch process can be performed to remove regions of the etch stop material portions 3C that underlie the second memory openings 221. Each remaining portion of the etch stop material portions 3C can constitute an annular spacer 372.

Figure 39:
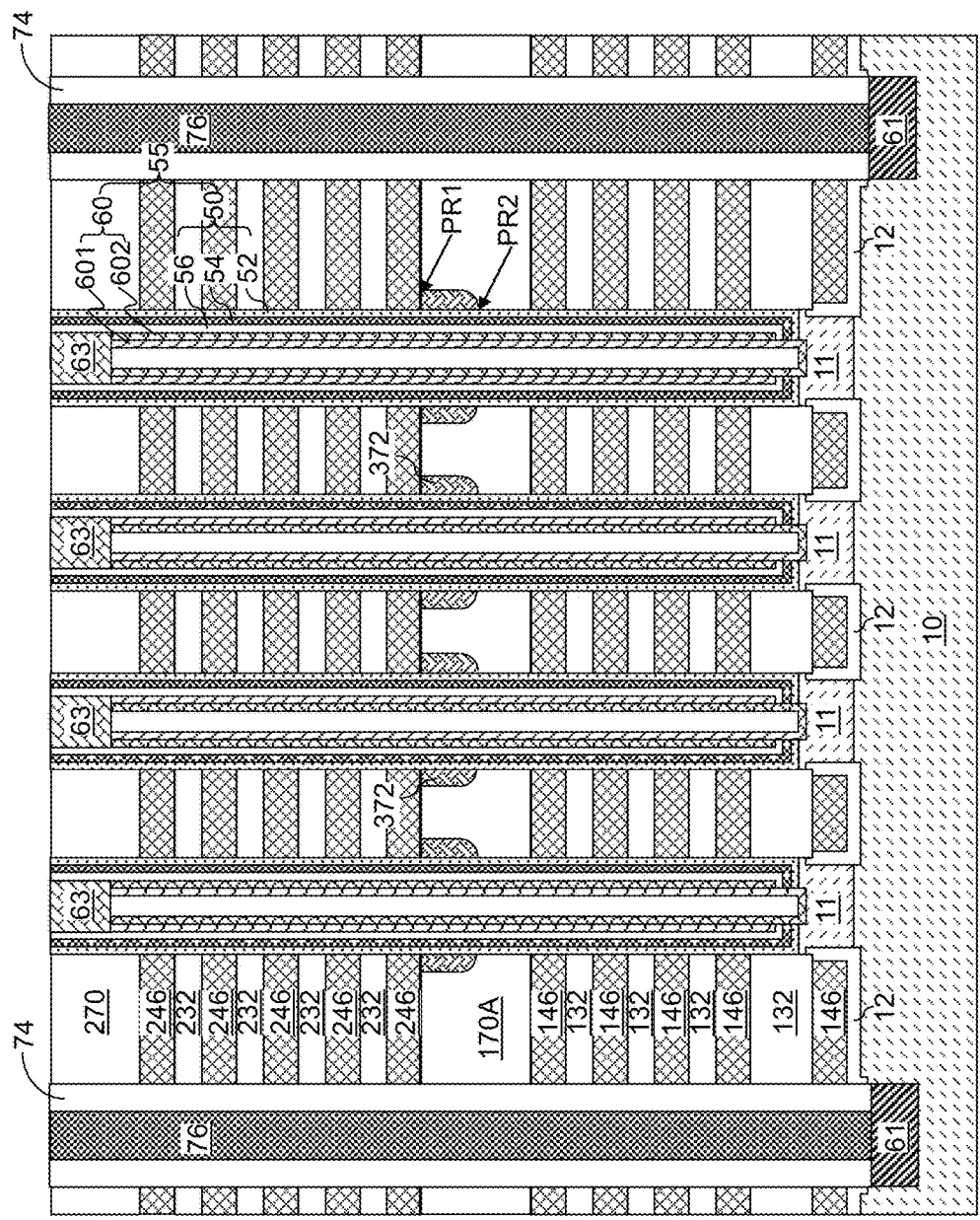
FIG. 39 is a vertical cross-sectional view of the fourth exemplary structure after formation of memory stack structures and backside contact structures according to an embodiment of the present disclosure.

Referring to FIG. 39, the sacrificial pillar structures 3A can be removed selective to the annular spacers, the first alternating stack (132, 142), the second alternating stack (232, 242), and the first and second insulating cap layers (170A, 270), and optionally selective to the semiconductor oxide portions 13. Subsequently, the processing steps of FIGS. 11 and 13-18 can be performed to form memory stack structures 55, a dielectric core 62, and a drain region 63 within each inter-stack memory opening 49, to form backside contact trenches 79 through the alternating stacks (132, 142, 232, 242), to replace the sacrificial material layers (142, 242) with electrically conductive layers (146, 246), to form source regions 61 within surface portions of the substrate 10, and insulating spacers 74 and backside contact via structures 76 in the backside contact trenches 79.

FIGS. 40A-40C illustrate an exemplary processing sequence that can be employed to form substantially vertical sidewalls at least the upper parts of first memory openings 121 through the first alternating stack (132, 142) of any of the exemplary structures of the present disclosure. After formation of the first alternating stack (132, 142) and the first insulating cap layer 170A, a patterning film 37, such as Advanced Patterning Film™ by Applied Materials, Inc., can be employed as a patterned masking layer that defines the patterns of the first memory openings 121. An anisotropic etch is performed through the first insulating cap layer 170A and the first alternating stack (132, 142), and optionally through an upper portion of the semiconductor material of the substrate 10 to form bottle-shaped first memory openings having a widening downward taper in an upper portion and a narrowing downward taper in a lower portion of the first alternating stack (132, 142) as illustrated in FIG. 40A.

Referring to FIG. 40B, the patterning film 37 can be trimmed (i e, slimmed) employing an isotropic etch process that removes the material of the patterning film 37 isotropically. Referring to FIG. 40C, another anisotropic etch process can be performed to etch the upper portions of the first memory openings 121 to provide a substantially vertical sidewall at least in the upper portion of each first memory opening. In one embodiment, each first memory opening 121 can include a substantially vertical sidewall in an upper portion and a tapered sidewall in a lower portion. In another embodiment, each first memory opening 121 can include a substantially vertical sidewall that extends through the first alternating stack (132, 142). As used herein, a surface or a line is "substantially vertical" if the deviation of the surface or the line from a vertical line is less than 4 degrees. Subsequently, the patterning film 37 can be removed, for example, by ashing. The exemplary processing sequence can be employed in conjunction with any of the previously described processing sequences, or with any of the processing sequences to be subsequently described.

Referring to FIG. 41A, subsequent processing steps of the fourth embodiment can be employed to laterally expand (i.e., widen) the recess regions 169 using any of the methods described above, such as the methods described above with respect to FIG. 23 or 25. Then, as shown in FIG. 41B, a combination of a sacrificial pillar structure 3A and an etch stop material portion 3C are formed in each first memory opening 121 and recessed region 169, respectively. The lower portion of each first memory opening 121 can have a tapered sidewall. In one embodiment, each sacrificial pillar structure 3A can be a sacrificial material portion formed by depositing a first semiconductor material, and each etch stop material portion 3C can be formed by depositing a second semiconductor material a greater dopant concentration than the first semiconductor material (such as boron-doped polysilicon having an atomic concentration of boron of at least $1.0 \times 10^{19}/cm^3$, and preferably at least $1.0 \times 10^{20}/cm^3$).

Referring to FIG. 42A, the processing steps of FIGS. 37 and 38 can be sequentially performed to form a second alternating stack (232, 242) and second memory openings 221. Each remaining portion of the etch stop material portions 3C can constitute an annular spacer 372.

Referring to FIG. 42B, after removal of the sacrificial pillar structures 3A, the memory film 50 and the first semiconductor channel layer 601 are formed in the memory openings 49 (i.e., in the lower and upper openings 121, 221). The first semiconductor channel layer 601 and the memory film 50 are anisotropic ally etched to remove the horizontal bottom portion of each memory film 50 (and the horizontal bottom portion of layer 601) from the bottom of each memory opening 49 to expose the epitaxial channel portions 11. The damage to the portion of the structure 55 located adjacent to layer 170A between the lower 121 and upper 221 openings is reduced or avoided by not having an exposed horizontal portion of the memory stack structure 55 (i.e., horizontal shoulder portion of the first semiconductor channel layer 601) located adjacent to layer 170A between lower 121 and upper 221 openings during the anisotropic etch the bottom portion of the memory film 50. In this embodiment, the annular spacer 372 forms a protective etch stop located above the horizontal portion of structure 55 (i.e., horizontal shoulder portion of the first semiconductor channel layer 601) adjacent to layer 170A, during the anisotropic etching of the bottom portion of the memory film 50 in the circled region in FIG. 42B.

Referring to FIG. 43, the processing steps of FIG. 39 can be performed to provide an alternative embodiment of the fourth exemplary structure.

Figure 44:
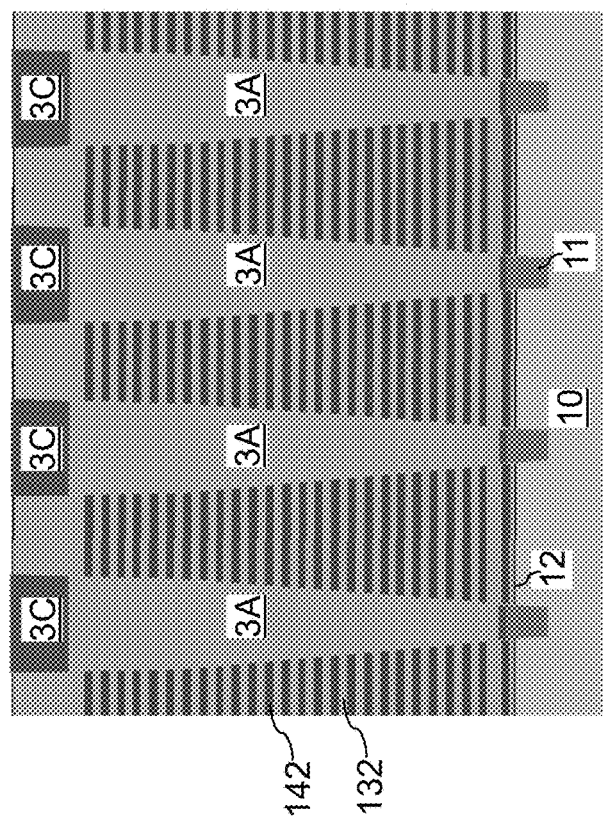
FIG. 44 is a vertical cross-sectional view of a fifth exemplary structure after formation of etch stop material portions according to an embodiment of the present disclosure.

Referring to FIG. 44, a fifth exemplary structure can be derived from the forth exemplary structure by omitting the processing step(s) of FIG. 41A that laterally expand the recess regions 169. For example, after performing the processing steps of FIG. 22, the processing steps of FIGS. 23, 24, and 25 can be omitted. Subsequently, the processing steps of FIG. 26 or the processing steps of FIG. 36 can be performed to form an etch stop material portion 3C within the volume of each recess region 169. In this case, each etch stop material portion 3C can include a substantially vertical sidewall surface having a first periphery that adjoins a horizontal top surface of the etch stop material portion 3C and having a second periphery that adjoins a bottom surface of the etch stop material portion 3C. A substantially vertical sidewall of each etch stop material portion 3C can coincide with a substantially vertical sidewall of the underlying sacrificial pillar structure 3A.

Figure 45:
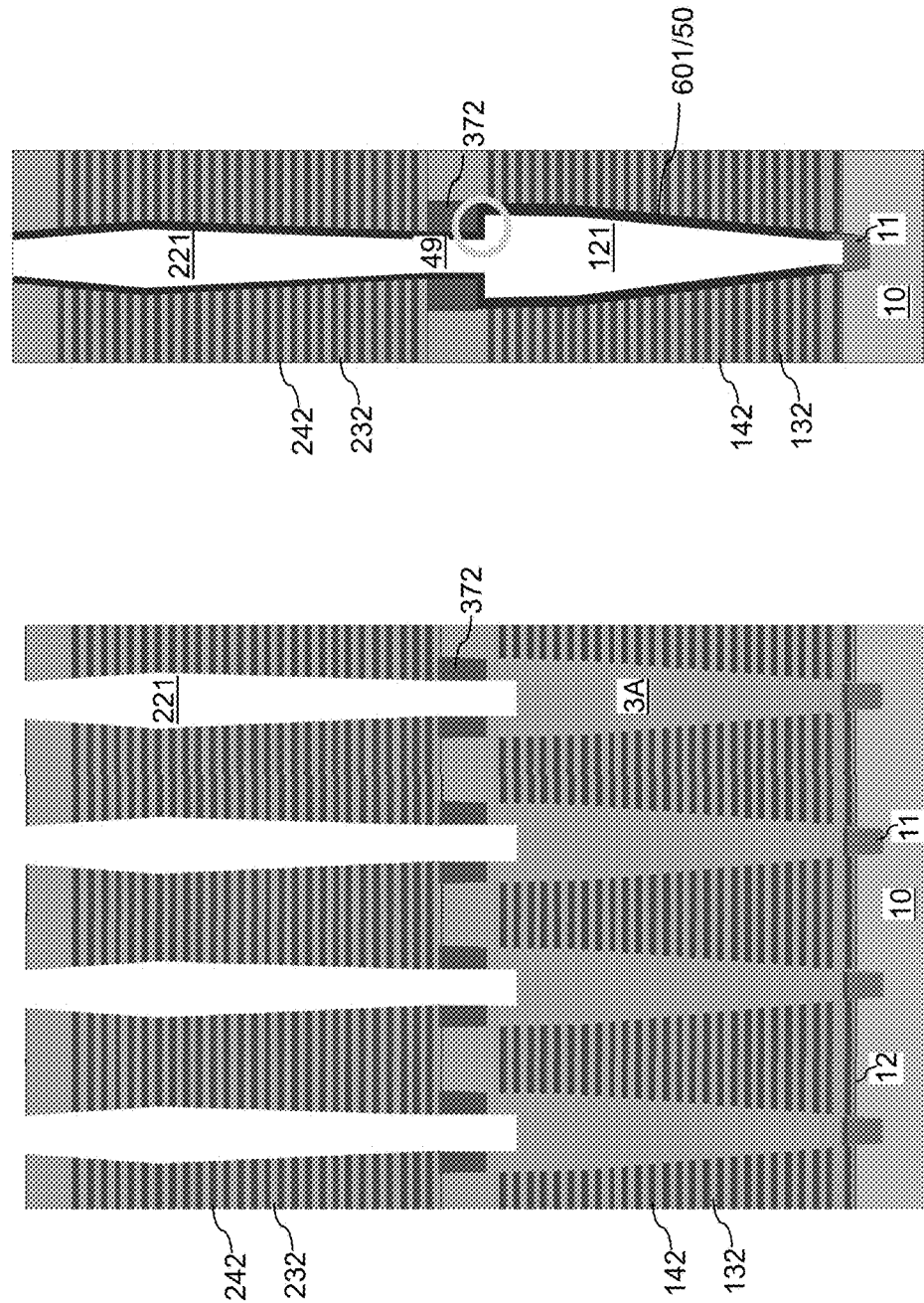
FIGS. 45A and 45B are vertical cross-sectional views of the fifth exemplary structure after formation of a second alternating stack and second memory openings according to an embodiment of the present disclosure.

Referring to FIG. 45A, the processing steps of FIGS. 37 and 38 can be sequentially performed to form a second alternating stack (232, 242) and second memory openings 221. Each remaining portion of the etch stop material portions 3C can constitute an annular spacer 372.

Referring to FIG. 45B, after removal of the sacrificial pillar structures 3A, the memory film 50 and the first semiconductor channel layer 601 are formed in the memory openings 49 (i.e., in the lower and upper openings 121, 221). The first semiconductor channel layer 601 and the memory film 50 are anisotropic ally etched to remove the horizontal bottom portion of each memory film 50 (and the horizontal bottom portion of layer 601) from the bottom of each memory opening 49 to expose the epitaxial channel portions 11. The damage to the portion of the structure 55 located adjacent to layer 170A between the lower 121 and upper 221 openings is reduced or avoided by not having an exposed horizontal portion of the memory stack structure 55 (i.e., horizontal shoulder portion of the first semiconductor channel layer 601) located adjacent to layer 170A between lower 121 and upper 221 openings during the anisotropic etch the bottom portion of the memory film 50. In this embodiment, the annular spacer 372 forms a protective etch stop located above the horizontal portion of structure 55 (i.e., horizontal shoulder portion of the first semiconductor channel layer 601) adjacent to layer 170A, during the anisotropic etching of the bottom portion of the memory film 50 in the circled region in FIG. 42B Referring to FIG. 46, the processing steps of FIG. 39 can be performed to provide the fifth exemplary structure. A substantially vertical sidewall of each etch stop material portion 3C can coincide with a substantially vertical sidewall of an underlying portion of a memory stack structure 55.

Each of the fourth and fifth exemplary structures or alternative embodiments thereof can include a monolithic three-dimensional memory device. The monolithic three-dimensional memory device can include a first alternating stack of first insulating layers 132 and first electrically conductive layers 146 located over a top surface of a substrate 10; an insulating cap layer 170A overlying the first alternating stack (132, 146); a second alternating stack of second insulating layers 232 and second electrically conductive layers 246 overlying the insulating cap layer 170A; a memory stack structure 55 extending through the second alternating stack (232, 246), the insulating cap layer 170A, and the first alternating stack (132, 146) and comprising a semiconductor channel 60 and a memory film 50 including a plurality of charge storage regions; and an annular spacer 372 located within the insulating cap layer 170A and laterally surrounding the memory stack structure 55.

In one embodiment, the annular spacer 372 has a planar top surface that contacts a bottommost layer within the second alternating stack (232, 246). In one embodiment, the annular spacer 372 has a bottommost surface that is located above a horizontal plane including an interface between the first alternating stack (132, 146) and the insulating cap layer 170A.

In one embodiment, a substantially vertical outer sidewall of the annular spacer 372 laterally protrudes farther outward than any portion of the memory stack structure 55 within the first alternating stack (132, 146) as illustrated in FIGS. 39 and 43.

Figure 46:
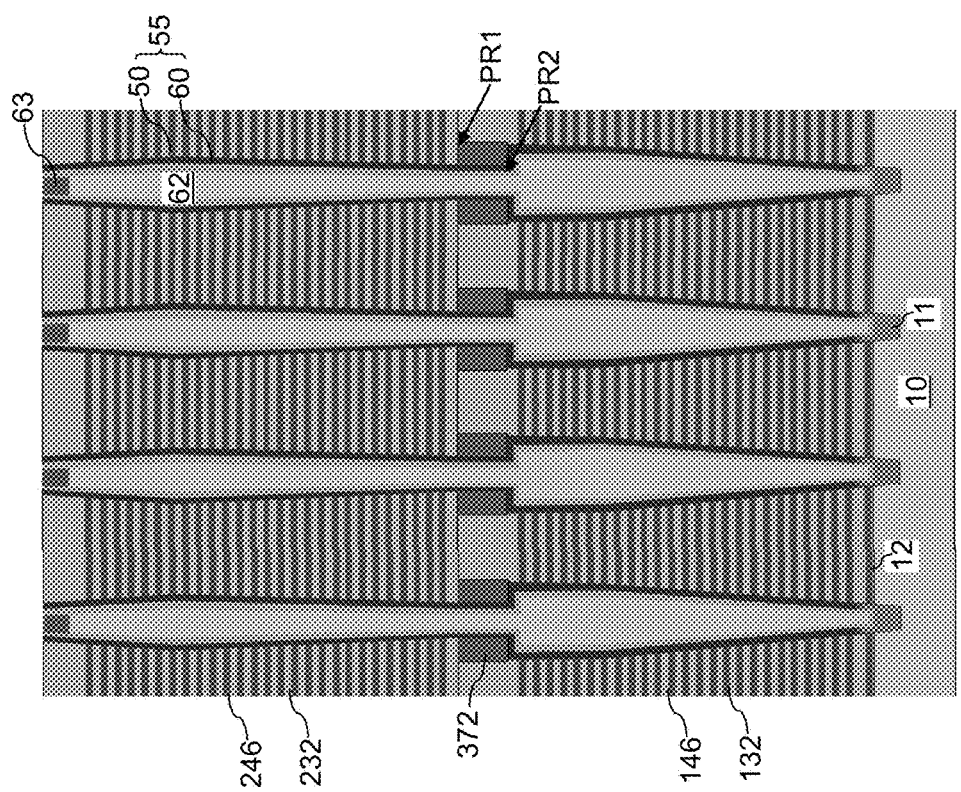
FIG. 46 is a vertical cross-sectional view of the fifth exemplary structure after formation of memory stack structures according to an embodiment of the present disclosure.

In one embodiment, a substantially vertical outer sidewall of the annular spacer 372 is vertically coincident with a portion of the memory stack structure 55 within the first alternating stack (132, 146) located directly underneath the annular spacer 372 as illustrated in FIG. 46.

In one embodiment, a bottom surface of the annular spacer 372 contacts a portion (e.g., a horizontal portion) of the memory stack structure 55 within the first alternating stack (132, 146) located directly underneath the annular spacer 372 within a horizontal plane as illustrated in FIGS. 43 and 46.

In one embodiment, the annular spacer 372 comprises a first periphery PR1 at which a substantially vertical outer sidewall of the annular spacer 372 adjoins a top surface of the annular spacer 372; and a second periphery PR2 at which a substantially vertical inner sidewall of the annular spacer adjoins a convex bottom surface of the annular spacer 372 as illustrated in FIG. 39. In one embodiment, the top surface of the annular spacer 372 can be a horizontal surface that contacts a bottommost layer in the second alternating stack (232, 246). In another embodiment, the bottom surface of the annular spacer 372 is horizontal (e.g., substantially horizontal to include unavoidable non-uniformities that occur during photolithography, etching and layer deposition), as shown in FIG. 46.

In one embodiment, the annular spacer 372 comprises a material selected from a doped semiconductor material and a dielectric material.

Each of the monolithic three-dimensional memory structures of the present disclosure can comprise a monolithic three-dimensional NAND memory device. The first and second electrically conductive layers can comprise, or can be electrically connected to, a respective word line of the monolithic three-dimensional NAND memory device. The substrate 10 can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

The embodiments of the present disclosure reduce or prevent etching damage during the anisotropic etch of the horizontal surface of the bottom of the memory stack structure 55 at the interface of opening 121 and the epitaxial channel portion 11. In other words, the damage to the portions of the first semiconductor channel layer 601 and the memory film 50 located adjacent to layer 170A between the lower 121 and upper 221 openings is reduced or avoided during the anisotropic etch of the first semiconductor channel layer 601 and the memory films 50 to remove the horizontal bottom portion of each memory film 50 from the bottom of each memory opening before the step of forming the second semiconductor channel layer 602 in contact with the epitaxial channel portions 11. The damage to the portion of the structure 55 located adjacent to layer 170A between the lower 121 and upper 221 openings is reduced or avoided by not having an exposed horizontal portion of the memory stack structure 55 (i.e., horizontal shoulder portion of the first semiconductor channel layer 601) located adjacent to layer 170A between lower 121 and upper 221 openings during the anisotropic etch the bottom portion of the memory film 50. In one embodiment, the thicker tapered (i.e., non-horizontal) portion of the structure 55 is formed adjacent to layer 170A, as shown in FIGS. 29 and 35B. In another embodiment, an annular spacer 372 or 472 is used to form the structure 55 which is substantially vertical adjacent to layer 170A, shown in FIGS. 30 and 39. In another embodiment, an annular spacer 372 forms a protective etch stop located above the horizontal portion of structure 55 (i.e., horizontal shoulder portion of the first semiconductor channel layer 601) adjacent to layer 170A, during the anisotropic etching of the bottom portion of the memory film, as shown in FIGS. 42B and 45B.

Therefore, in the above described embodiment, the step of anisotropically etching a horizontal bottom portion of the memory film 50 and the first semiconductor channel layer 601 such that damage to portions of the first semiconductor channel layer and the memory film located adjacent to the insulating cap layer 170A is reduced or avoided comprises not having a horizontal portion of the first semiconductor channel layer 601 located adjacent to the insulating cap layer 170A exposed in the inter-stack memory opening 49.

In one embodiment, not having a horizontal portion of the first semiconductor channel layer located adjacent to the insulating cap layer exposed in the inter-stack memory opening comprises forming a tapered non-horizontal portion of the first semiconductor channel layer 601 adjacent to the insulating cap layer 170A, as shown in FIG. 29B. In another embodiment, not having a horizontal portion of the first semiconductor channel layer located adjacent to the insulating cap layer exposed in the inter-stack memory opening comprises forming an annular spacer 272 in the first memory opening 121 and forming the non-horizontal tapered portion of the first semiconductor channel layer 601 adjacent to annular spacer 272, as shown in FIG. 35B.

In another embodiment, not having a horizontal portion of the first semiconductor channel layer located adjacent to the insulating cap layer exposed in the inter-stack memory opening comprises forming an annular spacer 372 or 472 in the first memory opening 121 and forming substantially vertical memory stack structure 55 adjacent to annular spacer, as shown in FIGS. 30 and 39.

In another embodiment, not having a horizontal portion of the first semiconductor channel layer located adjacent to the insulating cap layer exposed in the inter-stack memory opening comprises forming a protective etch stop annular spacer 372 in the first memory opening 121 which covers the horizontal portion of the first semiconductor channel 601 in the inter-stack memory opening 49.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
    a first alternating stack of first insulating layers and first electrically conductive layers located over a top surface of a substrate;
    an insulating cap layer overlying the first alternating stack;
    a second alternating stack of second insulating layers and second electrically conductive layers overlying the insulating cap layer; and
    a memory stack structure extending through the second alternating stack, the insulating cap layer, and the first alternating stack and comprising a semiconductor channel and a memory film including a plurality of charge storage regions,
    wherein:
        the insulating cap layer comprises a first concave surface having a first radius of curvature, laterally surrounding the memory stack structure, and adjoined to an upper periphery of a substantially vertical sidewall of the memory stack structure; and
        the insulating cap layer comprises a second concave surface having a second radius of curvature that is greater than the first radius of curvature, laterally surrounding the memory stack structure, and adjoined to an upper periphery of the first concave surface.

2. The monolithic three-dimensional memory device of claim 1, wherein the memory stacks structure contains a tapered portion adjacent to the insulating cap layer.

3. The monolithic three-dimensional memory device of claim 1, wherein:
    an upper periphery of the second concave surface is adjoined to a lower periphery of a substantially vertical sidewall of the insulating cap layer;
    a first convex sidewall of the memory stack structure contacts the first concave sidewall of the insulating cap layer; and
    a second convex sidewall of the memory stack structure contacts the second concave sidewall of the insulating cap layer.

4. The monolithic three-dimensional memory device of claim 1, further comprising an annular spacer that laterally surrounds the memory stack structure, wherein:

a first convex sidewall of the annular spacer contacts the first concave sidewall of the insulating cap layer; and
a second convex sidewall of the annular spacer contacts the second concave sidewall of the insulating cap layer.

\* \* \* \* \*